United States Patent
Iwane et al.

(10) Patent No.: US 7,362,074 B2
(45) Date of Patent: Apr. 22, 2008

(54) METHOD FOR DETERMINING DETERIORATION OF ACCUMULATOR BATTERY, METHOD FOR MEASURING INTERNAL IMPEDANCE OF SECONDARY BATTERY, EQUIPMENT FOR MEASURING INTERNAL IMPEDANCE OF SECONDARY BATTERY, EQUIPMENT FOR DETERMINING DETERIORATION OF SECONDARY BATTERY, AND POWER SUPPLY SYSTEM

(75) Inventors: Noriyasu Iwane, Tokyo (JP); Yuichi Watanabe, Tokyo (JP); Takezo Sugimura, Tokyo (JP); Toshiyuki Satoh, Tokyo (JP); Atsushi Kimura, Tokyo (JP); Fumikazu Iwahana, Tokyo (JP); Katsumi Inaniwa, Tokyo (JP); Tetsuya Kanou, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/317,286

(22) Filed: Dec. 27, 2005

(65) Prior Publication Data
US 2006/0186890 A1    Aug. 24, 2006

Related U.S. Application Data

(63) Continuation of application No. PCT/JP2004/009105, filed on Jun. 28, 2004.

(30) Foreign Application Priority Data

| Jun. 27, 2003 | (JP) | ............................. 2003-183971 |
| Aug. 22, 2003 | (JP) | ............................. 2003-299339 |
| Sep. 18, 2003 | (JP) | ............................. 2003-326505 |
| Feb. 9, 2004 | (JP) | ............................. 2004-032553 |

(51) Int. Cl.
*H01M 10/44* (2006.01)
*H01M 10/46* (2006.01)

(52) U.S. Cl. .................................................. 320/132
(58) Field of Classification Search ............... 320/107, 320/132; 324/430, 433
See application file for complete search history.

(56) References Cited
FOREIGN PATENT DOCUMENTS

| JP | 2-304876 | 12/1990 |
| JP | 7-294611 | 11/1995 |
| JP | 8-136629 | 5/1996 |
| JP | 8-254573 | 10/1996 |
| JP | 8-340642 | 12/1996 |
| JP | 10-56744 | 2/1998 |
| JP | 11-38107 | 2/1999 |
| JP | 2001-231179 | 8/2001 |
| JP | 2002-189066 | 7/2002 |
| JP | 2003-4827 | 1/2003 |
| JP | 2003-22844 | 1/2003 |

*Primary Examiner*—Edward H Tso
(74) *Attorney, Agent, or Firm*—Oblon, Spivak, McClelland, Maier & Neustadt, P.C.

(57) ABSTRACT

A method for determining deterioration of accumulator battery hooked up with loads in a system based on results of measuring internal resistances of an accumulator battery, the method comprising the steps of;
  predetermining as a specified temperature a temperature at which the deterioration of the accumulator battery is determined;
  calculating in advance temperature correction coefficients of the internal resistances from changes of the internal resistances depending on temperatures;
  predetermining resistance-voltage conversion factors to convert between the internal resistances at the specified temperature and terminal discharge voltages of the accumulator battery which are obtained at the specified temperature under a condition of flowing predetermined discharge currents from the accumulator battery;
  measuring the internal resistances of the accumulator battery and temperature of the accumulator battery at an internal resistance measurement;
  converting the measured internal resistance values into the internal resistance values at the specified temperature with use of the temperature correction coefficients of the internal resistances;
  converting the internal resistance values at the specified temperature into the terminal discharge voltage values of the accumulator battery at the specified temperature with use of the resistance-voltage conversion factors; and
  determining whether the accumulator battery is deteriorated or not by means of comparison of the terminal discharge voltage values of the accumulator battery at the specified temperature and a predetermined threshold value as a deterioration judgment standard.

11 Claims, 36 Drawing Sheets

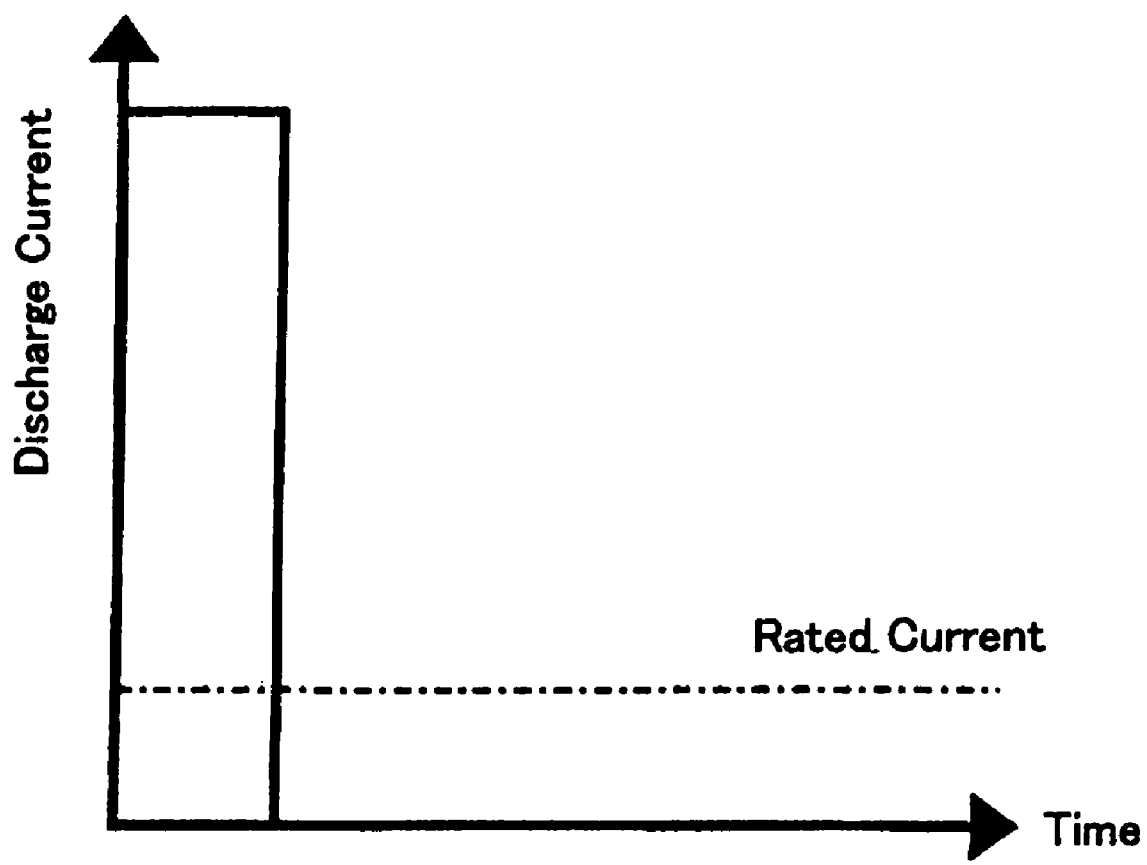

METHOD FOR DETERMINING DETERIORATION OF ACCUMULATOR BATTERY, METHOD FOR MEASURING INTERNAL IMPEDANCE OF SECONDARY BATTERY, EQUIPMENT FOR MEASURING INTERNAL IMPEDANCE OF SECONDARY BATTERY, EQUIPMENT FOR DETERMINING DETERIORATION OF SECONDARY BATTERY, AND POWER SUPPLY SYSTEM

CROSS REFERENCE TO RELATED APPLICATION

The present application is a continuation application of PCT International application PCT/JP2004/009105 filed on Jun. 28, 2004, the entire contents of which are being incorporated herein by reference.

TECHNICAL FIELD

The present invention relates to a method and an equipment for determining deterioration of accumulator battery, a method and an equipment for measuring internal impedance of secondary battery which supplies loads with electric power, and a method for determining deterioration of secondary battery.

BACKGROUND OF THE INVENTION

There are known various testing methods for residual capacity and deterioration of an accumulator battery. For example, there is known a method in which residual capacity is measured by means of discharging completely an accumulator battery, and the deterioration is determined with use of the residual capacity. However it is difficult to apply this method to an active accumulator battery hooked up with loads because it is necessary to completely discharge the accumulator battery, and moreover the method is not suitable for practical usage due to a long measuring time. So there has been developed a method which enables to immediately determine the deterioration of an active accumulator battery.

For example, under the condition that the temperature of an active accumulator battery varies, there is known a method in which voltage and temperature of an accumulator battery are measured, and the deterioration of the accumulator battery is determined by means of the conversion of the measured voltage at the measured temperature into the voltage at a specified temperature (cf. JP2001-185233A).

Furthermore, as for such secondary battery as a lead storage battery mounted in a car, a technique for measuring internal impedances of the secondary battery is proposed (cf., for example, JP10-056744A). In general, since it is possible to determine the deterioration of a secondary battery with the use of measured internal impedances of a secondary battery, the above-mentioned technique is very important. The current flowing through a secondary battery and the voltage due to the flow of the current are measured under the condition that the secondary battery is neither charged nor discharged, and then it is possible to calculate internal impedances of the secondary battery from the measured current values and the voltage values.

In the specification of the above JP10-056744A, as a method for measuring internal impedances of a secondary battery, there is proposed a method in which discharge currents with a constant frequency are applied to the secondary battery, and the internal impedances are calculated by means of Fourier transformation of the discharge current waveforms and the voltages waveforms responsive to the discharge currents. Such a method as described above makes it possible to calculate internal impedances with relative high accuracy so that it is possible to precisely determine the deterioration of the secondary battery.

Furthermore, as for such secondary battery as a lead storage battery mounted in a car, there is known a technique for determining deterioration of the secondary battery (cf., for example, JP2001-228226A). Since internal impedances of a secondary battery in general correlate strongly with deterioration level of the secondary battery, it is possible to determine the degradation of a secondary battery from the results of the internal impedance measurement of the secondary battery. Thereby, it is possible to encourage users to replace some secondary batteries with high deterioration level. It is necessary to employ the system in which there are measured current values and voltage values of a secondary battery due to flowing predetermined currents through the secondary battery and there are calculated the internal impedances by means of predetermined process, so that the power supply system has the function of determining the deterioration of the secondary battery.

Furthermore, as for a sealed lead storage battery, there is known a technique for calculating internal impedances from discharge currents and terminal voltages of the battery due to the discharge (cf., for example, JP9-232005A). In general, when discharge currents at a predetermined frequency are flowed due to discharge of a sealed lead storage battery at the predetermined frequency, current values and voltage values at a given frequency are calculated respectively from discharge current waveforms and discharge voltage waveform by means of Fourier transformation with the predetermined frequency as a basic frequency, and the internal impedances of the battery are calculated by means of dividing the voltage values by the current values.

When secondary battery is used in an outdoor station where an observation equipment or communication equipment is set up, or when secondary battery is mounted in a car, broad zones and various use environments should generally be considered, and therefore it is important to assure normal use of the secondary battery over a wide range of temperature. In the meanwhile, internal impedance significantly changes depending on temperature, and in particular the lower temperature it is, the larger internal impedance grows. Therefore even though the internal impedance of a secondary battery is within the allowable range at ordinary temperature, it may be difficult to use the secondary battery at low temperature. So when the deterioration of the secondary battery is unfailingly determined, it is necessary to calculate internal impedances with temperature correction in any way.

SUMMARY OF INVENTION

The method described in the above JP2001-185233A has a problem that the deterioration of a secondary battery cannot be precisely determined due to variety of the measured terminal voltage values in an accumulator battery when the method is applied to the accumulator battery which is for use in which charging voltage and charge condition vary, in which quick charge is necessary, in which variety of loading amount is significant or erratic, or in which use environment varies, or which is mounted in such vehicle as an automobile.

Next, the method described in the above JP10-056744A is to apply pulse currents with fixed frequency to a secondary battery. So the method makes the equipments complicated and the costs of the equipments increased because some circuits are needed to output the pulse currents with fixed frequency. In addition, charge and discharge to a secondary battery which is normally unnecessary may go over due to flowing pulse currents with fixed frequency through the secondary battery in order to calculate internal impedances of the secondary battery. As the result, it might lead to some damage of the secondary battery.

It is known that secondary batteries generally have polarization near the electrodes due to repetitive charges and discharges. In the conventional methods as described above, it is a matter that the measurement of internal impedance of a secondary battery which finishes charging or discharging is seriously affected to the polarization. As some large errors may be included in the internal impedances of the secondary battery measured under the affection of polarization, it is difficult to precisely calculate the internal impedances with use of the above conventional method.

Furthermore, it is difficult to approximate the temperature characteristics of internal impedances of a accumulator battery with use of some easy ways, and therefore it is not easy to precisely calculate the internal impedances at a predetermined temperature from the measured internal impedances. And it is a matter that temperature characteristics of internal impedances shift due to the condition of an active secondary battery, along with the matter concerning temperature characteristics of internal impedance. That is, a secondary battery used for a certain time period has larger internal impedances than a new secondary battery. As described above, it is difficult to precisely determined the deterioration leve of a secondary battery even though there are measured the internal impedances which change depending on temperature and the condition of the active secondary battery.

So an object of the present invention is to provide a method for determining deterioration of accumulator battery which determines the deterioration of the accumulator battery precisely and quickly. Another object of the present invention is to provide the method for measuring internal impedance of secondary battery which makes it possible to avoid complicated constructions and high costs and to reduce deterioration due to the measurement because internal impedances are measured by means of the Fourier transformation applied to input current waveforms and responsive voltage waveforms under the condition of flowing charging or discharging currents with various and non-periodic waveforms through the secondary battery.

Further another object of the present invention is to provide a method for measuring internal impedance of secondary battery which makes it possible to precisely obtain internal impedances with out affection of polarization in internal impedance measurement. Further another object of the present invention is to attain the method for determining deterioration of secondary battery which makes it possible to accurately correct temperature characteristics of internal impedance of a secondary battery and precisely determine the deterioration of the secondary battery.

The first aspect of method for determining deterioration of accumulator battery in the present invention is the method for determining deterioration of accumulator battery hooked up with loads in the system based on results of measuring internal resistances of the accumulator battery, the method comprising the steps of:

predetermining as a specified temperature a temperature at which the deterioration of the accumulator battery is determined;

calculating in advance temperature correction coefficients of the internal resistances from changes of the internal resistances depending on temperatures;

predetermining resistance-voltage conversion factors to convert between the internal resistances at the specified temperature and the terminal discharge voltages of the accumulator battery which are obtained at the specified temperature under the condition of flowing predetermined discharge currents from the accumulator battery;

measuring internal resistances of the accumulator battery and temperature of the accumulator battery at the internal resistance measurement;

converting the measured internal resistance values into the internal resistance values at the specified temperature with use of the temperature correction coefficients of the internal resistances;

converting the internal resistance values at the specified temperature into the terminal discharge voltage values of the accumulator battery at the specified temperature with use of the resistance-voltage conversion factors; and determining whether the accumulator battery is deteriorated or not by means of comparison of the terminal discharge voltage values of the accumulator battery at the specified temperature and a predetermined threshold value as a deterioration judgment standard.

The second aspect of method for determining deterioration of accumulator battery in the present invention is the method for determining deterioration of accumulator battery hooked up with loads in the system based on results of measuring internal resistances of the accumulator battery, the method comprising the steps of:

predetermining as a specified temperature a temperature at which the deterioration of the accumulator battery is determined;

calculating in advance temperature correction coefficients of the internal resistances from changes of the internal resistances depending on temperatures;

predetermining resistance-voltage conversion factors to convert between the internal resistances at the specified temperature and the discharge drop voltages of the accumulator battery which are obtained at the specified temperature under condition of flowing predetermined discharge currents from the accumulator battery;

measuring internal resistances of the accumulator battery and temperature of the accumulator battery at the internal resistance measurement;

converting the measured internal resistance values into the internal resistance values at the specified temperature with use of the temperature correction coefficients of the internal resistances;

converting the internal resistance values at the specified temperature into the discharge drop voltage values of the accumulator battery at the specified temperature with use of the resistance-voltage conversion factors; and determining whether the accumulator battery is deteriorated or not by means of comparison of the discharge drop voltage values of the accumulator battery at the specified temperature and a predetermined threshold value as a deterioration judgment standard.

The third aspect of method for determining deterioration of accumulator battery in the present invention is the method for determining deterioration of accumulator battery hooked up with loads in the system based on results of measuring internal resistances of the accumulator battery, the method comprising the steps of;

predetermining as a specified temperature a temperature at which the deterioration of the accumulator battery is determined;

calculating in advance temperature correction coefficients of the internal resistances from changes of the internal resistances depending on temperatures;

predetermining resistance-voltage conversion factors to convert between the internal resistances at the specified temperature and the discharge drop voltages of the accumulator battery which are obtained at the specified temperature under condition of flowing predetermined discharge currents from the accumulator battery;

measuring internal resistances of the accumulator battery and temperature of the accumulator battery at the internal resistance measurement;

converting the measured internal resistance values into the internal resistance values at the specified temperature with use of the temperature correction coefficients of the internal resistances; and determining whether the accumulator battery is deteriorated or not by means of comparison of the internal resistance values at the specified temperature and predetermined threshold value as a deterioration judgment standard.

In the fourth aspect of method for determining deterioration of accumulator battery in the present invention, the specified temperature is within the operating temperature range of the accumulator battery, and is set to a temperature at which the terminal discharge voltage get lowest when predetermined discharge currents are flowed from the accumulator battery.

In the fifth aspect of method for determining deterioration of accumulator battery in the present invention, the waveforms of the predetermined discharge currents are substantively equal to the waveforms of the discharge currents required to put the loads in operation.

In the sixth aspect of method for determining deterioration of accumulator battery in the present invention, the predetermined threshold value as a deterioration judgment standard is a voltage value equal to or more than the minimum voltage required to put the loads in operation.

In the seventh aspect of method for determining deterioration of accumulator battery in the present invention, the predetermined threshold value as a deterioration judgment standard is a voltage value equal to or less than falling voltage value minimally required to put the loads in operation.

In the eighth aspect of method for determining deterioration of accumulator battery in the present invention, the predetermined threshold value as a deterioration judgment standard is a resistance value equal to or less than an internal resistance which enables the loads to minimally operate.

In the ninth aspect of method for determining deterioration of accumulator battery in the present invention, in the process of predetermining the resistance-voltage conversion factors to convert between the internal resistances at the specified temperature and the terminal discharge voltages of the accumulator battery which are obtained at the specified temperature under the condition of flowing predetermined discharge currents from the accumulator battery, the terminal discharge voltages of the accumulator battery is a minimum voltage in discharge of the accumulator battery.

In the tenth aspect of method for determining deterioration of accumulator battery in the present invention, in the process of predetermining the resistance-voltage conversion factors to convert between the internal resistances at the specified temperature and the terminal discharge voltages of the accumulator battery which are obtained at the specified temperature under the condition of flowing predetermined discharge currents from the accumulator battery, the terminal discharge voltages of the accumulator battery is a voltage after the accumulator battery is discharged for predetermined period of time.

In the eleventh aspect of method for determining deterioration of accumulator battery in the present invention, the deterioration can be identified in the case that the one or more accumulator batteries are deteriorated or threaten to be deteriorated as the result of determination of deterioration of one or more of plural accumulator batteries.

In the twelfth aspect of method for determining deterioration of accumulator battery in the present invention, there are equipped display part which indicates information as for handling-needing accumulator batteries needing to be discharged or replaced, and as for ongoingly-usable accumulator batteries possible to be ongoingly used in the case that the one or more accumulator batteries are deteriorated or threaten to be deteriorated as the result of determination of deterioration of one or more of plural accumulator batteries, storage part in which the records of the accumulator batteries are stored, and controlling and determining part which has the programs to store the records of at least the accumulator batteries which are used after charge or are possible to be ongoingly used, and/or to ongoingly determine deterioration of the accumulator batteries.

The thirteenth aspect of method for determining deterioration of accumulator battery in the present invention is the method for determining deterioration of accumulator battery hooked up with loads in the system based on discharge performance of the accumulator battery, the method comprising the steps of:

predetermining specified temperatures one-by-one from respective plural temperature ranges predetermined;

selecting at least a specified temperature included in the selected temperature range after at least a temperature range is selected depending on the measured temperature in determination of deterioration of the accumulator battery;

presetting one of the selected specified temperatures as a specified temperature at which deterioration of the accumulator battery is determined;

measuring correlation values correlative with the discharge performance at a desired temperature;

converting the correlation values into correlation values at the specified temperature based upon the temperature correcting formula obtained in advance, the desired temperature in the measurement of the correlation values and the correlation values;

calculating the discharge performance from the converted correlation values by means of a relational formula between correlation values and the discharge performance; and determining the deterioration of the accumulator battery by means of comparison between the calculated discharge performance at the specified temperature and a predetermined threshold value as a deterioration judgment standard.

The fourteenth aspect of method for determining deterioration of accumulator battery in the present invention is the method for determining deterioration of accumulator battery hooked up with loads in the system based on discharge performance of the accumulator battery, the method comprising the steps of;

picking up plural specified temperatures depending on the measured temperature in determination deterioration of the accumulator battery;

presetting the selected specified temperatures as a specified temperature at which deterioration of the accumulator battery is determined;

measuring correlation values correlative with the discharge performance at a desired temperature;

converting the correlation values into correlation values at the specified temperature based upon the temperature correcting formula obtained in advance, the desired temperature in the measurement of the correlation values and the correlation values;

calculating the discharge performance from the converted correlation values by means of a relational formula between correlation values and the discharge performance; and determining the deterioration of the accumulator battery by means of comparison between the calculated discharge performance values respectively at the plural specified temperatures or judgment of correlation between the calculated discharge performance values.

The fifteenth aspect of method for determining deterioration of accumulator battery in the present invention is the method for determining deterioration of accumulator battery hooked up with loads in the system based upon discharge performance of the accumulator battery, the method comprising the steps of;

presetting a specified temperature as a temperature at which deterioration of the accumulator battery is determined;

measuring correlation values correlative with the discharge performance at a desired temperature;

converting the correlation values measured at the desired temperature into correlation values at the specified temperature based upon the temperature correcting formula obtained in advance, the desired temperature in the measurement of the correlation values and the measured correlation values;

calculating the discharge performance from the converted correlation values by means of a relational formula between correlation values and the discharge performance; and determining the deterioration of the accumulator battery by means of comparison between the calculated discharge performance at the specified temperature and a predetermined threshold value as a deterioration judgment standard.

In the sixteenth aspect of method for determining deterioration of accumulator battery in the present invention, the correlation values are such electric conduction values as direct-current resistances of the internal resistance values, alternating-current impedance values or alternating-current conductance values, which are inverses of the alternating-current impedance values.

In the seventeenth aspect of method for determining deterioration of accumulator battery in the present invention, the predetermined relational formula indicates a relation between the discharge performance and the terminal voltage of the accumulator battery which occurs at flowing electric currents which have a time fluctuation pattern corresponding to or similar to a time fluctuation pattern of consumption current in the loads.

In the eighteenth aspect of method for determining deterioration of accumulator battery in the present invention, the specified temperature is set to a temperature at which the discharge performance gets lowest in the predetermined operating temperature range of the accumulator battery.

In the nineteenth aspect of method for determining deterioration of accumulator battery in the present invention, the specified temperature is set to a temperature which is lower than the desired temperature by a predetermined degree.

In the twentieth aspect of method for determining deterioration of accumulator battery in the present invention, the specified temperature is set to a predetermined temperature in the temperature range including the desired temperature of the predetermined temperature ranges.

The first aspect of equipment for determining deterioration of accumulator battery in the present invention is the equipment for determining deterioration of accumulator battery hooked up with loads in the system based upon the results of measuring internal resistances of the accumulator battery, which predetermines a specified temperature as a temperature at which the deterioration of the accumulator battery is determined, calculates in advance temperature correction coefficients of the internal resistances from changes of the internal resistances depending on temperatures, predetermines resistance-voltage conversion factors to convert between the internal resistances at the specified temperature and the terminal discharge voltages of the accumulator battery which are obtained at the specified temperature under the condition of flowing predetermined discharge currents from the accumulator battery; the equipment including:

a battery temperature measuring part which measures internal resistances of the accumulator battery and temperature of the accumulator battery at the internal resistance measurement;

an internal resistance converting part which converts the measured internal resistance values into the internal resistance values at the specified temperature with use of the temperature correction coefficients of the internal resistances;

a terminal voltage converting part which converts the internal resistance values at the specified temperature into the terminal discharge voltage values of the accumulator battery at the specified temperature with use of the resistance-voltage conversion factors; and a deterioration determining part which determines whether the accumulator battery is deteriorated or not by means of comparison of the terminal discharge voltage values of the accumulator battery at the specified temperature and predetermined threshold value as a deterioration judgment standard.

The second aspect of equipment for determining deterioration of accumulator battery in the present invention is the equipment for determining deterioration of accumulator battery hooked up with loads in the system based upon the results of measuring internal resistances of the accumulator battery, which predetermines a specified temperature as a temperature at which the deterioration of the accumulator battery is determined, calculates in advance temperature correction coefficients of the internal resistances from changes of the internal resistances depending on temperatures, predetermines resistance-voltage conversion factors to convert between the internal resistances at the specified temperature and the discharge drop voltages of the accumulator battery which are obtained at the specified temperature under the condition of flowing predetermined discharge currents from the accumulator battery; the equipment including:

a battery temperature measuring part which measures internal resistances of the accumulator battery and temperature of the accumulator battery at the internal resistance measurement; an internal resistance converting part which converts the measured internal resistance values into the internal resistance values at the specified temperature with use of the temperature correction coefficients of the internal resistances;

a discharge drop voltage converting part which converts the internal resistance values at the specified temperature into the discharge drop voltages of the accumulator battery at the specified temperature with use of the resistance-voltage conversion factors; and a deterioration determining part which determines whether the accumulator battery is deteriorated or not by means of comparison of the discharge drop voltage values of the accumulator battery at the specified temperature and predetermined threshold value as a deterioration judgment standard.

The third aspect of equipment for determining deterioration of accumulator battery in the present invention is the equipment for determining deterioration of accumulator battery hooked up with loads in the system based upon the results of measuring internal resistances of the accumulator battery, which predetermines a specified temperature as a temperature at which the deterioration of the accumulator battery is determined, calculates in advance temperature correction coefficients of the internal resistances from changes of the internal resistances depending on temperatures; the equipment including:

a battery temperature measuring part which measures internal resistances of the accumulator battery and temperature of the accumulator battery at the internal resistance measurement;

an internal resistance converting part which converts the measured internal resistance values into the internal resistance values at the specified temperature with use of the temperature correction coefficients of the internal resistances; and a deterioration determining part which determines whether the accumulator battery is deteriorated or not by means of comparison of the internal resistance values at the specified temperature and predetermined threshold value as a deterioration judgment standard.

The fourth aspect of equipment for determining deterioration of accumulator battery in the present invention is the equipment for determining deterioration of accumulator battery hooked up with loads in the system based upon discharge performance of the accumulator battery, which predetermines a specified temperature as a temperature at which the deterioration of the accumulator battery is determined, measures correlation values correlative with the discharge performance at a desired temperature; the equipment including:

a correlation value converting part which converts the correlation values measured at the desired temperature into correlation values at the specified temperature based upon the temperature correcting formula obtained in advance, the desired temperature in the measurement of the correlation values and the measured correlation values;

a discharge performance calculating part which calculates the discharge performance from the converted correlation values by means of a relational formula between correlation values and the discharge performance; and a deterioration determining part which determines the deterioration of the accumulator battery by means of comparison between the calculated discharge performance at the specified temperature and a predetermined threshold value as a deterioration judgment standard.

The fifth aspect of equipment for determining deterioration of accumulator battery in the present invention includes a display part which makes it possible to identify the deterioration in the case that the one or more accumulator batteries are deteriorated or threaten to be deteriorated as the result of determination of deterioration of one or more of plural accumulator batteries.

The sixth aspect of equipment for determining deterioration of accumulator battery in the present invention includes;

a display part which indicates information as for handling-needing accumulator batteries needing to be discharged or replaced, and as for ongoingly-usable accumulator batteries possible to be ongoingly used in the case that the one or more accumulator batteries are deteriorated or threaten to be deteriorated as the result of determination of deterioration of one or more of plural accumulator batteries;

a storage part in which the records of the accumulator batteries are stored; and a controlling and determining part which has the programs to store the records of at least the accumulator batteries which are used after charge or are possible to be ongoingly used, and/or to ongoingly determine deterioration of the accumulator batteries.

The first aspect of method for measuring internal impedance of secondary battery in the present invention comprises the steps of:

measuring the input currents and the responsive voltages to the input currents at charge or discharge;

acquiring plural of current measurement values and voltage measurement values on time axis;

calculating amplitude of the input currents and amplitude of the responsive voltages at a predetermined frequency from the acquired plural current measurement values and the acquired plural voltage measurement values by means of Fourier transformation; and calculating internal impedances at the predetermined frequency as the result of dividing the amplitude of the responsive voltages at the predetermined frequency by the amplitude of the input currents at the predetermined frequency.

In the second aspect of method for measuring internal impedance of secondary battery in the present invention, the plural current measurement values and the plural voltage measurement values are respectively N measurement values with sampling intervals of a predetermined time interval $\Delta t$, and the amplitude of the input currents and the amplitude of the responsive voltages at the predetermined frequency are calculated by means of dispersion Fourier transformation.

In the third aspect of method for measuring internal impedance of secondary battery in the present invention, when F denotes the predetermined frequency, $i(n \cdot \Delta t)$ denotes N pieces of the input current measurement values, and $v(n \cdot \Delta t)$ denotes N pieces of the voltage measurement values, herein n is an integer from zero to N−1, the amplitude of the input currents $I(\omega)$ and the amplitude of the responsive voltages $V(\omega)$ are calculated with use of the following formulas;

$$I(\omega) = \Delta t \sum_{n=0}^{N-1} i(n \cdot \Delta t) \cdot \exp(j\omega \cdot n \cdot \Delta t) \, dt$$

$$V(\omega) = \Delta t \sum_{n=0}^{N-1} v(n \cdot \Delta t) \cdot \exp(j\omega \cdot n \cdot \Delta t) \, dt,$$

herein $\omega$ denotes $2\pi F$, and the internal impedance $Z(\omega)$ is calculated with use of the following formula.

$$Z(\omega) = \frac{V(\omega)}{I(\omega)}$$

In the fourth aspect of method for measuring internal impedance of secondary battery, at least M internal impedances are calculated correspondent to at least M different frequencies, and M circuit constants included in the equivalent circuit of the secondary battery are calculated with use of a simultaneous equation which includes the M circuit constants as a unknown quantity, based upon the internal impedances at the plural frequencies.

Another equipment for measuring internal impedance of secondary battery comprises:

charge circuits which supply the secondary battery with charge currents when the secondary battery is charged;

discharge circuits which supply the secondary battery with discharge currents when the secondary battery is discharged;

detection means which measure input currents of the secondary battery and responsive voltages when the input currents are the charge currents or the discharge currents; and control means which obtain the plural current measurement values and the plural voltage measurement values respectively on time axis from the measurement result of the detection means, calculate amplitudes of the input currents and the responsive voltage at a determined frequency from the plural current measurement values and the plural voltage measurement values with use of Fourier transformation, and calculate internal impedances of the secondary battery as the result of dividing the amplitude of the responsive voltages at the predetermined frequency by the amplitude of the input currents at the predetermined frequency.

In the other equipment for measuring internal impedance of secondary battery, the control means compose both of the current measurement values and the voltage measurement values of N measurement values with sampling intervals of a predetermined time interval Δt, and calculate the amplitude of the input currents and the amplitude of the responsive voltages at the predetermined frequency by means of dispersion Fourier transformation.

In the other equipment for determining deterioration of secondary battery in which the deterioration of the secondary battery is determined based upon the internal impedances calculated with use of the equipment for measuring internal impedance of secondary battery.

One aspect of power supply system in the present invention includes the power supply system with the above equipment for measuring internal impedance of secondary battery.

The other aspect of method for measuring internal impedance of secondary battery in the present invention comprises the steps of:

determining which polarization due to charging or polarization due to discharging occurs in a secondary battery to supply electric power with some loads;

applying discharge current pulses with a constant time cycle to the secondary battery with polarization due to charging, and applying charge current pulses with a constant time cycle to the secondary battery with polarization due to discharging;

measuring the input currents and the responsive voltage of the secondary battery after a predetermined number of the constant time cycles from start of applying the discharge current pulses or the charge current pulses; and calculating internal impedances of the secondary battery from the measured input currents and the measured responsive voltage.

In the other aspect of method for measuring internal impedance of secondary battery in the present invention, the measured input currents and the measured responsive voltage from which the internal impedances are calculated, start to be measured after a predetermined number of the time cycles in the range of 10 to 50 cycles from start of applying the discharge current pulses or the charge current pulses.

Another aspect of method for measuring internal impedance of secondary battery in the present invention comprises the steps of;

determining which polarization due to charging or polarization due to discharging occurs in a secondary battery to supply electric power with some loads;

applying discharge current pulses with a constant time cycle to the secondary battery with polarization due to charging, and applying charge current pulses with a constant time cycle to the secondary battery with polarization due to discharging;

measuring the input currents and the responsive voltage of the secondary battery within a predetermined time after the discharge current pulses or the charge current pulses start to be applied;

calculating plural internal impedances of the secondary battery on time axis from the measured input currents and the measured responsive voltage;

determining coefficients of a quadratic or more exponential damping function which approximates the time characteristics of the internal impedance by means of recursive calculation with use of the plural internal impedances; and obtaining convergent values of the internal impedance from at least the determined coefficients.

In the other aspect of method for measuring internal impedance of secondary battery in the present invention, the exponential damping function is expressed as the following function F(T), herein T is time, and five coefficients of A1 to A5 are determined.

i $F(T)=A1\ \exp(A3 \cdot T)+A2\ \exp(A4 \cdot T)+A5$

In the other aspect of method for measuring internal impedance of secondary battery in the present invention, the discharge current pulses or the charge current pulses are rectangular pulses which have predetermined time cycle and predetermined amplitude.

In the other aspect of method for measuring internal impedance of secondary battery in the present invention, the measured input currents and the measured responsive voltage from which the internal impedances are calculated, start to be measured after a predetermined number of the time cycles in the range of 10 to 50 cycles from start of applying the discharge current pulses or the charge current pulses.

Another aspect of equipment for measuring internal impedance of secondary battery in the present invention includes:

detection means which measure input currents of the secondary battery and responsive voltages when the input currents are the charge currents or the discharge currents;

charge and discharge circuits which make it possible to apply charge or discharge current pulses with a constant time cycle to the secondary battery; and control means determining which polarization due to charging or polarization due to discharging occurs in a secondary battery supplying some loads with electric power, applying discharge current pulses with a constant time cycle to the secondary battery in the former case, and charge current pulses with a constant time cycle are applied to the secondary battery in the former case, measuring the input currents and the responsive voltage of the secondary battery after a predetermined number of the constant time cycles from start of applying the discharge current pulses or the charge current pulses, and calculating internal impedances of the secondary battery from the measured input currents and the measured responsive voltage.

Other aspect of equipment for measuring internal impedance of secondary battery in the present invention includes:

detection means which measure input currents of the secondary battery and responsive voltages when the input currents are the charge currents or the discharge currents;

charge and discharge circuits which make it possible to apply charge or discharge current pulses with a constant time cycle to the secondary battery; and control means determining which polarization due to charging or polarization due to discharging occurs in a secondary battery supplying some loads with electric power, applying discharge current pulses with a constant time cycle to the secondary battery in the former case, and charge current pulses with a constant time cycle are applied to the secondary battery in the former case, obtaining the results measured by the detection means within a predetermined time after the discharge current pulses or the charge current pulses start to be applied, calculating plural internal impedances of the secondary battery on time axis from the measured input currents and the measured responsive voltage, determining coefficients of a quadratic or more exponential damping function, which approximates the time characteristics of the internal impedance, by means of recursive calculation with use of the plural internal impedances, and obtaining convergent values of the internal impedance from at least the determined coefficients.

One aspect of power supply system in the present invention includes the equipment for measuring internal impedance of secondary battery.

Another aspect of method for determining deterioration of secondary battery in the present invention comprises the steps of:

calculating the internal impedances from currents and voltages of the secondary battery measured in the condition that predetermined currents are applied to the secondary battery;

determining coefficients of respective terms of an approximate function which comprises a cubic or more polynomial expression and approximates the temperature characteristics of the secondary battery, based upon the calculated internal impedances and the measured temperature of the secondary battery;

calculating a specified internal impedance, which is a presumed internal impedance value at a predetermined specified temperature, with use of the cubic or more polynomial expression based upon the determined coefficients; and determining deterioration of the secondary battery based upon the specified internal impedance.

In the other aspect of method for determining deterioration of secondary battery in the present invention, the coefficients of respective terms of the cubic or more polynomial expression are set in reference to a common specified factor, the common specified factor is calculated from the calculated internal impedance and the measured temperature, and the coefficients of respective terms is determined base upon the specified factor.

In the other aspect of method for determining deterioration of secondary battery in the present invention, the approximate function including the cubic or more polynomial expression is $Z=C+f1(C) \cdot Tp+f2(C) \cdot Tp^2+ \ldots +fn(C) \cdot Tp^n$, here Tp, Z and C respectively indicate temperature, the internal impedance and the specified factor, n indicates a integer of more than or equal to 3, and f1 to fn indicate predetermined function.

In other aspect of the method for determining deterioration of secondary battery, the function f1(C) to fn(C) included in the respective terms of the cubic or more polynomial expression are expressed in a linear expression of the specified factor C.

In other aspect of the method for determining deterioration of secondary battery in the present invention, a judging threshold is predetermined depending on the specified temperature, and deterioration of the secondary battery is determined depending on the magnitude relation between the calculated specified internal impedance and the judging threshold.

Another aspect of the method for measuring internal impedance of secondary battery comprises the steps of:

obtaining respective amplitudes of the discharge currents at the various frequencies by means of applying Fourier transformation to the discharge current waveform when the frequency of the discharge current pulse is set up to various frequencies while the discharge currents are flowed;

obtaining respective amplitudes of the responsive voltages at the various frequencies by means of applying Fourier transformation to the responsive voltage waveform;

comparing internal impedances at the various frequencies each other after the internal impedances are obtained respectively at the various frequencies by means of dividing the amplitudes of the responsive voltages by the amplitudes of the discharge currents; and determining the noise level in the measurement of the currents and the voltages as low when proportion of the data spread of the internal impedances is less than or equal to a predetermined value, and determining the noise level in the measurement of the currents and the voltages as high when proportion of the data spread of the internal impedances is more than the predetermined value.

In other aspect of the method for measuring internal impedance of secondary battery, a set of discharges having at least three different time cycles is carried out repeatedly, internal impedances are calculated at not less than three different cycles, and desired internal impedance are calculated from at least the three impedances.

Another aspect of the equipment for determining deterioration of secondary battery based upon the internal resistances of the secondary battery supplying electric power with loads includes:

circuits which can apply current pulses to the secondary battery:

detection means which measures currents and voltages of the secondary battery;

temperature sensors which measure the temperature of the secondary battery; and control means which calculates the internal impedances from the measurement results of the detection means in condition that the circuits apply current pulses to the secondary battery, determines coefficients of the respective terms of an approximate function which comprises a cubic or more polynomial expression and approximates the temperature characteristics of the secondary battery, calculates a specified internal impedance, which is a presumed internal impedance value at a predetermined specified temperature, with use of the cubic or more polynomial expression based upon the determined coefficients, and determines deterioration of the secondary battery based upon the calculated specified internal impedance.

In other aspect of the equipment for determining deterioration of secondary battery, the nonvolatile storage means stores the plural configuration information about plural combinations of the coefficients of the respective terms of the cubic or more polynomial expression, and the control means can selectively read out from the plural configuration information.

In other aspect of the equipment for determining deterioration of secondary battery, the nonvolatile storage means stores the plural configuration information about plural combinations of the coefficients of the respective terms of the cubic or more polynomial expression, and the control means can selectively read out from the plural configuration information.

In other aspect of the equipment for determining deterioration of secondary battery, the nonvolatile storage means stores judging threshold values predetermined depending on the specified temperature, and the control means determines deterioration of the secondary battery depending on the magnitude relation between the calculated specified internal impedance and the judging threshold to be read out from the nonvolatile storage means.

Another aspect of the equipment for determining deterioration of secondary battery includes determining parts which calculates respective amplitudes of the discharge currents at the various frequencies from the discharge current waveforms by means of Fourier transformation when discharge currents are flowed at various frequencies by means of discharging continuously at various frequencies, calculates respective amplitudes of responsive voltages at the various frequencies from the responsive voltage waveforms by means of Fourier transformation, compares internal impedances at the various frequencies each other after the internal impedances are obtained respectively at the various frequencies as a result of dividing the magnitudes of responsive voltages by the magnitudes of the discharge currents respectively at the various frequencies, and determines the noise level in the measurement of the currents and the voltages as low when proportion of the data spread of the internal impedances is less than or equal to a predetermined value, and determines the noise level in the measurement of the currents and the voltages as high when proportion of the data spread of the internal impedances is more than the predetermined value.

Another aspect of the power supply system includes the power supply system with the equipment for determining deterioration of secondary battery as described above.

According to the present invention, when determining deterioration of accumulator battery that deterioration of the accumulator battery hooked up with loads in the system, a specified temperature is predetermined as a temperature at which the deterioration of the accumulator battery is determined, the measured internal resistance values are converted into the internal resistance values at the specified temperature, the internal resistance values at the specified temperature are converted into the terminal discharge voltage values of the accumulator battery at the specified temperature, and whether the accumulator battery is deteriorated or not is determined by means of comparison of the terminal discharge voltage values of the accumulator battery at the specified temperature and predetermined threshold value as a deterioration judgment standard. Therefore, it is possible to determine the deterioration of the active accumulator battery precisely and quickly.

According to the present invention, when measuring internal impedances of secondary battery, the input currents and the responsive voltages to the input currents are measured at charge or discharge, internal impedances are calculated at a specified frequency by means of Fourier transformation, and therefore it is not necessary to equip a special current source and use currents with a periodic waveform. Thereby it is possible to produce equipment for measuring internal impedance of secondary battery which has simplified and low-cost constructions and makes it possible to reduce deterioration due to the measurement.

According to the present invention, current pulses are applied to the secondary battery depending on polarization state in the secondary battery, the internal impedances are calculate after the internal impedances get stable, and thereby it is possible to precisely measure internal impedances without impact of polarization.

In addition according to the present invention, current pulses are applied to the secondary battery depending on polarization state in the secondary battery, then convergent values of the internal impedances are calculated with use of a quadratic or more exponential damping function whose coefficients are determined by means of recursive calculation with use of plural internal impedances obtained for a predetermined time period from start of applying current pulses, thereby it is possible to calculate the internal impedances without impact of polarization, and therefore it is possible to precisely measure the internal impedances.

BRIEF DESCRIPTION OF DRAWINGS

FIG. 1-2 shows a configuration view of the second example to which the present invention is applied;

FIG. 1-3 shows a configuration view of an example of electric power control equipment employed in the system to which the present invention is applied;

FIG. 1-4 is a flow chart showing the flow of the first example of the method for determining deterioration of accumulator battery in the first embodiment according to the present invention;

FIG. 1-5 is a flow chart showing the flow of the second example of the method for determining deterioration of accumulator battery in the first embodiment according to the present invention;

FIG. 1-6 is a flow chart showing the flow of the third example of the method for determining deterioration of accumulator battery in the first embodiment according to the present invention;

FIG. 1-7 is a graph showing the first example of the time fluctuation in discharge currents when loads are used;

FIG. 1-8 is a graph showing the second example of the time fluctuation in discharge currents when loads are used, Pattern (A) in FIG. 1-8 show a time fluctuation pattern of the consumption currents required during operation of loads. Pattern (B) in FIG. 1-8 show a time fluctuation pattern of the consumption currents substantially equal to Pattern (A);

FIG. 1-9 is a graph showing the relation between terminal voltages at discharge and discharge currents in the case that the terminal voltages of the accumulator battery for calculation of the resistance-voltage conversion factors are the lowest voltages at discharge, according to the first example method;

FIG. 1-10 is a graph showing the relation between terminal voltages at discharge and discharge currents in the case that the terminal voltages of the accumulator battery for calculation of the resistance-voltage conversion factors are the voltages after a predetermined time period from start of discharge, according to the first example method;

FIG. 1-11 is a graph showing an example of the temperature characteristics of internal resistance of accumulator battery;

FIG. 1-12 is a graph showing an example of the temperature correction coefficients;

FIG. 1-13 is a graph showing an example of the resistance-voltage conversion factors used in the method as shown in the first example;

FIG. 1-14 is a graph showing an example of the resistance-voltage conversion factors used in the method as shown in the second example;

FIG. 1-15 is a flow chart showing the flow of the method for determining deterioration of accumulator battery in the second embodiment according to the present invention;

FIG. 1-16 shows the relation between the internal resistances in the second embodiment and the lowest voltages during supplying loads with currents;

FIG. 1-17 shows the relation between battery capacities measured by the conventional method, which are called Five Hour Capacity, and the lowest voltages during supplying loads with currents;

FIG. 1-18 shows a flow chart of the process in the conventional method;

FIG. 1-19 shows the block diagram of the first altered example;

FIG. 1-20 shows the block diagram of the second altered example;

FIG. 1-21 shows the block diagram of the third altered example;

FIG. 1-22 shows the block diagram of the fourth altered example;

FIG. 1-23 shows a configuration view of an example of the conventional method;

FIG. 1-24 shows a configuration view of an example of the method in the present invention;

FIG. 2-1 is a block diagram showing the rough construction of a power supply system according to the embodiment of the present invention;

FIG. 2-2 shows an equivalent circuit of the secondary battery;

FIG. 2-3 is a flow chart showing the specific process of measuring the internal impedances of a secondary battery in a power supply system according to the embodiment;

FIG. 2-4 shows the relation between the internal impedances and deterioration in a secondary battery;

FIG. 3-1 is a block diagram showing the rough construction of a power supply system according to the first embodiment of the present invention;

FIG. 3-2 shows a equivalent circuit of the secondary battery;

FIG. 3-3 shows a specific example of waveforms of current pulses applied to the secondary battery;

FIG. 3-4 is a flow chart showing the specific process of measuring the internal impedances of a secondary battery in a power supply system according to the first embodiment;

FIG. 3-5 is a flow chart showing the specific process of measuring the internal impedances of a secondary battery in the Step S108 of the FIG. 3-4;

FIG. 3-6 is a flow chart showing the specific process of measuring the internal impedances of a secondary battery in a power supply system according to the second embodiment;

FIG. 3-7 is a flow chart showing the specific process of calculating convergent values of the internal impedances in the Step S212 of the FIG. 3-6;

FIG. 3-8 shows a specific example of the temperature characteristics of the internal impedances calculated in the second embodiment, and this example is calculation result calculated from the absolute values and the real part values of the internal impedances;

FIG. 3-9 shows a specific example of the temperature characteristics of the internal impedances calculated in the second embodiment, and this example is calculation result calculated from the imaginary part values of the internal impedances;

FIG. 4-1 is a block diagram showing the rough construction of a power supply system according to the embodiment;

FIG. 4-2 shows a specific example of current pulse waveform applied to the secondary battery;

FIG. 4-3 shows a specific example of the temperature characteristics of the internal impedances of the secondary battery;

FIG. 4-4 shows the relation between the power number of the polynomial function and the approximate precision in the case that the temperature characteristics of the internal impedances are approximated with the polynomial function;

FIG. 4-5 is a flow chart showing the specific process of determining deterioration with use of the internal impedances of a secondary battery in a battery power supply system according to the second embodiment;

DETAILED DESCRIPTION OF THE PREFERRED EMBODIMENTS

Figure 1:
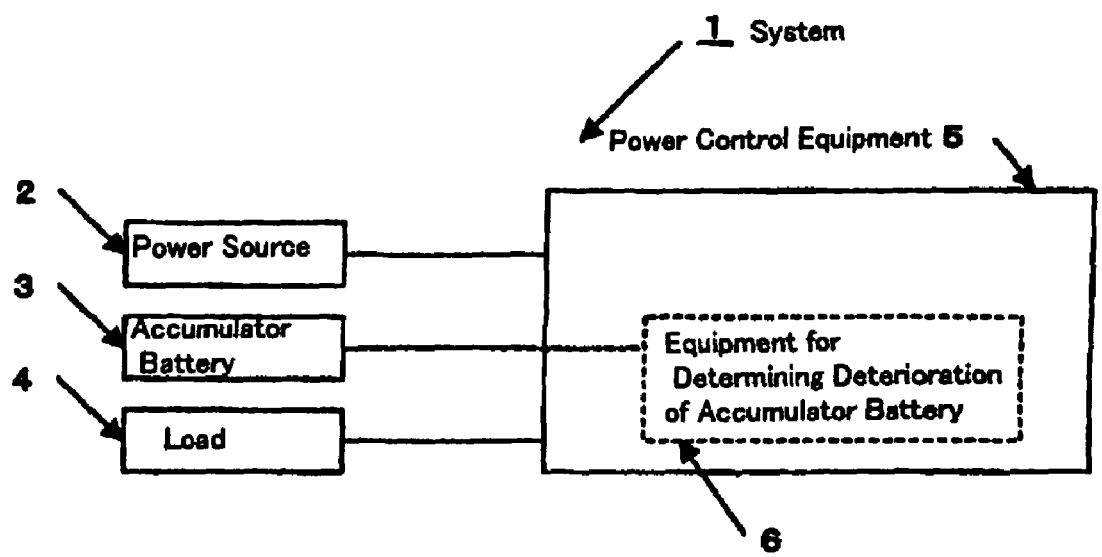
FIG. 1-1 shows a configuration view of the first example to which the present invention is applied.

Embodiments in the present invention will be described referring to figures below.

At first, the method for determining deterioration of accumulator battery will be described.

The method for determining deterioration of accumulator battery in the present invention is the method that deterioration of the accumulator battery hooked up with loads in the system is determined based upon the results of measuring internal resistances of the accumulator battery.

The method for determining deterioration of accumulator battery in the present invention is more excellent than conventional methods at the point that it is possible to almost precisely determine deterioration of accumulator batteries which are applied to the uses that charge voltage or charge condition are various or that quick discharge is needed. Wherein, the discharge current value at the quick discharge is larger than that at rated discharge, that is, rated discharge current value, which is usually battery capacity divided by five hour or ten hour.

In addition, the method for determining deterioration of accumulator battery according to the embodiment in the present invention is characterized by predetermining the following terms, (1) and (2).

(1) To determine a specified temperature at which deterioration of accumulator battery is determined. The specific temperature is within the range of operating temperature of the accumulator battery, and is set to a temperature at which terminal discharge voltage is lowest when predetermined discharge currents are flowed from the accumulator battery. In general, what influence the terminal discharge voltage, the discharge performance, is mainly the temperature characteristic of internal resistance of accumulator battery. However it is also possible to take account of the temperature characteristics of such other factors as consumption currents of loads. In particular, it is possible to take account of the temperature characteristics of diodes for protection against reverse connection along the path between accumulator batteries and loads.

(2) To calculate temperature correction coefficients of the internal resistances in advance to take account of temperature characteristics of the internal resistances. The temperature correction coefficients of the internal resistances are used to calculate the internal resistances of the accumulator battery at the specified temperature as described in (1).

Moreover, the following term (3) is predetermined as may be necessary.

(3) To calculate resistance-voltage conversion factors to take account of the relation between the internal resistances at the specified temperature and terminal discharge voltages at the specified temperature when predetermined discharge currents are flowed from the accumulator battery. As described the above (1), in general, what influence the terminal discharge voltage, the discharge performance, is mainly the temperature characteristic of internal resistance of accumulator battery, and therefore the resistance-voltage conversion factors are used to directly indicate the influence. Moreover it is possible to employ the discharge current value at the quick discharge as the predetermined discharge currents. In addition, it is also possible to calculate the resistance-voltage conversion factors with use of dropped discharge voltages instead of the terminal discharge voltages at the specified temperature. In this case, it is also possible to flow several or several ten times currents of the rated currents for such short time as a few or less seconds. Furthermore it is also possible to calculate the resistance-voltage conversion factors with use of the terminal drop voltages at the specified temperature instead of the terminal discharge voltages at the specified temperature.

Moreover, the method for determining deterioration of accumulator battery according to the embodiment in the present invention is characterized by executing the following process of (4) to (7) based upon the above predetermined terms of (1) to (3).

(4) To measure internal resistances of the accumulator battery and temperature of the accumulator battery at the internal resistance measurement. Wherein, the temperature of the accumulator battery needs not to be measured at the same time as the internal resistances of the accumulator battery are measured. In the case that it is possible to see the temperature of the accumulator battery as constant, it is no problem that the timing of both measurements does not coincide.

(5) To convert the internal resistances measured in the above (4) into the internal resistances at the specified temperature with use of the temperature correction coefficients of the internal resistances.

(6) To convert the internal resistances at the specified temperature obtained in the above (5) into the terminal discharge voltages at the specified temperature with use of the resistance-voltage conversion factors. Therefore, that makes it possible to compare the terminal discharge voltages with operating voltages of loads.

(7) To determine deterioration of the accumulator battery by means of comparing the terminal discharge voltages at the specified temperature obtained in the above (6) with the predetermined threshold value as a deterioration judgment standard. The lowest voltage to operate the loads, hereinafter called lowest operating voltage of loads, may be applied to the threshold value as a deterioration judgment standard.

In addition, it is also possible to execute the following process (8) or (9) instead of the above process (6) or (7). The results of the process (8) or (9) are substantially equal to that of the process (6) or (7).

(8) The internal resistances at the specified temperature obtained in the above (5) are converted in to the drop voltages of the accumulator battery at the specified temperature with use of the resistance-voltage conversion factors, and deterioration of the accumulator battery is determined by means of comparing the drop voltages at the specified temperature with the predetermined threshold value as a deterioration judgment standard. The threshold value as a deterioration judgment standard may be less than or equal to, for example, the drop voltages of the accumulator battery which are minimum required to operate the loads. Therefore, that makes it possible to compare the threshold value as a deterioration judgment standard with the drop voltages of the accumulator battery.

(9) Deterioration of the accumulator battery is determined by means of comparing the internal resistances at the specified temperature obtained in the above (5) with the predetermined threshold value as a deterioration judgment standard. The threshold value as a deterioration judgment standard may be less than or equal to, for example, the internal resistances which make it possible to obtain the minimum voltage required to operate the loads. Therefore, that makes it possible to compare the threshold value as a deterioration judgment standard with the internal resistances of the accumulator battery.

So, the method for determining deterioration of accumulator battery according to the embodiment of the present invention has a feature of the above (1) to (9). Specifically terminal discharge voltage or discharge drop voltage of accumulator battery into which internal resistance of the accumulator battery is converted, or the internal resistance is compared with the threshold value. Therefore it is possible to precisely and quickly determine deterioration of active accumulator battery hooked up with loads.

Next, discharge performance will be described. Discharge performance is seen as terminal discharge voltage when a predetermined current is flowed. Therefore when discharge performance goes down, terminal discharge voltage comes down more to an identical current output. In other words, discharge performance is seen as voltage drop to an identical current output.

In the present invention, voltage drop value is calculated from change of internal resistance of accumulator battery, and when the internal resistance increases, discharge performance is deemed to be degraded. Here, internal resistances may be roughly indicative of voltage drop. For example, it is possible to see internal resistance as impedance, which may be direct-current component and/or reactance component, and moreover to see it as admittance, which may be conductance component and/or susceptance.

In addition, in the present invention, from the viewpoint of precise, determination of deterioration, it is desirable to determine degradation of discharge performance at the temperature which is within the range of operating temperature, and where terminal discharge voltage at a predetermined current is lowest. For example, when the range of operating temperature is from −10 to 40 degree in lead storage battery, the lower the operating temperature is, the more degraded the discharge performance is, and the discharge performance is most degraded at the lowest temperature within the range of operating temperature. Therefore, it is desirable to calculate the discharge performance at the temperature where the discharge performance is most degraded, that is, the lowest temperature within the range of operating temperature, from the measured internal resistances at a given temperature.

In addition, when characteristic certification of accumulator battery is excessive as the result that deterioration is determined at the lowest temperature within the range of operating temperature, the specified temperature at which deterioration is determined may be shifted depending on the temperature of the accumulator battery. The specified temperature is not always necessary to be set to the lowest temperature within the range of operating temperature, and deterioration may be determined at the higher temperature than the lowest temperature within the range of operating temperature.

For example, deterioration may be determined at the specified temperature which is a predetermined degree lower than the measured temperature. Or it is also possible to set the specified temperature depending on the measured temperature of an accumulator battery as mentioned as followed:

in the case that the range of operating temperature for an accumulator battery is from −30 to +55 degree C., when the temperature of the accumulator battery is within the range of +25 to +55 degree C., the specified temperature may be set to zero degree C.;

when the temperature of the accumulator battery is within the range of zero to +25 degree C., the specified temperature may be set to −15 degree C.; and when the temperature of the accumulator battery is within the range of −30 to zero degree C., the specified temperature may be set to −30 degree C.

Or it is also possible to set the specified temperature depending on the range over a year of the measured temperature of an accumulator battery as mentioned following;

when the range over a year of the measured temperature of the accumulator battery is from −30 to +55 degree C., the specified temperature may be set to −30 degree C.;

when the range over a year of the measured temperature of the accumulator battery is from zero to +25 degree C., the specified temperature may be set to −15 degree C.;

when the range over a year of the measured temperature of the accumulator battery is from +25 to +55 degree C., the specified temperature may be set to zero degree C.; and when the range over a year of the measured temperature of the accumulator battery is from −30 to zero degree C., the specified temperature may be set to −30 degree C.

Or in the case that the range of operating temperature of accumulator battery is from −30 degree C. to +55 degree C., the range is divided into three sub-ranges of the first sub-range to the third sub-range as mentioned in Table 1, wherein the first sub-range is greater than or equal to −30 degree C. and less than zero degree C., the second sub-range is greater than or equal to zero degree C. and less than or equal to +30 degree C., and the third sub-range is greater than +30 degree C. and less than or equal to +55 degree C. And a specified temperature pattern comprising plural specified temperatures may be employed as specified temperature selection pattern A to C as mentioned in Table 1 depending on the measured temperature of the accumulator battery. Or a specified temperature may be selected arbitrarily depending on temperature records at the installation location of the accumulator battery.

Next, in the specified temperature selection pattern C, −20 degree C. is one of the specified temperatures, and therefore determination in the first sub-range does not get strict. The accumulator battery may be charged or replaced due to the determination that the accumulator battery is deteriorated. Furthermore in high temperature range, if the temperature of the accumulator battery is close to upper limit temperature, deterioration may be determined at the temperature of +30 degree C., which is lower than the upper limit temperature.

Or it may be possible to select the specified temperature different from the specified temperature of the sub-range including the measured temperature. For example, in the specified temperature selection pattern B, it may be possible to select +30 degree C. as a specified temperature, which is the one of the third sub-range in the specified temperature selection pattern B in Table 1. Like this, there are various ways to select a specified temperature. Or the temperature range may be divided into 4 or more sub-ranges. Furthermore, the temperature range may be divided into such sub-ranges with equal width, about 10 degree, as the first sub-range: greater than or equal to −30 degree C. and less than −20 degree C., the second sub-range: greater than or equal to −20 degree C. and less than −10 degree C.: . . . , the m-th sub-range: greater than or equal to 0 degree C. and less than +10 degree C.: . . . , and the n-th sub-range: greater than or equal to +50 degree C. and less than +60 degree C., or may be divided into sub-ranges with unequal width as a matter of course.

TABLE 1

| Sub-range | Measured Temperature Range | Specified Temperature Selection Pattern A | Specified Temperature Selection Pattern B | Specified Temperature Selection Pattern C |
| --- | --- | --- | --- | --- |
| First | greater than or equal to −30 degree C. and less than zero degree C. | −30 degree C. | −30 degree C. | −20 degree C. |
| Second | greater than or equal to zero degree C. and less than −30 degree C. | −15 degree C. | 0 degree C. | 0 degree C. |
| Third | greater than +30 degree C. and less than 0 degree C. | 0 degree C. | +30 degree C. | +20 degree C. |

Moreover, it may be possible that plural specified temperatures are set, voltage values are obtained respectively at the plural specified temperatures, and there is employed the specified temperature which makes the most severe determination result.

Or, it may be possible that deterioration in an accumulator battery is determined in consideration of relations between the voltage values respectively at the plural specified temperatures, such as correlation, and such operating circumstances as load status and environment.

Or, it may be possible that in plural accumulator batteries, one or more specified temperatures for each accumulator battery are set, deterioration in each accumulator battery is determined in consideration of such relations as correlation and/or such operating circumstances as load status and environment. Furthermore, determinations to plural accumulator batteries make it possible to presume deterioration levels, such as left lifetime, of the accumulator batteries which are replaced or charged at the almost same time, and thereby it is made possible to inform users of the timing for replacement or charge.

In the above examples, it is desirable to take account of temperature dependency of the lowest operative voltage of a load along with setting of the specified temperatures when the lowest voltage of the load has temperature dependency. That is, it is desirable to set the lowest voltage of the load to the highest voltage within operative temperature range of the load to reliably pick out deteriorated accumulator batteries. Or, when characteristic certification of an accumulator battery is excess, it may be possible to set the lowest operative voltage of a load to the lowest voltage at the temperature of the load in the determination of deterioration.

Next, there are described some examples of systems applied the present invention to. FIG. 1-1 shows a configuration view of the first example to which the present invention is applied. In FIG. 1-1, the numeral 1 indicates the system to which the present invention is applied. The system 1 is equipped with the power source 2 which makes the system 1 operable, the accumulator battery 3 which is charged with electric power supplied from the power source 2, the load 4 which is operated with electric power supplied from the power source 2 or the accumulator battery 3, and the power control equipment 5 which controls power supply from the power source 2 or the accumulator battery 3 to the load 4. Well though practical system may comprise a lot of loads, the only given load 4 is focused attention on in FIG. 1-1, and the diagrammatic representation and the description about other loads are omitted.

In addition, the power control equipment 5 is equipped with the equipment for determining deterioration of accumulator battery 6. The accumulator battery 3 may be such a various type of accumulator battery as a lead storage battery, nickel hydride battery, or lithium-ion battery. There may be employed any type of battery, and any class of voltage or capacity.

The above equipment for determining deterioration of accumulator battery 6 has a function of determining deterioration of the accumulator battery 3 based upon the measurement result of the internal resistances in the accumulator battery 3. As the measurement result of the internal resistances in the accumulator battery 3 is used to determine deterioration of the accumulator battery 3, it is possible to precisely determine deterioration of the accumulator battery 3 compared to conventional techniques even though the voltage of the accumulator battery 3 fluctuate during charge like the system 1 is a an apparatus which has a large load fluctuation, and the power source 2 is the commercial power sources or solar cells, or the power source 2 is a generator mounted in such vehicle as an automobile.

In addition, a system which has an accumulator battery for ordinary use and a backup accumulator battery, is also mentioned as a system to which the present invention is applied. Moreover there is no limitation of quantity of accumulator battery, and it is possible to apply the present invention to the system at any given combination of an accumulator battery for ordinary use and a backup accumulator battery as long as accumulator batteries for ordinary use and backup accumulator batteries are respectively one or more in the system.

Figures 1, 2:
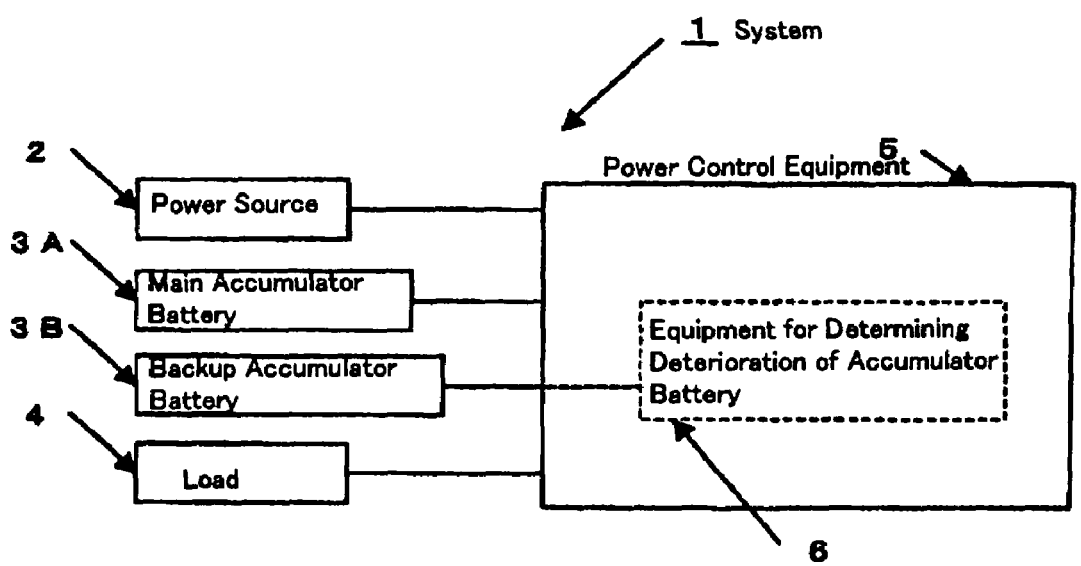

FIG. 1-2 shows a configuration view of the second example to which the present invention is applied.

In FIG. 1-2, the numeral 1 indicates the system to which the present invention is applied. The system 1 is equipped with the power source 2 which makes the system 1 operable, the main accumulator battery 3A which is charged with electric power supplied from the power source 2, the load 4 which is operated with electric power supplied from the power source 2 or the main accumulator battery 3A, and the power control equipment 5 which controls power supply from the power source 2 or the main accumulator battery 3A to the load 4. Furthermore the system 1 is also equipped with the backup accumulator battery 3B. Well though practical system may comprise a lot of loads, the only given load 4 is focused attention on in FIG. 1-2 as well as FIG. 1-1.

And the power control equipment 5 is also equipped with the equipment for determining deterioration of accumulator battery 6 which determines deterioration of at least one of the main accumulator battery 3A hooked up with the load 4 and the backup accumulator battery 3B. Any type of accumulator batteries may be applicable to the main accumulator battery 3A or the backup accumulator battery 3B, and for example, a lead storage battery is applicable.

Here, the equipment for determining deterioration of accumulator battery 6 has a function of determining deterioration of the main accumulator battery 3A or the backup accumulator battery 3B based upon the measurement result of the internal resistances in the main accumulator battery 3A or the backup accumulator battery 3B. The advantage to the equipment for determining deterioration of accumulator battery 6 equipped with the above function is as mentioned above.

And the system in FIG. 1-2 is equipped with the main accumulator battery 3A, the backup accumulator battery 3B and other plural accumulator batteries, determines deterioration of at least one of those accumulator batteries, and provides some information about the accumulator batteries having need of charge or replacement when the one or more accumulator batteries seems to be or are deteriorated. Furthermore, the display part 103 as shown in FIG. 1-19 or FIG. 1-20 which indicates the information about accumulator batteries makes it possible to let users know the circumstances of accumulator batteries, to induce charge or replacement.

Furthermore, the system as shown in FIG. 1-2 is equipped with the main accumulator battery 3A, the backup accumulator battery 3B and other plural accumulator batteries, determines deterioration of at least one of those accumulator batteries, and provides some information about the accumulator batteries having need of charge or replacement when the one or more accumulator batteries seems to be or are deteriorated, and about the ongoingly operable accumulator batteries. Therefore, the system is equipped with the display part 103 as shown in FIG. 1-19 or FIG. 1-20 to indicate the above information, and moreover the storage part, not shown, to store the records of the accumulator batteries. And moreover the system is equipped with the controlling and determining part, such as the power control equipment 5 or the equipment for determining deterioration of accumulator battery 6 in FIG. 1-2, which has a program to store the records of the accumulator batteries operable after charge or ongoingly, and/or to determine ongoingly. The system like this can have at least one operable accumulator battery. Therefore the present invention is useful for a system or equipment required for the power supply to be always on.

Next, there is described the power control equipment 5 employed in the system to which the present invention is applied.

Figures 1, 2, 3:
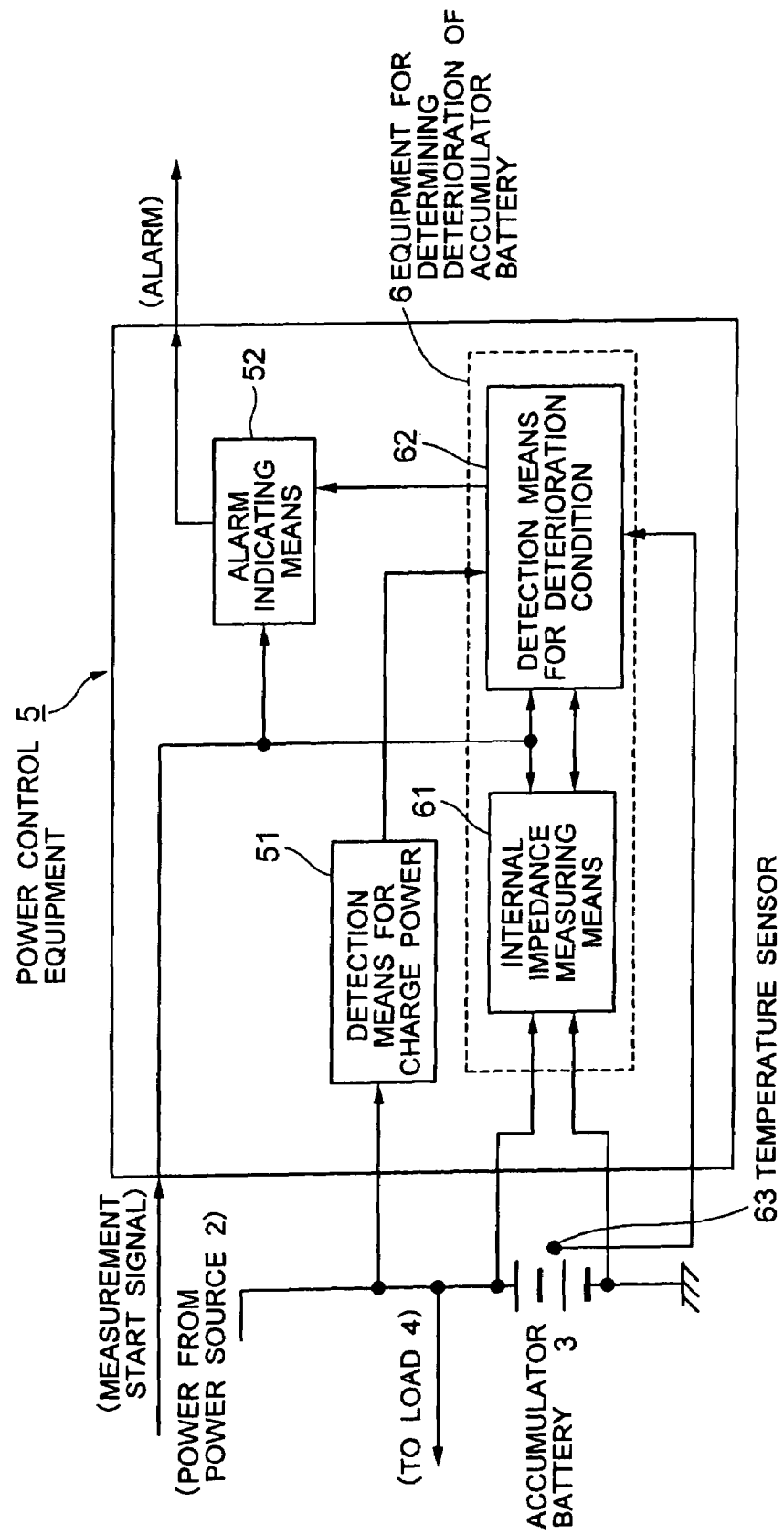

FIG. 1-3 shows a configuration view of an example of electric power control equipment employed in the system to which the present invention is applied. Here, the power control equipment as shown in FIG. 1-3 is described on the premise of application to the system as shown in FIG. 1-1.

In FIG. 1-3, the power control equipment 5 is equipped with the detection means for charge power 51 which detects presence of charge power from the power source 2 to the accumulator battery 3, and the alarm indicating means 52 which transmits out the alarm signals converted from deterioration detection signals transmitted from the equipment for determining deterioration of accumulator battery 6. In addition, the detection means for charge power 51 is the means to determine deterioration of the accumulator battery 3 with use of the equipment for determining deterioration of accumulator battery 6 during the time when the accumulator battery is not charging.

Actually, the power control equipment 5 is equipped with such other functions as a adjust function to adjust from the power source 2 to the accumulator battery 3 if needed, but here the other functions aren't described and shown.

In addition, the equipment for determining deterioration of accumulator battery 6 is equipped with the internal impedance measuring means 61 to measure the internal impedances of the accumulator battery 3, and the detection means for deterioration condition 62 which determines deterioration of the accumulator battery with use of the measuring result in the internal impedance measuring means 61. The detection means for deterioration condition 62 can measure temperature of the accumulator battery 3 or around the battery 3 with use of the temperature sensor 63 hooked up with the detection means 62. Furthermore, the detection means for deterioration condition 62 has also a control function for the internal impedance measuring means 61 and a transmitting function to transmit deterioration detection signals when the accumulator battery 3 is deteriorated out to the detection means for deterioration condition 62.

Next, there is described a specified example of the method for determining deterioration of accumulator battery according to the embodiment in the present invention.

FIG. 1-4 is a flow chart showing the flow of the first example of the method for determining deterioration of accumulator battery in the first embodiment according to the present invention. The figure is described below per each step.

Step 0: Initial Value Setting

Initial values of a specified temperature, temperature correction coefficients of the internal resistances, resistance-voltage conversion factors and a threshold value as a deterioration judgment standard are set. Here, the resistance-voltage conversion factors are the factors to convert the internal resistance at a specified temperature into the terminal discharge voltage at the specified temperature. The threshold value as a deterioration judgment standard is a voltage value larger than or equal to the lowest operating voltage of loads.

Step 1: Internal Resistance Measurement

The internal resistances, actually the internal impedance, are measured by means of flowing alternate currents through both terminals of accumulator battery. This measurement is executed with use of so called electric conductivity measurement by AC 4 probes method, or the improved version of the method. And here, it is possible to select the frequency of the alternate currents as thought proper, and moreover it is also possible to measure the internal resistances with use of plural frequencies if necessary.

Step 2: Temperature Measurement of Accumulator Battery

Temperature of the accumulator battery is measured around the same time as the internal resistance measurement in the above Step 1. It may be possible to measure the temperature around the accumulator battery instead of the temperature of the accumulator battery. Here, the temperature measurement of the accumulator battery does not always have to execute around the same time as the internal resistance measurement.

Step 3: Conversion into Internal Resistance at a Specified Temperature

The internal resistance measured in Step 1 is converted into the internal resistance at the specified temperature with use of the temperature correction coefficients of the internal resistance set in Step 0 and the temperature of the accumulator battery measured in Step 2.

Step 4: Conversion into Terminal Discharge Voltage

The internal resistance at the specified temperature obtained in Step 3 is converted into the terminal discharge voltage of the accumulator battery at the specified temperature with use of the resistance-voltage conversion factors set in Step 0.

Step 5: Comparison Between the Terminal Discharge Voltage and the Threshold Value as a Deterioration Judgment Standard As the result of comparison between the terminal discharge voltage and the threshold value as a deterioration judgment standard set in Step 0, in case that the former is larger than the latter, Step 6 is executed, and in other cases, Step 7 is executed.

Step 6: Determination Result (1)—Determination for Accumulator Battery to be Good When the terminal discharge voltage is larger than the threshold value as a deterioration judgment standard in Step 5, it is determined for the accumulator battery to be good, and the flow of determining deterioration is finished.

Step 7: Determination Result (2)—Determination for Accumulator Battery to be Deteriorated When the terminal discharge voltage is less than or equal to the threshold value as a deterioration judgment standard in Step 5, it is determined for the accumulator battery to be deteriorated, and the flow of determining deterioration is finished.

Here, if the flow of determining deterioration is finished after Step6, the processes for determining deterioration once again can be executed after an interval, and in that case, the processes for determining deterioration are repeated until the flow of determining deterioration is finished after Step 7. Or a sequence of determining deterioration from Step 0 to Step 7 which is exemplified at FIG. 1-4, may be repeated periodically.

Next, there is described the second example of the method for determining deterioration of accumulator battery according to the embodiment in the present invention. FIG. 1-5 is a flow chart showing the flow of the second example of the method for determining deterioration of accumulator battery in the first embodiment according to the present invention. The figure is described below per each step as the first example.

Step 0: Initial Value Setting

Initial values of a specified temperature, temperature correction coefficients of the internal resistances, resistance-voltage conversion factors and a threshold value as a deterioration judgment standard are set. Here, the resistance-voltage conversion factors are the factors to convert the internal resistance at a specified temperature into the discharge drop voltage at the specified temperature. The threshold value as a deterioration judgment standard is a voltage value less than or equal to the drop voltage which gives the lowest operating voltage of loads.

Step 1: Internal Resistance Measurement

The description about Step 1 is omitted because the contents of Step1 in the second example are similar to that in the first example.

Step 2: Temperature Measurement of Accumulator Battery

The description about Step 2 is omitted because the contents of Step 2 in the second example are similar to that in the first example.

Step 3: Conversion into Internal Resistance at a Specified Temperature

The description about Step 3 is omitted because the contents of Step 3 in the second example are similar to that in the first example.

Step 4: Conversion into Discharge Drop Voltage

The internal resistance at the specified temperature obtained in Step 3 is converted into the discharge drop voltage of the accumulator battery at the specified temperature with use of the resistance-voltage conversion factors set in Step 0.

Step 5: Comparison Between the Discharge Drop Voltage and the Threshold Value as a Deterioration Judgment Standard As the result of comparison between the discharge drop voltage and the threshold value as a deterioration judgment standard set in Step 0, in case that the former is less than the latter, Step 6 is executed, and in other cases, Step 7 is executed.

Step 6: Determination Result (1)—Determination for Accumulator Battery to be Good When the discharge drop voltage is less than the threshold value as a deterioration judgment standard in Step 5, it is determined for the accumulator battery to be good, and the flow of determining deterioration is finished.

Step 7: Determination Result (2)—Determination for Accumulator Battery to be Deteriorated When the terminal discharge voltage is larger than or equal to the threshold value as a deterioration judgment standard in Step 5, it is determined for the accumulator battery to be deteriorated, and the flow of determining deterioration is finished.

Here, just like the first example exemplified at FIG. 1-4, if the flow of determining deterioration is finished after Step6, the processes for determining deterioration once again can be executed after an interval, and in that case, the processes for determining deterioration are repeated until the flow of determining deterioration is finished after Step 7. Or a sequence of determining deterioration from Step 0 to Step 7 which is exemplified at FIG. 1-5, may be repeated periodically.

Next, there is described the third example of the method for determining deterioration of accumulator battery according to the embodiment in the present invention. FIG. 1-6 is a flow chart showing the flow of the third example of the method for determining deterioration of accumulator battery in the first embodiment according to the present invention. The figure is described below per each step as the first or second example.

Step 0: Initial Value Setting

Initial values of a specified temperature, temperature correction coefficients of the internal resistances, resistance-voltage conversion factors and a threshold value as a deterioration judgment standard are set. Here, the threshold value as a deterioration judgment standard is a voltage value less than or equal to the drop voltage which gives the lowest operating voltage of loads.

Step 1: Internal Resistance Measurement

The description about Step 1 is omitted because the contents of Step1 in the second example are similar to that in the first example.

Step 2: Temperature Measurement of Accumulator Battery

The description about Step 2 is omitted because the contents of Step 2 in the second example are similar to that in the first example.

Step 3: Conversion into Internal Resistance at a Specified Temperature

The description about Step 3 is omitted because the contents of Step 3 in the second example are similar to that in the first example.

Step 4: Comparison Between the Internal Resistance at the Specified Temperature and the Threshold Value as a Deterioration Judgment Standard As the result of comparison between the internal resistance at the specified temperature and the threshold value as a deterioration judgment standard set in Step 0, in case that the former is less than the latter, Step 5 is executed, and in other cases, Step 6 is executed.

Step 5: Determination Result (1)—Determination for Accumulator Battery to be Good When the internal resistance at the specified temperature is less than the threshold value as a deterioration judgment standard in Step 4, it is determined for the accumulator battery to be good, and the flow of determining deterioration is finished.

Step 6: Determination Result (2)—Determination for Accumulator Battery to be Deteriorated When the internal resistance at the specified temperature is larger than or equal to the threshold value as a deterioration judgment standard in Step 4, it is determined for the accumulator battery to be deteriorated, and the flow of determining deterioration is finished.

Here, just like the first example exemplified at FIG. 1-4, if the flow of determining deterioration is finished after Step 5, the processes for determining deterioration once again can be executed after an interval, and in that case, the processes for determining deterioration are repeated until the flow of determining deterioration is finished after Step 6. Or a sequence of determining deterioration from Step 0 to Step 6 which is exemplified at FIG. 1-6, may be repeated periodically.

And above, There has been described the examples of the method for determining deterioration of accumulator battery according to the embodiment in the present invention. Here, the values set in Step 0s of respective examples and others are described.

At first, discharge currents in use of loads are described. The discharge currents in use of loads vary according to the capacities of the respective accumulator batteries and the other condition, and therefore it is desirable that the data of the discharge currents in use of loads are in advance obtained with use of plural accumulator batteries of a kind whose deterioration levels are different from each other, FIG. 1-7 is a graph showing the first example of the time fluctuation in discharge currents when loads are used. And in FIG. 1-7, the rated current values are shown along with the discharge currents. It is possible to nearly precisely determine deterioration of accumulator battery with use of the method for determining deterioration of accumulator battery according to the embodiment of the present invention even though the currents greater than the rated current value, for example greater than or equal to 1 cA, are flowed for a relative short term as shown in FIG. 1-7.

FIG. 1-8 is a graph showing the second example of the time fluctuation in discharge currents when loads are used, Pattern (A) in FIG. 1-8 show a time fluctuation pattern of the consumption currents required during operation of loads. Pattern (B) in FIG. 1-8 show a time fluctuation pattern of the consumption currents substantially equal to Pattern (A). It is possible to nearly precisely determine deterioration of accumulator battery with use of the method for determining deterioration of accumulator battery according to the embodiment of the present invention even though the currents are flowed with the time fluctuation pattern of the currents as shown in FIG. 1-8. Along with it, the method is sufficiently applicable to the currents greater than the rated current value, for example greater than or equal to 1 cA.

And when the resistance-voltage conversion factors of the values set in Step 0 are calculated from the discharge currents during use of loads, the discharge current values are such as exemplified in FIG. 1-7 and 1-8. However, in this case, it is desirable to collect data in advance with use of plural accumulator batteries of the same kind whose deterioration levels are different from each other because the resistance-voltage conversion factors differ depending on such the conditions of the respective accumulator batteries as a capacity.

For example, in the first example of the method, it is possible to certainly determine deterioration of accumulator battery when the terminal discharge voltage of the accumulator battery is the lowest voltage at discharge in the process that the resistance-voltage conversion factors are calculated in advance from the internal resistances at the specified temperature and the terminal discharge voltages at the specified temperature in flowing the predetermined discharge currents. FIG. 1-9 shows graphs of the time fluctuations of the terminal discharge voltages and the discharge currents in this case.

In addition, in the first example of the method, the terminal discharge voltage of the accumulator battery is also the voltage a predetermined time after start of discharge in the process that the resistance-voltage conversion factors are calculated in advance from the internal resistances at the specified temperature and the terminal discharge voltages at the specified temperature in flowing the predetermined discharge currents. FIG. 1-10 shows graphs of the time fluctuations of the terminal discharge voltages and the discharge currents in this case.

Furthermore, FIGS. 1-11 to 1-14 show respectively the temperature dependency of internal resistance, the temperature dependency of temperature correction coefficients, the resistance-voltage conversion factor used in the first example of the method, and the resistance-voltage conversion factor used in the second example of the method. In addition, FIGS. 1-13 and 1-14 show respectively the threshold values as a deterioration judgment standard along with the above.

The method or equipment for determining deterioration of accumulator battery according to the second embodiment is a method or an equipment to precisely determine lowering discharge performance of accumulator battery for auxiliary battery which is applied to equipment with large fluctuation of loads, or is mounted on vehicle, that is, deterioration of accumulator battery.

In addition, the method or equipment is a method or an equipment to determine the discharge performance degradation at the most severe temperature for discharge performance of accumulator battery within the operable temperature range provided in the specifications, that is, at the lowest temperature of the temperatures where the discharge performance is lowest, based upon the measurement result at a desired temperature, and a method or an equipment to determine the presence of the performance degradation of the accumulator battery for auxiliary battery to the specification for electric power operating loads which is actually supplied with electric power from the accumulator battery for auxiliary battery.

In general, time fluctuation of consumption currents is provided for currents in the specifications of electric power operating loads, and guaranteed lowest voltage is provided for voltages.

Therefore, when the currents with the provided time fluctuation pattern of consumption currents or according to the pattern are flowed, the discharge performance of accumulator battery is determined depending on margin level of the terminal voltage of the accumulator battery to the guaranteed lowest voltage.

By the way, in case that discharge performance is determined at the actually measured temperature, even though an accumulator battery has a discharge performance which makes it possible to supply loads with the power required to operate them from the accumulator battery at the temperature when it is before the accumulator battery installed in various equipments or placed at predetermined location, or such battery mounted in vehicle as a lead storage battery is left unused until the battery is operated, before the accumulator battery is stored until shipping, or before the accumulator battery is transported, hereinafter called before left unused, it can be impossible to supply with the required power at the temperature after arrival or after to be left unused, that is, before operation or usage. As the result, when a system, an equipment which requires accumulator battery as a power supply, or when such as a equipment in vehicle is an important part for driving safely, very serious matter can be raised. Or even if degradation of discharge performance of the accumulator battery is determined at the temperature after to be left unused, a warning not to permit usage of the battery is given to users, and then it forces inconvenience on the users.

And so, in the present embodiment, degradation of discharge performance is determined at the temperature where the discharge performance is lowest within the predetermined range of operable temperature. Because the discharge performance of accumulator battery change depending on the temperature in the environment of the accumulator battery when it is assumed that the accumulator battery placed at predetermined location or at such as station house, or the vehicle mounting the accumulator battery is left unused. Therefore, degradation of discharge performance id determined at the most severe temperature for the discharge performance as deterioration of the accumulator battery after left unused is unknown. If the discharge performance gets degraded, it is possible to prompt in advance the users or the department for repair and maintenance to charge the accumulator battery or replace the battery.

As mentioned in the description of the first embodiment, discharge performance is seen as voltage drop at a specified current.

In the present invention, this voltage drop value due to degradation of discharge performance is replaced by internal resistance value of accumulator battery, and the internal resistance value is a correlative value which correlates with the discharge performance. The discharge performance is calculated by means of assigning the correlative value after temperature correction to a predetermined relational formula, and discharge performance is deemed to be degraded if the internal resistance increases. Internal resistances to be measuring objects may be anything possible to be alternative indicatives of voltage drop. Specifically, the alternative indicatives may be direct-current resistances or alternative-current impedances. Or they may be such conductive values as an alternative admittance, which is an inverse of the alternative-current impedance.

FIG. 1-15 is a flow chart showing the flow of the method for determining deterioration of accumulator battery in the second embodiment according to the present invention.

The method for determining deterioration of accumulator battery according to the present invention is characterized in that;

a specified temperature, where deterioration of accumulator battery is predetermined, is set;

correlative values which correlate with discharge performance of the accumulator battery, that is, internal resistances are measured at desirable temperature (Step S11);

the internal resistances are converted into internal resistances at the specified temperature by means of correcting the internal resistances for the temperature at the measurement with use of a predetermined temperature correcting formula (Step S12);

discharge performance at the specified temperature is calculated with use of a predetermined relational formula between the converted internal resistances and discharge performance (Step S13); and deterioration of accumulator battery is determined by means of comparison of the internal resistance values at the specified temperature and predetermined threshold value as a deterioration judgment standard.

In the above case, the predetermined relational formula is also a correlative formula between the converted internal resistances, and the terminal voltage of the accumulator battery which occurs at flowing electric currents which have a time fluctuation pattern corresponding to or similar to a time fluctuation pattern of consumption current in the loads.

Moreover, the specified temperature may be set to a temperature where discharge performance of accumulator battery is lowest within the predetermined range of operable temperature of the accumulator battery.

In the present embodiment, discharge performance degradation is also determined at the temperature where the discharge performance gets lowest within the range of operable temperature of accumulator battery.

For example, the temperature range of −30 degree C. to +55 degree C. is mentioned as a range of operable temperature of accumulator battery which is placed at a predetermined location, placed in a station house in which such equipments as observational equipment and communication equipment are arranged, or mounted in vehicle as an auxiliary battery. In this case, the discharge performance gets lowest at −30 degree C., which is the lower limit temperature. Therefore, it is required to calculate the discharge performance at −30 degree C., where the discharge performance gets lowest, from resistance values measured at a given temperature. There is a way as described below. A temperature correction formula is obtained in advance based upon a temperature characteristic of internal resistances which are measured previously. The resistance values at the given temperature are converted into resistance values at −30 degree C., where the discharge performance gets lowest, by means of assigning the resistance values at the given temperature and the given temperature to the temperature correction formula. And the discharge performance at −30 degree C., where the discharge performance gets lowest, is obtained by means of assigning the converted resistance values to a predetermined relation formula between resistance value and discharge performance. When the obtained discharge performance is larger than the threshold value as a deterioration judgment standard, it is determined that the accumulator battery can output a required power. When the obtained discharge performance is smaller than or equal to the threshold value as a deterioration judgment standard, it is determined that the accumulator battery cannot output a required power.

Or, it may be possible to change the specified temperature, where degradation of discharge performance is determined, depending on temperature of the battery in order to avoid excessive discharge performance guarantees due to determining degradation of discharge performance of accumulator battery at the temperature where the discharge performance is lowest within the range of operable temperature. As a way of changing the specified temperature, the specified temperature may be set to a temperature which is lower than the measured temperature by a predetermined decrement. Specifically, the specified temperature may be set to a temperature which is lower than the measured temperature by a decrement of 20 degree, and degradation of discharge performance at the specified temperature may be determined.

Or, the specified temperature may be set to a predetermined temperature within a temperature range where the measure temperature belongs. The specified temperature may be set within each temperature range as specifically described below. When a temperature of the battery is within the range of +25 degree C. to +55 degree C., the specified temperature is set to 0 degree C. When a temperature of the battery is within the range of 0 degree C. to +25 degree C., the specified temperature is set to −15 degree C. When a temperature of the battery is within the range of −30 degree C. to 0 degree C., the specified temperature is set to −30 degree C.

In any case, resistance values are measured at a given temperature, and discharge performance at a predetermined specified temperature is calculated from the resistance values. Specifically, a temperature correction formula is obtained at each specified temperature from temperature characteristic of a resistance measured in advance, and the measured resistance values are converted into the resistance values at the specified temperature by means of signing the measured resistance values and the given temperature to the temperature correction formula. Moreover, discharge performance at the specified temperature is calculated by means of signing the converted resistance values to a relational formula which are obtained in advance to indicate a relation between resistance value at the specified temperature and discharge performance. And, when the obtained discharge performance is larger than the threshold value as a deterioration judgment standard, it is determined that the accumulator battery can output a required power. When the obtained discharge performance is smaller than or equal to the threshold value as a deterioration judgment standard, it is determined that the accumulator battery cannot output a required power.

The relational formula which indicates a relation between internal resistance value as a correlative value at the specified temperature and discharge performance in the above cases, is obtained easily by means of previously measuring terminal voltages of accumulator batteries for luxury batteries or resistance values, which are parameters instead of drop voltages, when to flow currents with a time fluctuation pattern of a provided consumption current or pursuant to provided consumption current, to accumulator batteries with various deterioration levels.

The second embodiment is closely described below.

At first, the second embodiment is compared with conventional examples, and the superiority of the present embodiment is described.

FIG. 1-16 shows the relation between the internal resistances in the second embodiment and the lowest voltages during supplying loads with currents.

FIG. 1-17 shows the relation between battery capacities measured by the conventional method, which are called Five Hour Capacity, and the lowest voltages during supplying loads with currents.

The accumulator batteries used in the above comparison are lead seal batteries, and have the rated capacity of 12 Ah. The samples are the accumulator battery with various deterioration levels which obtained from some accelerated life tests. Lowest battery voltages after discharge current of 15 A is flowed for ten seconds, are measured as discharge performance. The discharge condition is pursuant to a time fluctuation pattern of the consumption current for actual loads. The range of operable temperature in the specification of the accumulator batteries is a range of −30 degree C. to +55 degree C., and the discharge performance at −30 degree C., which is the lower limitation of the operable temperature, was obtained.

At first, the accumulator batteries for samples put in some thermostatic chambers with inside temperature of −30 degree C., and the state was kept until the temperature of the accumulator batteries became −30 degree C. In addition, one end of each lead line was fixed to each terminal of the respective accumulator batteries, and another end of each lead line hooked up with each electrical load equipment so that each accumulator battery enabled to discharge.

Furthermore, a voltage meter and a current meter also hooked up with the lead line. The electrical load equipments were previously set so that it was possible to discharge under the only condition that the discharge current was 15 A and the discharge period was ten seconds.

And, the discharge currents of 15 A were flowed for ten seconds from the accumulator batteries for samples in the thermostatic chambers by means of operation of the electrical load equipments. The battery voltages and the discharge currents in this time were measured with use of the voltage meters and the current meters.

Next, after the temperature of the accumulator batteries for samples is ordinary temperature, the internal resistances were measured. In the measurement, Alternative-current impedances at a frequency of 1 kHz were measured with use of some commercially available resistance meters. Temperature characteristic of the internal resistance of the accumulator batteries for samples were previously obtained, and the internal resistances at a specified temperature of −30 degree C. were calculated by means of assigning the measured internal resistance values and the temperature of the accumulator batteries at the voltage measurement to a relational formula expressing the temperature characteristic.

The relation between the calculated internal resistances and the lowest voltages during supplying loads with currents is highly correlated, and a square value of the correlation factor R is 0.9654 with a proper relational formula. And the proper formula is expressed as follows.

(Lowest Voltage)=(Proper Coefficient)*(Internal Resistance)+(Constant)

Therefore, it is possible to easily calculate the lowest voltages during supplying loads with currents by means of assigning the measured internal resistance values to the relational formula. Moreover, it is possible to precisely and easily determine whether accumulator battery enables to output required power or not, by means of setting the voltage threshold value as a deterioration judgment standard.

FIG. 1-18 shows a flow chart of the process in the conventional method.

And now, in the conventional method for measuring battery capacity, accumulator batteries for samples are put in some thermostatic chambers with inside temperature of −30 degree C., and the state was kept until the temperature of the accumulator batteries became −30 degree C.

In addition, one end of each lead line was fixed to each terminal of the respective accumulator batteries, and another end of each lead line hooked up with each electrical load equipment so that each accumulator battery enabled to discharge.

Furthermore, a voltage meter and a current meter also hooked up with the lead line. The electrical load equipments were previously set so that it was possible to discharge under the only condition that the discharge current was 2.4 A, which obtains due to multiplying 12 A by 0.2, until the battery voltages became a voltage of 10.5 V.

And operation of the electrical load equipments made discharge currents of 2.4 A flowed continuously from the battery samples until the battery voltages became a voltage of 10.5 V. The battery capacities of the respective battery samples are obtained due to multiplying discharge times from start of discharge to stop of discharge by the discharge current of 2.4 A (Step S21~Step S23). FIG. 1-17 shows the relation between battery capacities and the lowest voltages during supplying loads with currents. The correlativity in FIG. 17 is less than that in FIG. 16. A square value of the correlation factor R in FIG. 1-17 was 0.9654 with a proper relational formula.

According to the present conventional method, it is possible to obtain the lowest voltage during supplying loads with currents, which is correspondent to discharge performance, due to assigning a battery capacity to a relational formula. However, it is important to continuously discharge accumulator battery until voltages become a predetermined voltage value during such practical usage as driving various equipments or being mounted on vehicle, and so it is difficult to measure battery capacity. Therefore, it is necessary to presume the battery capacity from measurement results by means of other measurement methods.

So, errors are more included in the lowest voltage during supplying loads with currents obtained with use of the present conventional method, and now the present conventional method is not practical.

As described above, according to the second embodiment, a specified temperature is previously set as a temperature where deterioration of accumulator battery is determined, internal resistance values are measured at a given temperature as correlative values which correlate with discharge performance of accumulator battery, and the measured internal resistances are converted into the resistances at the specified temperature due to assigning the temperature at the internal resistance measurement and the measured internal resistances to a previously obtained temperature correcting formula.

And, discharge performance of the accumulator battery is obtained based upon a predetermined relational formula between internal resistance and discharge performance, and the inverted internal resistances. And when the obtained discharge performance at the specified temperature is larger than a threshold value as a deterioration judgment standard, it is determined that the accumulator battery enables to output a required electric power. When the obtained discharge performance at the specified temperature is smaller than a threshold value as the deterioration judgment standard, it is determined that the accumulator battery does not enable to output the required electric power.

In this case, the discharge performance is defined as margin level of a terminal voltage of the accumulator battery to a guaranteed lowest voltage when currents are flowed with a time fluctuation pattern corresponding to or similar to a time fluctuation pattern of consumption current in the loads. Therefore, it is possible to far more precisely determine degradation of discharge performance of an active accumulator battery for operating various equipments or for vehicle compared with determining degradation of battery capacity, for example Five Hour Proportion Capacity, as mentioned in the conventional method.

As mentioned above, the method and the equipment for determining deterioration of accumulator battery according to the present invention are described as giving some specific examples. However, it is to be understood that, within the scope of the claims made herein, the invention may be practiced otherwise than the above embodiments, and modified accordingly.

For example, as shown in FIG. 1-19, the system 100 for determining deterioration of accumulator battery may be equipped with the detection circuit 101 which obtains such data as current, voltage, resistance and temperature of the accumulator battery B, the control and determination equipment 102 which determines deterioration with use of the data from the detection circuit 101, and the display part 103 which displays determination results with various ways.

In the construction as mentioned above, the detection circuit 101 measures such data of the accumulator battery B to be a secondary battery as current, voltage, resistance or temperature, and transmits the measured data to the control and determination equipment 102.

The control and determination equipment 102 receives the data, determines deterioration of the accumulator battery B, and enables the display part 103 to display the determination results with various ways.

In the result, user can easily comprehend the condition of the accumulator battery B to be a secondary battery.

In this case, it is possible to construct the display part 103 so that the display part 103 shows the condition of the accumulator battery B to be a secondary battery, for example whether the battery needs to be replaced or not, and a recommended timing for replacement.

Furthermore, TV monitors, computer displays, displays of GPS equipment and so on may be used as the display part 103.

In addition, as shown in FIG. 1-20, it may be also possible to arrange the detection circuit 101 and the control and determination equipment 102, which are in order to detect and determine the condition of accumulator battery, close to the accumulator battery, and the display part 103 at a desirable point.

For example, the detection circuit 101 and the control and determination equipment 102, which are in order to detect and determine the condition of accumulator battery, are arranged close to the accumulator battery, and the control and determination equipment 102 receives data from the detection circuit 101, determines deterioration of accumulator battery, and transmits determination results to the display part 103 by wireless.

Thereby, the computer 112 and so on receive determination results, and control the display part 103 through the radio communication device 111 so that the display part 103 displays determination results with various ways.

Moreover, it is not necessary to arrange the control and determination equipment 102 close to accumulator battery, and it may also be possible that the control and determination equipment 102 or the computer 112 close to the display part 103 receives such data obtained by the detection circuit 101 as temperature, voltage and resistance through the radio communication device 110, and determines deterioration.

The construction like this makes it possible to arrange plural display parts, monitor the conditions of accumulator batteries, which are secondary batteries, from the display parts arranged at respective points, for example battery manufacturers and the departments for repair and maintenance, or monitor and take care of plural accumulator batteries, which are secondary batteries, by a display part. In those cases, serial numbers or ID numbers given to respective accumulator batteries for identification make it possible to easily execute individual recognition of the accumulator batteries.

Furthermore, regardless of such conformation as wire transmission pass as shown in FIG. 1-19 and wireless transmission pass as shown in FIG. 1-20, deterioration information of accumulator battery may be accessed as electronic data like text, graphics and sound, with use of such information terminals as cell phone and computer over phone line or Internet.

In addition, as another embodiment, it is possible to determine deterioration of the accumulator batteries 106A, 106B, 106C staying away from each other by means of switching to measure the respective accumulator batteries with use of the equipment for determining deterioration of accumulator battery 104 which enables to switch and/or control a circuit. In the case, such electrical data as voltage, current and resistance can be measured with use of the equipment for determining deterioration of accumulator battery staying away from the accumulator batteries. However, concerning temperature measurement, it is desirable to equip vicinity of the respective accumulator batteries or the respective accumulator batteries of 106A to 106C with temperature sensors 105.

The way like this makes it possible to determine deterioration of plural accumulator batteries arranged respectively in observational equipments and communication devices. Furthermore, In vehicles, even if plural accumulator batteries are arranged under the seats or inside the storage spaces in front and rear zones of the vehicle, it is possible to determine deterioration of at least an accumulator battery. Or, it is possible to manage plural accumulator batteries with use of equipment for determining deterioration of accumulator battery or one computer located at a point.

In addition, in moreover another embodiment, as shown in FIG. 1-22, the equipment for determining deterioration of accumulator battery 107 is arranged near the accumulator battery 106a of the three accumulator batteries 106a to 106c. Moreover, the other equipment for determining deterioration of accumulator battery 108 is fixed to the accumulator battery 106b. And now, in FIG. 1-22, the remaining accumulator battery 106c is not an object to determine deterioration.

In addition, in FIG. 1-22, the GPS (Global Positioning System) equipment 110, the light 111, the moving devices 112a 112b and so on hook up with the control apparatus for equipment and power supply 109. The control apparatus for equipment and power supply 109 supplies with power and/or controls supplying with power. For example, it is to control on/off of the light 111, movement and energy consumption of the moving devices 112a and 112b, and consumption of the moving devices 112a and 112b.

The way like this makes it possible to manage plural accumulator batteries with use of the control apparatus for equipment and power supply 109, and display deterioration information of the accumulator batteries 106a and 106b on the display part 103a. Furthermore, the control apparatus for equipment and power supply 109, the equipment for determining deterioration of accumulator battery 107 and 108, the computer not shown and so on are equipped with some connectors or such wireless devices as an infrared date communication device for transmitting and receiving with external equipments so that it is possible to transmit and receive information of determining deterioration, install programs, and exchange other information.

In addition, the following method may be used for impedance measurement. Respective amplitudes of the discharge currents at the various frequencies are calculated from the discharge current waveforms by means of Fourier transformation when discharge currents are flowed at various frequencies by means of discharging continuously at various frequencies. And respective amplitudes of responsive voltages at the various frequencies are calculated from the responsive voltage waveforms by means of Fourier transformation. And internal impedances at the various frequencies are compared with each other after the internal impedances are obtained respectively at the various frequencies as a result of dividing the magnitudes of responsive voltages by the magnitudes of the discharge currents respectively at the various frequencies. In the result, the noise level in the measurement of the currents and the voltages is seen as low when proportion of the data spread of the internal impedances is less than or equal to a predetermined value, and the noise level in the measurement of the currents and the voltages is seen as high when proportion of the data spread of the internal impedances is more than the predetermined value. And in the latter case, the obtained internal impedances aren't used and the above internal impedance measurement is executed again.

FIG. 1-23 shows a configuration view of an example of the conventional method. It is difficult to recognize that measurement result includes some noise, or determine whether a noise is measured or not with use of the conventional method. In this case, the measured noise values are employed as internal impedance without modification.

FIG. 1-24 shows a configuration view of an example of the method in the present invention. In the method of the present invention, as the discharge current waveform has three or more cycles different from each other, it is possible to eliminate a measurement result subject to noise by means of comparison the internal impedance at a cycle of T3 with the internal impedance at a cycle of T2 or T4 even if the measurement result at a specified cycle of T3 is subject to noise.

In this method, three discharges with three cycles different from each other make a set, the set are repeatedly executed. In the result, it is possible to obtain, for example, the internal impedances at three cycles comprising a specified cycle, and obtain an internal impedance unswayed by noise based upon the three internal impedances.

In addition, it is desirable that absolute values of the differences between a specified cycle and two other cycles of three cycles are at least 5 or more percentages of the specified cycle. In this case, the three internal impedances show a tendency of monotonic increase or decrease. Therefore, when the tendency is convex or reentrant, it is possible to determine that the measurement values subject to noise aren't employed as a result of taking account of the effect of noise.

In addition, it is possible to precisely determine the effect of noise affecting the three impedances compared to individually measuring the three impedances at the three cycles as the three impedances are measured almost at the same time in the method according to the present invention. In this method, the impedances are calculated at three different cycles, and are determined after whether the impedance at the specified cycle is subject to noise or not is checked based upon the three impedances at the three different cycles, and therefore this method makes it possible to precisely determine deterioration.

In addition, discharge currents are flowed as frequency of discharge currents is switched to plural values by control of the computer 112 or the control and determination equipment 102 as shown in FIG. 1-20 or the control apparatus for equipment and power supply 109 or the equipment for determining deterioration of accumulator battery 107, 108 as shown in FIG. 1-22. And magnitudes of discharge currents at respective frequencies are obtained by means of applying Fourier transformation to the discharge current waveform at the respective frequencies, and magnitudes of battery voltage during discharge at respective frequencies are obtained by means of applying Fourier transformation to the responsive voltage waveform at the respective frequencies.

Furthermore, in such determining part as the computer 112, the control and determination equipment 102, the control apparatus for equipment and power supply 109, the equipment for determining deterioration of accumulator battery and so on, internal impedances at the respective frequencies are compared with each other after the internal impedances are obtained respectively at the plural frequencies as a result of dividing the magnitudes of responsive voltages by the magnitudes of the discharge currents respectively at the plural frequencies. In the result, when proportion of the data spread of the internal impedances at plural frequencies is less than or equal to a predetermined value, the noise level in the measurement of the currents and the voltages is seen as low, and when proportion of the data spread of the internal impedances is more than the predetermined value, the noise level is seen as high.

As described above, according to the present invention, in order to determine deterioration of accumulator battery hooked up with loads in the system, a specified temperature is predetermined as a temperature at which the deterioration of the accumulator battery is determined, measured internal resistances are converted into the internal resistances at the specified temperature, moreover the internal resistances at the specified temperature are converted into the terminal voltages at the specified temperature, and deterioration of the accumulator battery is determined by means of comparison of the terminal voltages at the specified temperature and a predetermined threshold value as a deterioration judgment standard. Thereby, it is possible to quickly and precisely determine deterioration of an active accumulator battery hooked up with loads.

And now, similar effects are obtained also when discharge drop voltages at the specified temperature are employed instead of the terminal voltages at the specified temperature, and compared with the predetermined threshold value as a deterioration judgment standard. Moreover, similar effects are obtained also when internal impedances at the specified temperature are employed instead of the terminal voltages at the specified temperature, and compared with the predetermined threshold value as a deterioration judgment standard.

Next, there are described the method for measuring internal impedance of secondary battery, the equipment for measuring internal impedance of secondary battery, the equipment for determining deterioration of secondary battery, and power supply system. Here, there is described the system equipped with a function of measuring internal impedance of secondary battery according to the present invention.

FIG. 2-1 is a block diagram showing the rough construction of a power supply system according to the embodiment of the present invention. In FIG. 2-1, the system is constructed as comprising the secondary battery 10, the current sensor 11, the voltage sensor 12, the control part 13, the storage part 14, the charge circuit 15 and discharge circuit so that various load 20 is supplied with electric power from the secondary battery 10.

In the construction of FIG. 2-1, for example, such accumulator battery as that used for such equipments as observational equipment and communication equipment, and a lead storage battery for vehicle is known as the secondary battery 10 supplying load 20 with electric power. Here, FIG. 2-2 shows an equivalent circuit of the secondary battery. As shown in FIG. 2-2, the secondary battery 10 may be expressed with use of the equivalent circuit which has equivalent circuits for a positive electrode, a battery electrolyte, a negative electrode, connected in this order, and which is respectively expressed by combinations of resistances of $R\Omega$, Rct1, Rct2 and Rct3, and condensers of Cd1, Cd2 and Cd3. In this case, the internal impedances of the secondary battery 10 are expressed with use of complex impedance consistent with the serial parallel circuit comprised of resistances and condensers as shown in FIG. 2-2. As described later, in the secondary battery 10 expressed by the equivalent circuit of FIG. 2-2, input currents and responsive voltages are applied Fourier transformation to, and in the result, internal resistances of the secondary battery 10 can be calculated from the respectively obtained magnitudes at a predetermined frequency.

Next, in FIG. 2-1, the current sensor 11 detects currents flowing through the secondary battery 10, and transmits the current values to the control part 13. And the voltage sensor 12 detects voltages between both of the terminals of the secondary battery 10, and transmits the voltage values to the control part 13. Both of the current sensor 11 and the voltage sensor 12 behave as a sensor means of the present invention.

The control part 13 behaving as a control means of the present invention is comprised of CPU, executes calculating processes necessary for calculation of internal impedances at a predetermined timing as described later along with controlling operation of the whole power supply system, and transmits the obtained internal impedances to control equipments and so on in vehicle. Here, the storage part 14 hooked up with the control part 13 comprises ROMs storing such program as a control program, RAMs temporarily storing data necessary for the processes executed by the control part 13, and so on.

The charge circuit 15 is a circuit to control supplying with charge currents in charge of the secondary battery 10. And the discharge circuit 16 is a circuit to control supplying with discharge currents flowing from secondary battery 10 to the load 20 in discharge of the secondary battery 10. Both of the charge circuit 15 and the discharge circuit 16 is controlled by the control part 15, the charge circuit is in an on state during operation of charge, and the discharge circuit is in an on state during operation of discharge.

In the present embodiment, various waveforms are applicable to both of charge currents output from the charge circuit 15 and discharge currents supplied the load 20 with through the discharge circuit 16. Therefore, as not Fourier expansion but Fourier transformation is applied in the below calculating processes, it is possible to execute Fourier transformation with use of non-cyclic and various waveforms without limitation of pulse waveforms with a specified frequency. However, in order to raise the precision of Fourier transformation of discharge currents or charge currents, it is desirable to use a waveform pattern comprising sufficiently a desired frequency component. In the below example, the desired frequency is set to around 20 kHz, and therefore, it is possible to raise the precision due to using the charge currents or discharge current whose waveforms have quick temporal changes.

Next, in the power supply system according to the present embodiment, there is specifically described the process for measuring the internal impedance of the secondary battery. FIG. 2-3 is a flow chart showing the process executed mainly by the control part 13 based upon the control program stored in the storage part 14. The calculating process as shown in FIG. 2-3 starts to be executed at a specified timing during charge or discharge of the secondary battery 10 in the power supply system.

In FIG. 2-3, after the process in the power supply system starts, parameters necessary for calculation executed by the control part 13 are set to the defaults (Step S101). The sampling interval $\Delta t$ and the sampling data number N in the measurement for obtained plural of measuring current values and measuring voltage values, the specified frequency F and so on are mentioned as a parameter set to a default.

In Step S101, such as $\Delta t = 0.001$ sec, N=100 pcs, F=20 Hz may be employed as the defaults. And here, it is possible to fixedly predetermine appropriate defaults depending on the characteristics of the secondary battery 10, and also to allow appropriately changing the defaults depending on the state.

Next, whether the secondary battery 10 is charged or discharged, or not, is checked (Step S102). Whether the measurement is executed during charging or discharging, is determined depending on the power supply system. When the power supply system constantly supplies loads with certain degree or more of electric power during use of equipments or apparatuses, it is almost always desirable to execute the measurement during charging. Furthermore, the timings of charge and discharge are predetermined in some power supply system. In the case, whether the system gets to the timing of charge or discharge is checked in Step S102.

When it is identified that charge or discharge is ongoing, input currents and responsive voltages of the secondary battery 10 start to be measured following Step S102 (Step S103), and are measured under the condition set in Step S101 (Step S104). Specifically, the input currents of the secondary battery 10 are detected by the current sensor 11, and N pcs of the current measuring values are sequentially obtained at the sampling interval of Δt, and the responsive voltages of the secondary battery 10 are detected by the voltage sensor 12, and N pcs of the voltage measuring values are sequentially obtained at the sampling interval of Δt at the same time as the current measurement.

Next, a magnitude of the input currents at the specified frequency F is calculated from the N pcs current measuring values obtained in Step S104 (Step S105). Similarly, a magnitude of the responsive voltages at the specified frequency F is calculated from the N pcs voltage measuring values obtained in Step S104 (Step S106).

Here, when time functions of input currents and responsive voltages are expressed respectively as i(t) and v(t), the current measuring values and the voltage measuring values obtained in Step S104 may be expressed respectively as i(n·Δt) and v(n·Δt) with use of an integer n within zero to N−1.

In general, when Fourier transformation is applied to arbitrary function y(t), a frequency component Y(ω) is obtained as expressed in the following Formula (1).

$$Y(\omega) = \int_{-\infty}^{\infty} y(t) \cdot \exp(j\omega t) dt \tag{1}$$

Here, ω=2πf (f: frequency)

Therefore, when Fourier transformation is applied to the input currents data of the secondary battery 10, a frequency component I(ω) of the input currents may be expressed as shown in the following Formula (2) with use of time function i(t).

$$I(\omega) = \int_{-\infty}^{\infty} i(t) \cdot \exp(j\omega t) dt \tag{2}$$

Here, ω=2πf (f: frequency)

When Fourier transformation is applied to the responsive voltage data of the secondary battery 10, a frequency component I(ω) of the responsive voltages may be expressed as shown in the following Formula (3) with use of time function v(t).

$$V(\omega) = \int_{-\infty}^{\infty} v(t) \cdot \exp(j\omega t) dt \tag{3}$$

And in calculation of Step S105 executed actually, the frequency component of the input currents at the specified frequency I(ω) is calculated as shown in the following Formula (4) by means of discrete Fourier transform with use of N pcs current measuring values i(n Δt) equivalent to the time function i(t).

$$I(\omega) = \Delta t \sum_{n=0}^{N-1} i(n \cdot \Delta t) \cdot \exp(j\omega \cdot n \cdot \Delta t) dt \tag{4}$$

Here, ω=2πf (f: frequency)

Similarly, in calculation of Step S106 executed actually, the frequency component of the responsive voltages at the specified frequency V(ω) is calculated as shown in the following Formula (5) by means of discrete Fourier transform with use of N pcs voltage measuring values v(n·Δt) equivalent to the time function v(t).

$$V(\omega) = \Delta t \sum_{n=0}^{N-1} v(n \cdot \Delta t) \cdot \exp(j\omega \cdot n \cdot \Delta t) dt \tag{5}$$

Here, ω=2πf (f: frequency)

And the internal impedance of the secondary battery 10 at the specified frequency F is calculated based upon the above calculating result in Formula (4) and (5) (Step S107). That is, the internal impedance is a ratio of the frequency component of input currents I(ω) and the frequency component of responsive voltage V(ω), and there the internal impedances at the specified frequency are calculated with use of the following Formula (6).

$$Z(\omega) = \frac{V(\omega)}{I(\omega)} \tag{6}$$
$$= \frac{\Delta t \sum_{n=0}^{N-1} v(n \cdot \Delta t) \cdot \exp(j\omega \cdot n \cdot \Delta t) dt}{\Delta t \sum_{n=0}^{N-1} i(n \cdot \Delta t) \cdot \exp(j\omega \cdot n \cdot \Delta t) dt}$$

Here, ω=2πf (f: frequency)

And now, as the internal impedances Z(ω) calculated in Formula (6), real parts of Z(ω) may be output, and moreover imaginary parts or absolute values of Z(ω) may be also output.

Furthermore, as the internal impedances Z(ω) calculated in Formula (6), an impedance value at only one frequency F, for example F=20 Hz, may be output, and moreover, respective impedance values at plural frequencies may be also output. That is, M pcs frequencies of F1 to FM are predetermined, and M pcs internal impedances may be calculated with use of Formula (6).

In this case, it is possible to solve simultaneous equations comprising M pcs unknowns with use of the M pcs calculated internal impedances. For example, in the equivalent circuit of the secondary battery 10 as shown in FIG. 2-1, the simultaneous equations comprising M pcs circuit constants as an unknown are set up, and it is possible to determine the circuit constants by means of assigning the M pcs calculated internal impedances to the simultaneous equations.

The internal impedances obtained from the process as shown in FIG. 2-3 are employed to detect deterioration of the secondary battery 10 in the power supply system. In general, as the internal impedances of the secondary battery 10 have strong correlation with deterioration of the secondary battery 10, it is possible to determine deterioration level of the secondary battery 10 with use of the measurement results of the internal impedances.

Figures 1, 2, 3, 4:
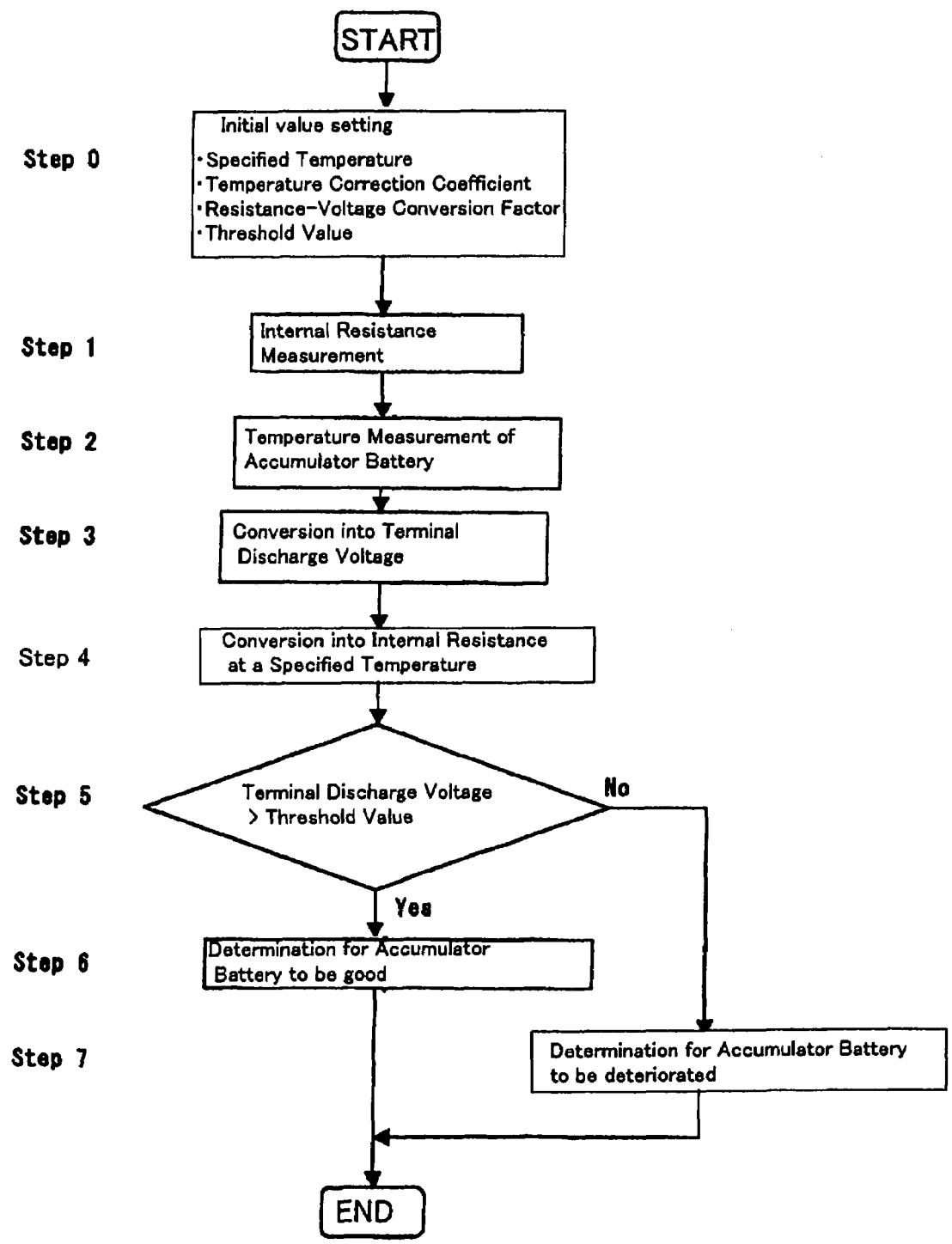

FIG. 2-4 shows the relation between the internal impedances and deterioration in a secondary battery. FIG. 2-4 shows respectively the change of the internal impedance of the secondary battery 10 and the change of the discharge voltages of the secondary battery 10 in a long term deterioration test for the secondary battery 10. In the test as shown in FIG. 2-4, the internal impedance was measured at a temperature of 25 degree C., and the discharge voltages were measured to two input current values of 10 A and 25 A at a temperature of −30 degree C. and at ten seconds after start of discharge.

As shown in FIG. 2-4, the internal impedance of the secondary battery 10 is stable in early phase, and however starts to increase at the time of around 30 to 35 weeks. Meanwhile, the discharge voltage of the secondary battery 10 starts to decrease rapidly at the time of around 35 weeks, and it shows that deterioration develops rapidly. Furthermore, deterioration level in the case of larger input current is more than that in the smaller input current. This test results indicate that the secondary battery 10 reaches the life end point at the time of around 35 to 40 weeks.

Based upon the change of deterioration as shown in FIG. 2-4, it is possible to grasp deterioration of secondary battery by means of monitoring increase of the internal impedance calculated as mentioned above. For example, it may be possible to decide the secondary battery 10 is deteriorated when the calculated internal impedance is larger than a predetermined value, and to display it in order for users to prompt replacement of the secondary battery 10.

As described above, according to the present invention, as charge currents output from the charge circuit 15 or discharge currents output from the discharge circuit 16 is utilized directly for the internal impedance measurement of the secondary battery 10, special current sources or some processes along with moving controls get unnecessary, and therefore it is possible to accomplish simplicity of the construction an the controls of the whole power supply system and moreover reduction of the manufacturing cost along with the simplicity.

In this case, as Fourier transformation is applied to calculation of internal impedance, charge currents or discharge currents needs not to have a cyclic pulse waveform, thereby the measurement gets a lot of flexibility, and any additional circuits aren't necessary. In addition, as the internal impedance is measured during ordinary charge or discharge, the secondary battery 10 does not need to be repeatedly applied currents for only measurement to, and damage to the secondary battery 10 may be reduced.

According to the present invention, in the measurement of internal impedance of secondary battery, as the internal impedance at a specified frequency is calculated from input currents and responsive voltages measured during charging or discharging with use of Fourier transformation, it is unnecessary to equip with a special current sources and employ currents with cyclic wave forms. Therefore, it is possible to construct equipment for measuring internal impedance of secondary battery which has a simple construction and a reasonable cost, and enables to reduce damage to the secondary battery 10.

Furthermore, in the power supply system equipped with a function to measure internal impedances of secondary battery, two embodiments according to the present invention are described.

The First Embodiment

FIG. 3-1 is a block diagram showing the rough construction of a power supply system according to the first embodiment of the present invention. In FIG. 3-1, the power supply system comprises a secondary battery 10, a current sensor 11, a voltage sensor 12, a control part 13, a storage part 14, a charge circuit 15 and a discharge circuit 16 so that various load 20 is supplied with electric power from the secondary battery 10.

In the construction of FIG. 3-1, for example, such accumulator battery as that used for such equipments as observational equipment and communication equipment, and a lead storage battery for vehicle is known as the secondary battery 10 supplying load 20 with electric power. Here, FIG. 2-2 shows an equivalent circuit of the secondary battery. As shown in FIG. 3-2, the secondary battery 10 may be expressed with use of the equivalent circuit which has equivalent circuit for a positive electrode, a battery electrolyte, a negative electrode, connected in this order, and which has respectively expressed by combinations of resistances of RΩ, Rct1, Rct2 and Rct3, and condensers of Cd1, Cd2 and Cd3.

In this case, the internal impedances of the secondary battery 10 are expressed with use of a complex impedance consistent with the serial parallel circuit comprised of resistances and condensers as shown in FIG. 2-2. As described later, in the secondary battery 10 expressed by the equivalent circuit of FIG. 2-2, current pulses with a constant cycle is applied to the secondary battery 10 expressed by the equivalent circuit of FIG. 3-2, Fourier expansion are applied to applied currents and responsive voltages, and in the result, internal impedances of the secondary battery 10 can be calculated.

Generally, the secondary battery 10 is under a polarized state due to continuous repetition of charge and discharge. And as the internal impedances of the secondary battery 10 is subject to the polarization, it is necessary to remove the influence of the polarization in order to obtain the precise internal impedances. Discharge current pulses are applied to the secondary battery 10 under the polarized state after charge, so called charge polarization, and charge current pulses are applied to the secondary battery 10 under the polarized state after discharge, so called discharge polarization, so that it is possible to attenuate the impact of the polarization.

And now, the control part 13 has operation flags in the storage part 14, and saves the operation types with use of the operation flags when operation of charge or discharge is executed to the secondary battery 10. Thereby, in the processes executed by the control part 13, it is possible to determine whether the secondary battery 10 at that time is under the charge polarized state after charge or under the discharge polarized state after discharge by referring the operation flags.

Next, in FIG. 3-1, the current sensor 11 detects currents flowing through the secondary battery 10, and transmits the current values to the control part 13. And the voltage sensor 12 detects voltages between both of the terminals of the secondary battery 10, and transmits the voltage values to the control part 13.

The control part 13 is comprised of CPU and so on, executes calculating processes for calculation of internal impedances at a predetermined timing as described later along with controlling operation of the whole power supply system, and transmits the obtained internal impedances to control equipments and so on in vehicle. Here, the storage part 14 hooked up with the control part 13 comprises ROMs storing such program as a control program, RAMs temporarily storing data necessary for the processes executed by the control part 13, and so on.

The charge circuit 15 is a circuit to supply with charge currents at charge of the secondary battery 10. And the discharge circuit 16 is a circuit to supply with discharge currents flowing from secondary battery 10 to the load 20 at discharge of the secondary battery 10. Both of the charge circuit 15 and the discharge circuit 16 are controlled by the control part 15, the only charge circuit is in an on-state during operation of charge, and the discharge circuit is in an on-state during operation of discharge. In the first embodiment, for measurement of internal impedances of the secondary battery, the charge circuit 15 is constructed so that the circuit 15 supplies charge current pulses, and the discharge circuit 16 is constructed so that the circuit 16 supplies discharge current pulses.

FIG. 3-3 shows a specific example of waveforms of current pulses applied to the secondary battery, which are charge current pulses or discharge current pulses. The current pulses as shown in FIG. 3-3 have rectangular pulses which have a constant cycle time Tp and a constant amplitude X, and the waveform in which current value repeatedly gets zero and X alternately in every cycle is shown as a example. And now, the cycle time Tp and the amplitude X may be set respectively to the optimum values in consideration of the characteristics of the secondary battery 10 and the states of the calculating processes.

Here, the control part 13 has operation flags in the storage part 14, and saves the operation types with use of the operation flags when operation of charge or discharge is executed to the secondary battery 10. Thereby, in the processes executed by the control part 13, it is possible to determine whether the secondary battery 10 at that time is under the charge polarized state after charge or under the discharge polarized state after discharge by referring the operation flags.

Next, there is specifically described the flow of the process to measure the internal impedances of the secondary battery 10 in the power supply system according to the first embodiment. FIG. 3-4 is a flow chart showing the specific process executed mainly by the control part 13 based upon the program stored in the storage part 14. The calculating process as shown in FIG. 3-4 is executed from a predetermined time after charge or discharge is completed in the power supply system.

In FIG. 3-4, after the process starts in the power supply system, parameters necessary for calculation executed by the control part 13 are set to the default (Step S101). The parameters set to a defaults comprise the sampling interval ts, the fundamental frequency f1 in the pulses applied to secondary batteries, the pre-measurement pulse cycle number C1, which is a cycle number of the pulses applied to the secondary battery before start of internal impedance measurement, the measurement pulse cycle number C2, which is a cycle number of the pulses applied to the secondary battery during the internal impedance measurement, the data number a, which is a number of data obtained continuously in the current and voltage measurement, the current pulse amplitude value X and so on.

In Step S101, example of the defaults is ts=0.001 sec, f1=20 Hz, C1=10, C2=5 and $\alpha$=5. Or, it may be possible to predetermine fixed defaults appropriate depending on the characteristics of the secondary battery 10, or to appropriately change the defaults depending on the state of operation.

Next, the last operation is identified whether charge or discharge (Step S102). Here, the control part 13 may identify whether the last operation is charge or discharge due to the state of the flag read out from the storage part 14. In the result, when it is identified that the flag shows a charge operation in Step S102, discharge pulse currents are selected as an applied current in order to attenuate the effect of charge polarization (Step S103). Meanwhile, when it is identified that the flag shows a discharge operation in Step S102, charge pulse currents are selected as an applied current in order to attenuate the effect of discharge polarization (Step S104).

Next, either discharge pulse currents selected in Step S103 or charge pulse currents selected in Step S104 start to be applied to the secondary battery (Step S105). Here, in the case that the secondary battery is charged in the last operation, discharge pulse currents is applied to the secondary battery 10 by the discharge circuit 16, and meanwhile, in the case that the secondary battery is discharged in the last operation, charge pulse currents is applied to the secondary battery 10 by the charge circuit 15.

Next, before the internal impedance of the secondary battery is calculated, it is determined whether the measurement can start to be executed at the predetermined timing of start of measurement (Step S106). In the result, when the time comes to the predetermined timing of start of measurement (Step S106: YES), Step S107 is executed, and when the time does not come to the predetermined timing of start of measurement (Step S106: NO), the execution of Step S107 postpones to the predetermined timing of start of measurement. The pre-measurement pulse cycle number C1 is used as a timing of start of measurement in Step S106

When Step S107 starts to be executed, the counter m, which counts up the number of times of calculating internal impedance, is set to 1. As described later, the counter m is used in order to obtain C2 pcs measurement results by means of increasing the m by 1 each time the process for calculating the internal impedance is finished.

Figures 1, 2, 3, 4, 5:
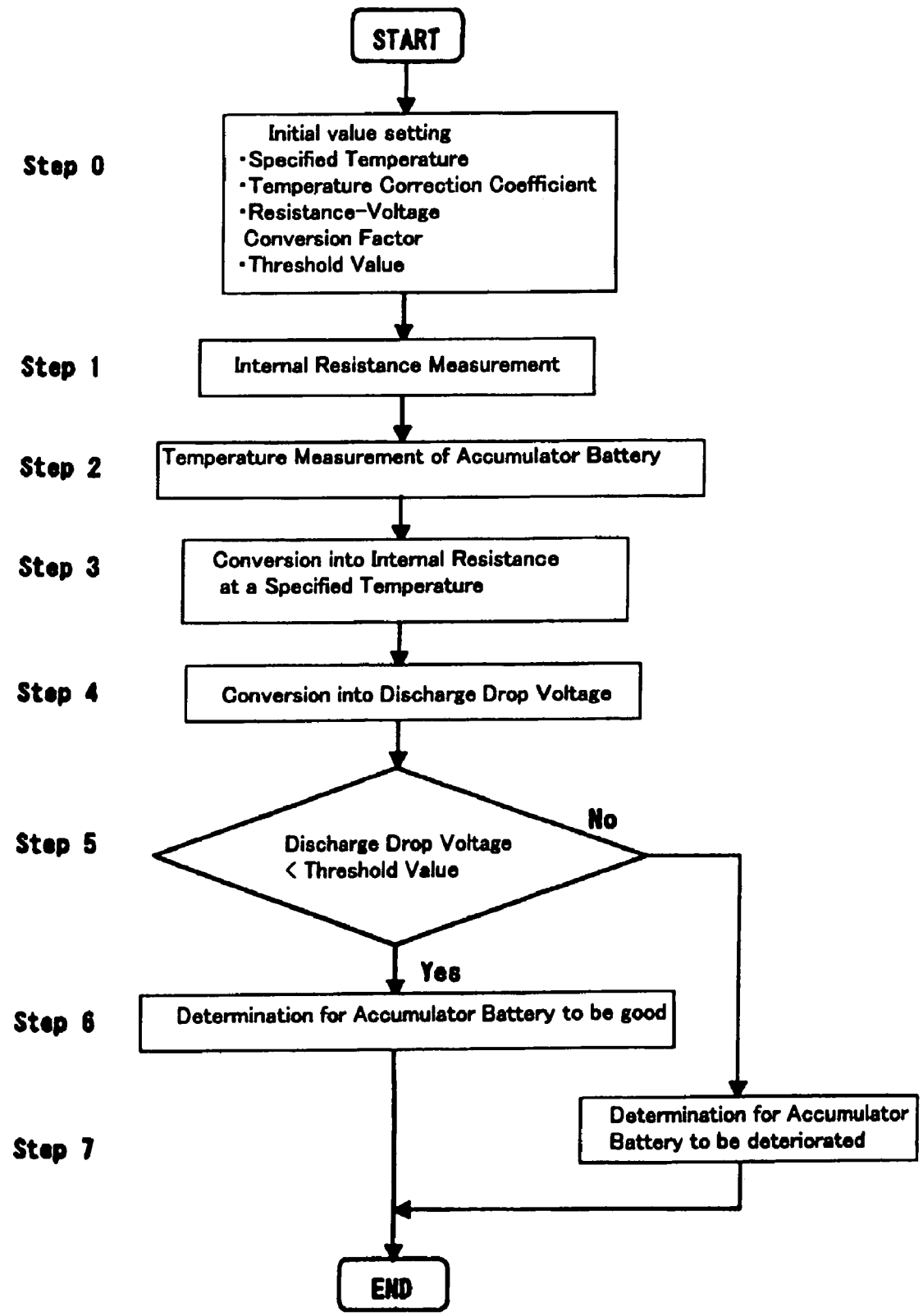
Figures 1, 2, 3, 4, 5, 6:
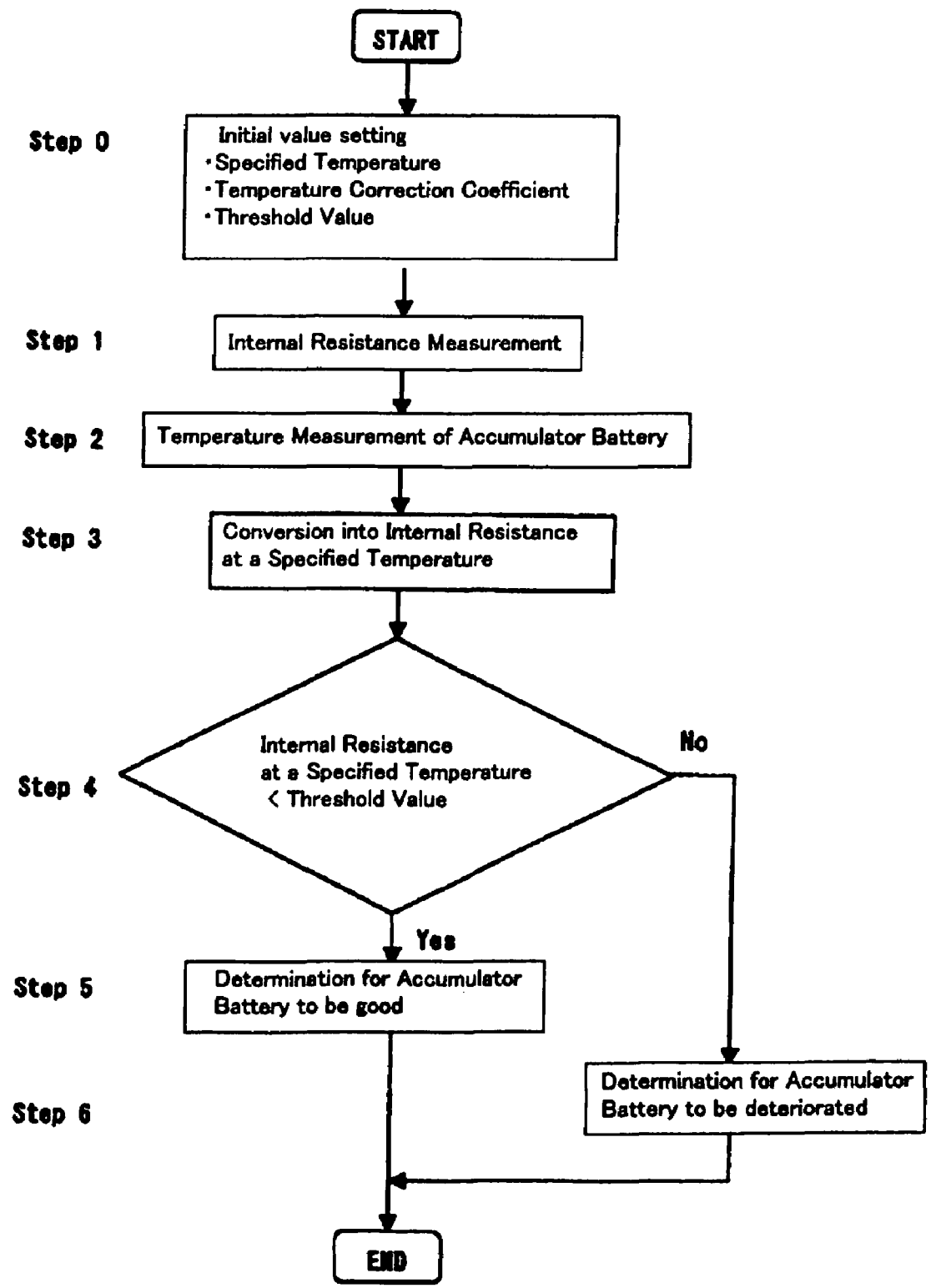
Figures 1, 2, 3, 4, 5, 6, 7, 8:
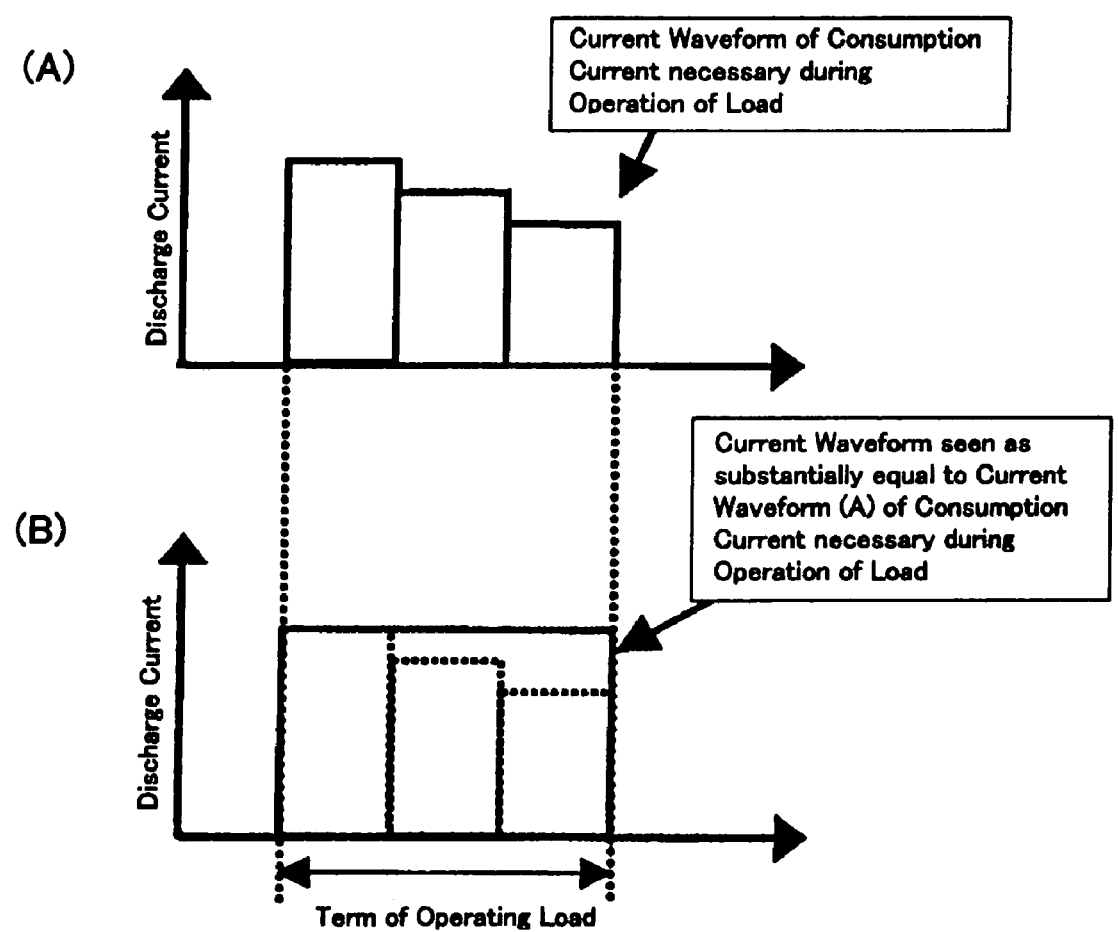
Figures 1, 2, 3, 4, 5, 6, 7, 8, 9:
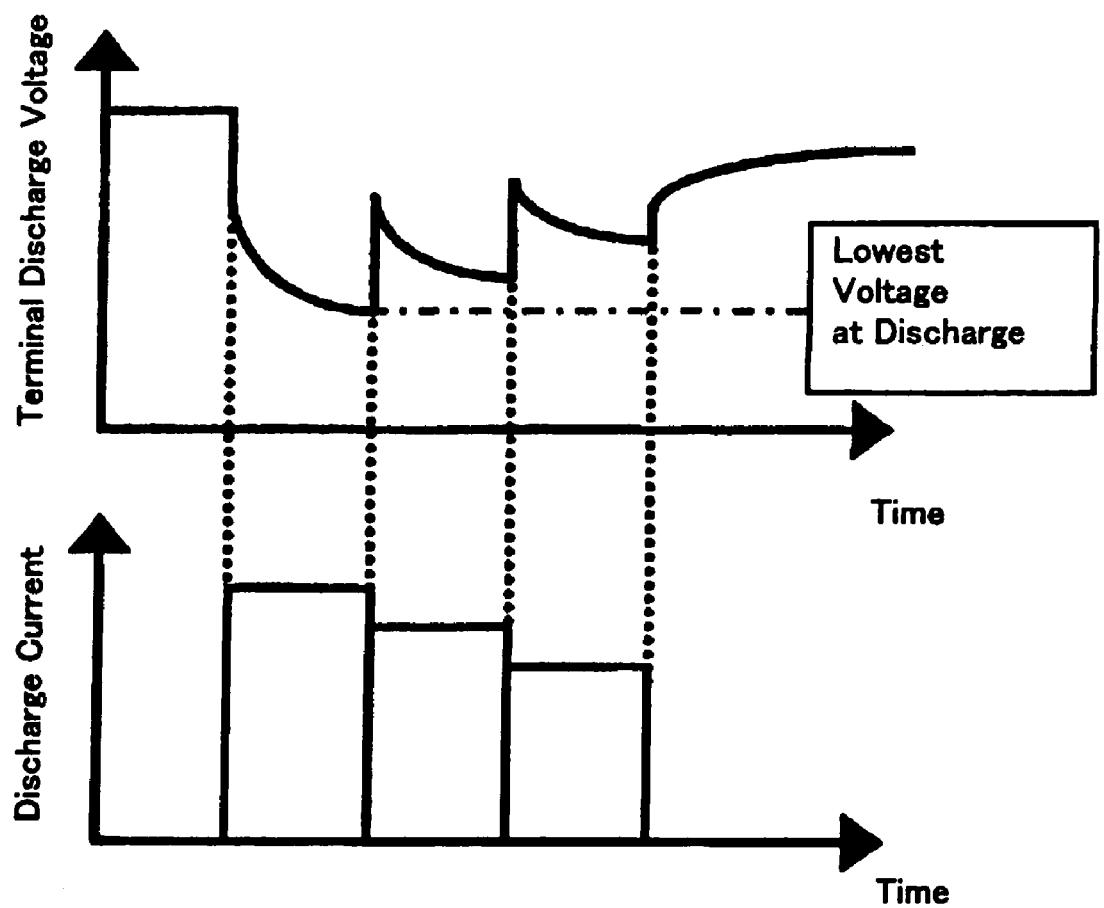
Figures 1, 2, 3, 4, 5, 6, 7, 8, 9, 10:
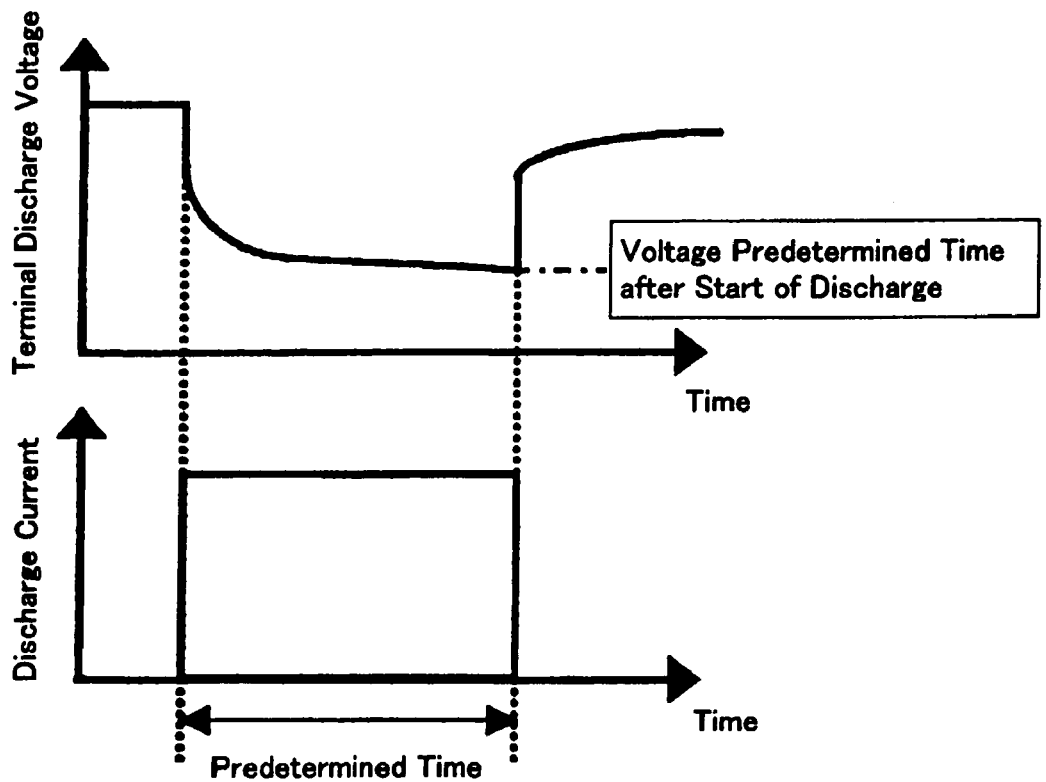
Figures 1, 2, 3, 4, 5, 6, 7, 8, 9, 10, 11:
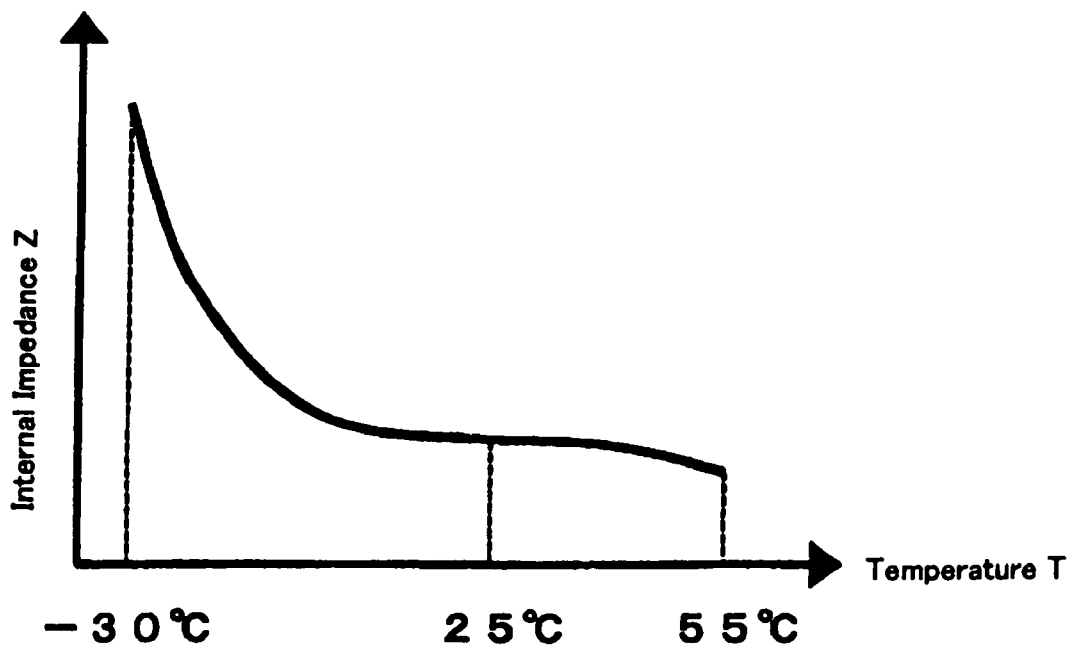
Figures 1, 2, 3, 4, 5, 6, 7, 8, 9, 10, 11, 12:
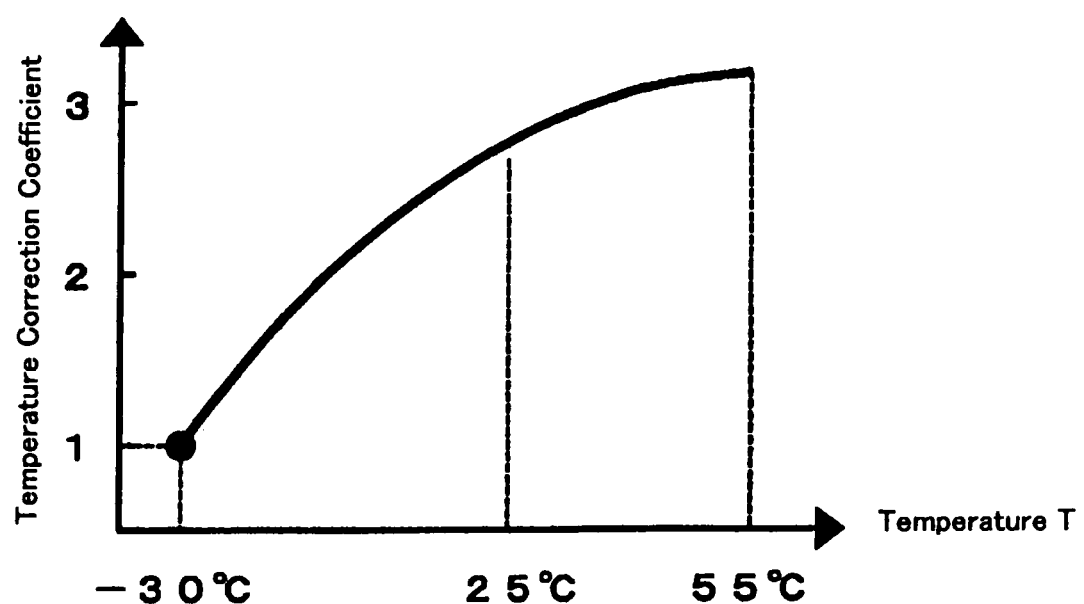
Figures 1, 2, 3, 4, 5, 6, 7, 8, 9, 10, 11, 12, 13:
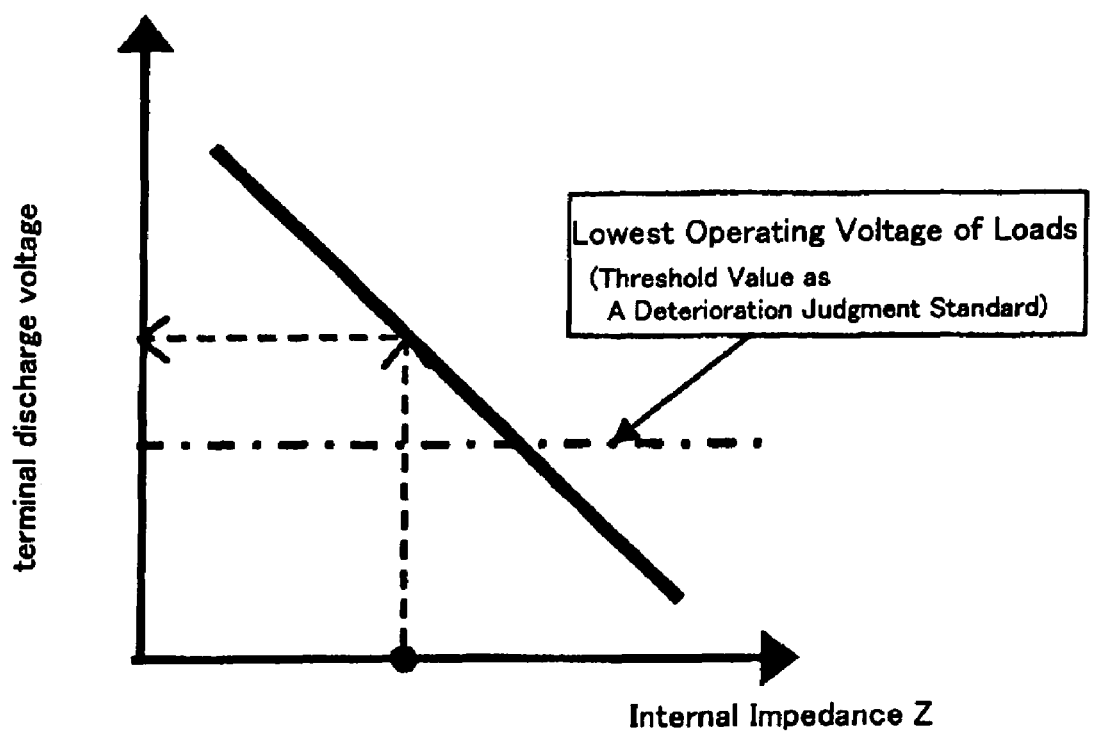
Figures 1, 2, 3, 4, 5, 6, 7, 8, 9, 10, 11, 12, 13, 14:
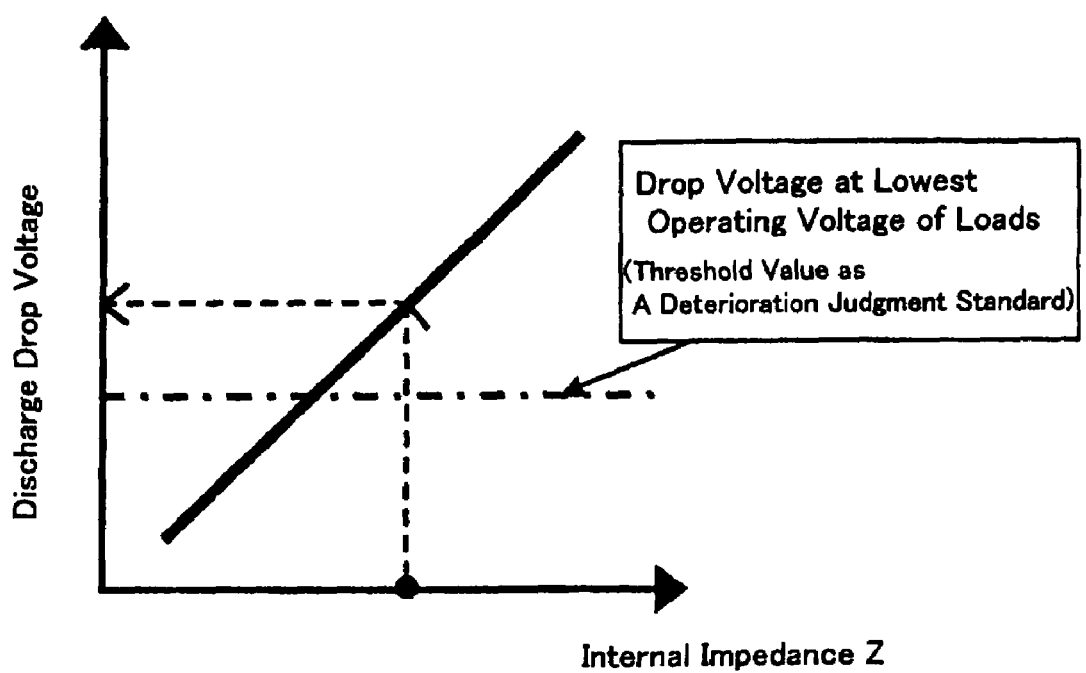
Figures 1, 2, 3, 4, 5, 6, 7, 8, 9, 10, 11, 12, 13, 14, 15:
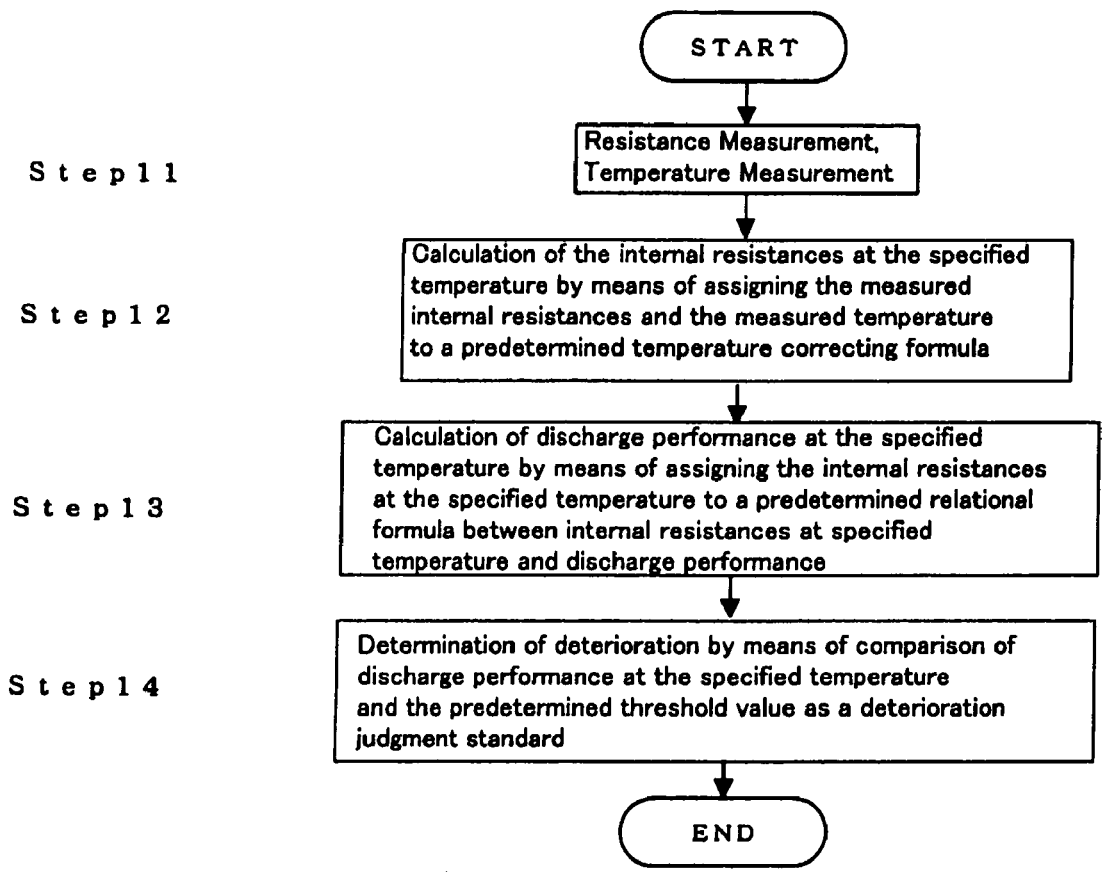
Figures 1, 2, 3, 4, 5, 6, 7, 8, 9, 10, 11, 12, 13, 14, 15, 16:
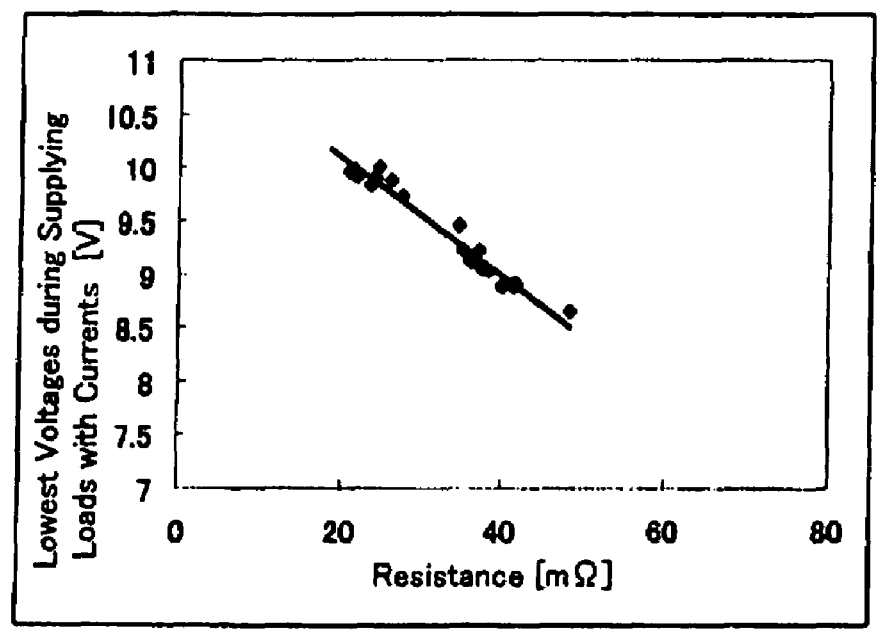
Figures 1, 2, 3, 4, 5, 6, 7, 8, 9, 10, 11, 12, 13, 14, 15, 16, 17:
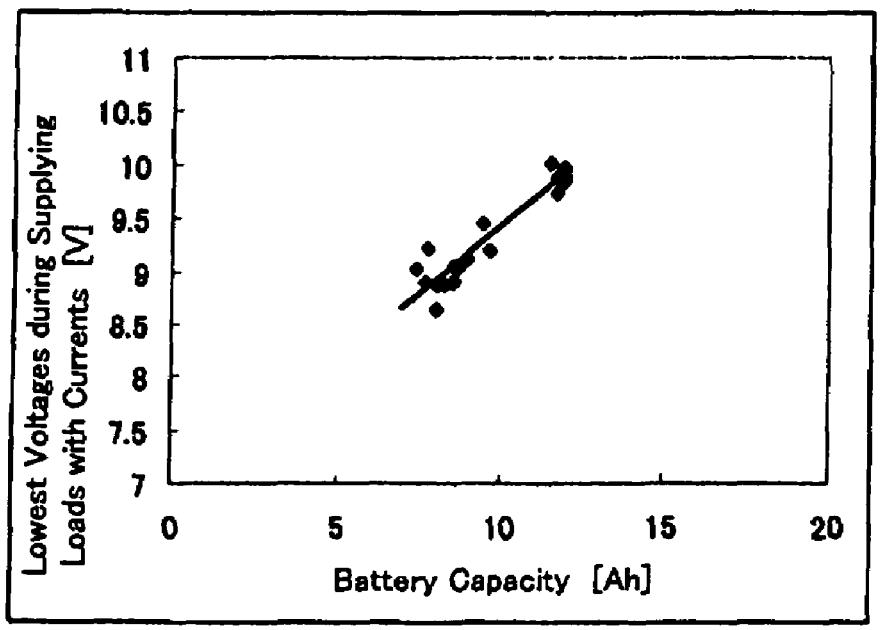
Figures 1, 2, 3, 4, 5, 6, 7, 8, 9, 10, 11, 12, 13, 14, 15, 16, 17, 18:
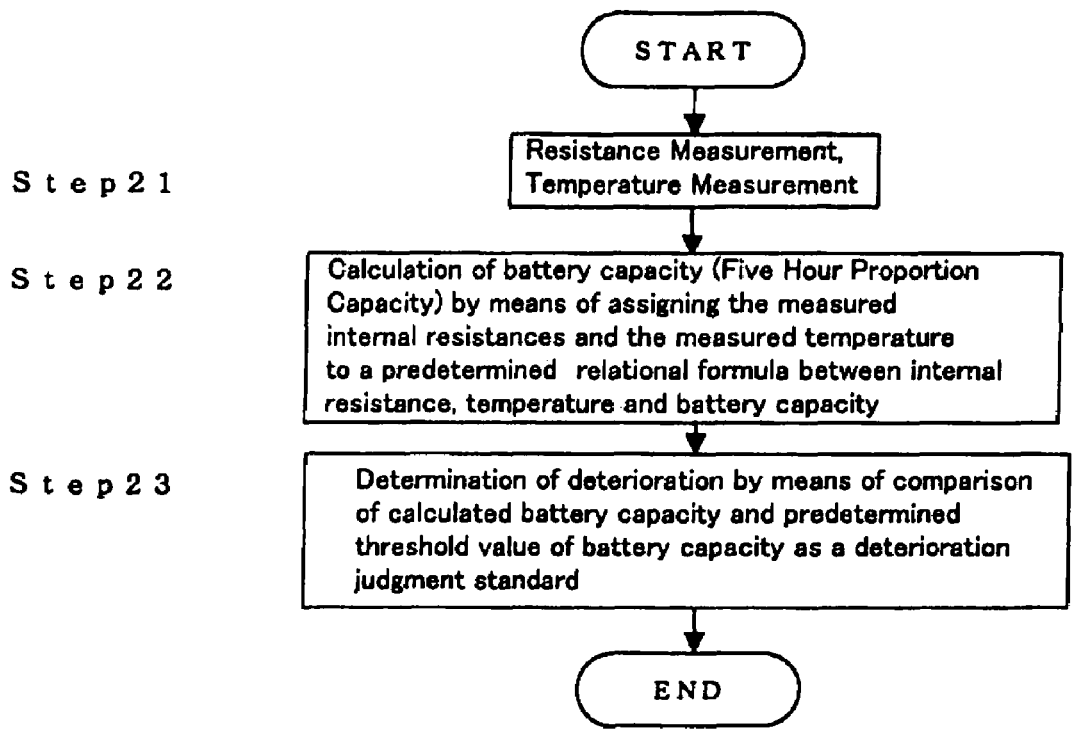
Figures 1, 2, 3, 4, 5, 6, 7, 8, 9, 10, 11, 12, 13, 14, 15, 16, 17, 18, 19:
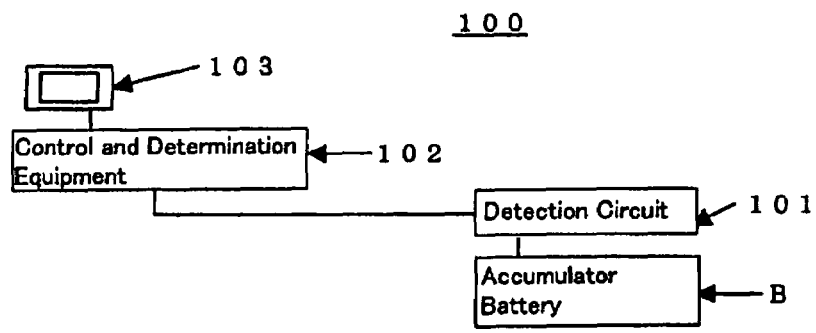
Figures 1, 2, 3, 4, 5, 6, 7, 8, 9, 10, 11, 12, 13, 14, 15, 16, 17, 18, 19, 20:
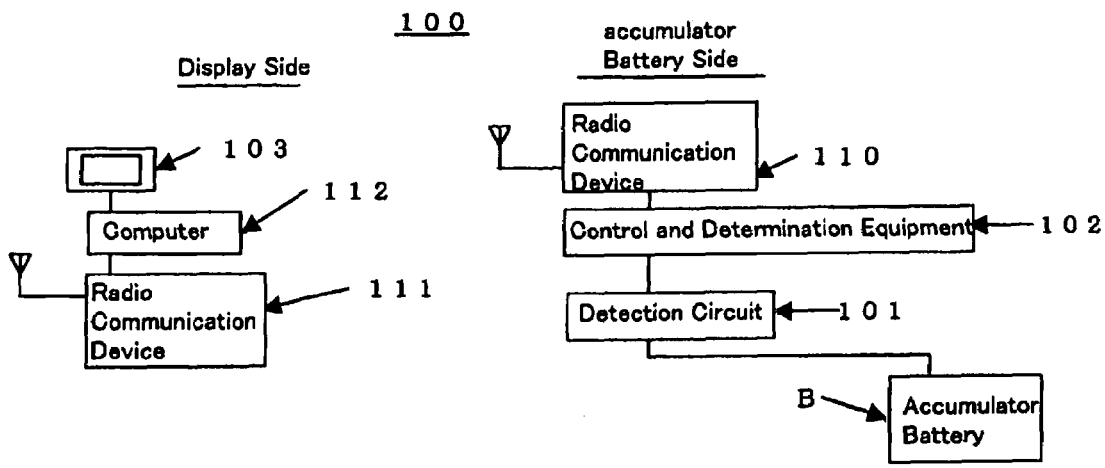
Figures 1, 2, 3, 4, 5, 6, 7, 8, 9, 10, 11, 12, 13, 14, 15, 16, 17, 18, 19, 20, 21:
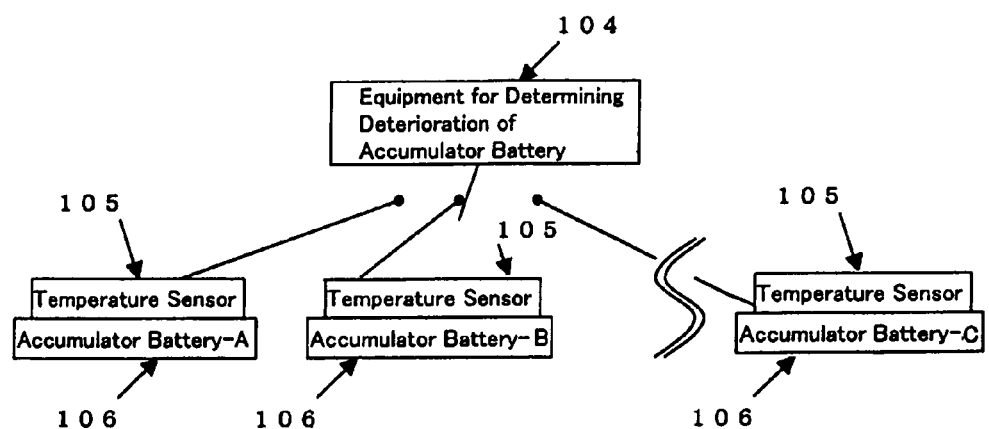
Figures 1, 2, 3, 4, 5, 6, 7, 8, 9, 10, 11, 12, 13, 14, 15, 16, 17, 18, 19, 20, 21, 22:
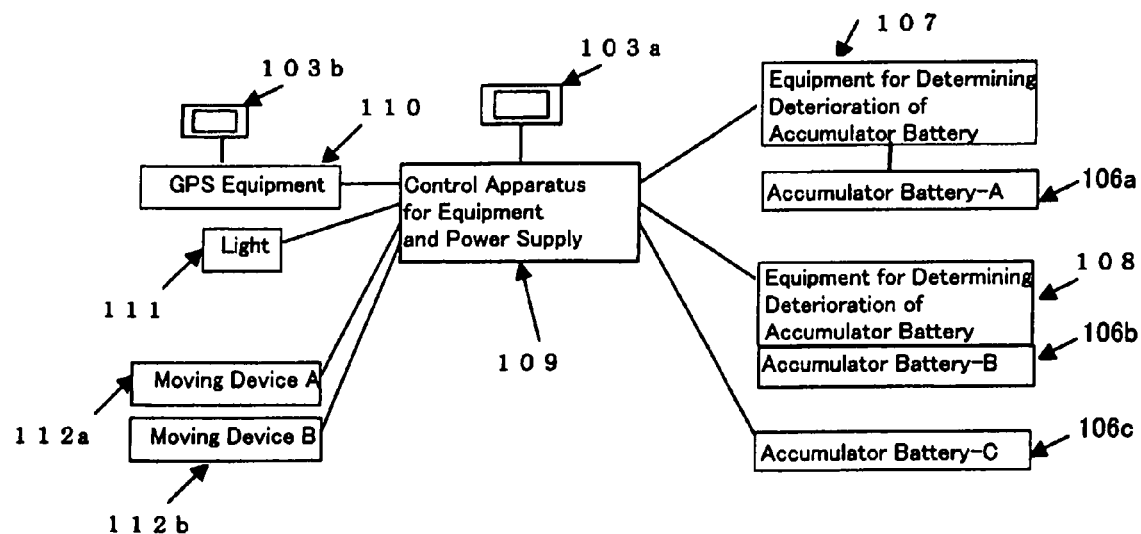
Figures 1, 2, 3, 4, 5, 6, 7, 8, 9, 10, 11, 12, 13, 14, 15, 16, 17, 18, 19, 20, 21, 22, 23:
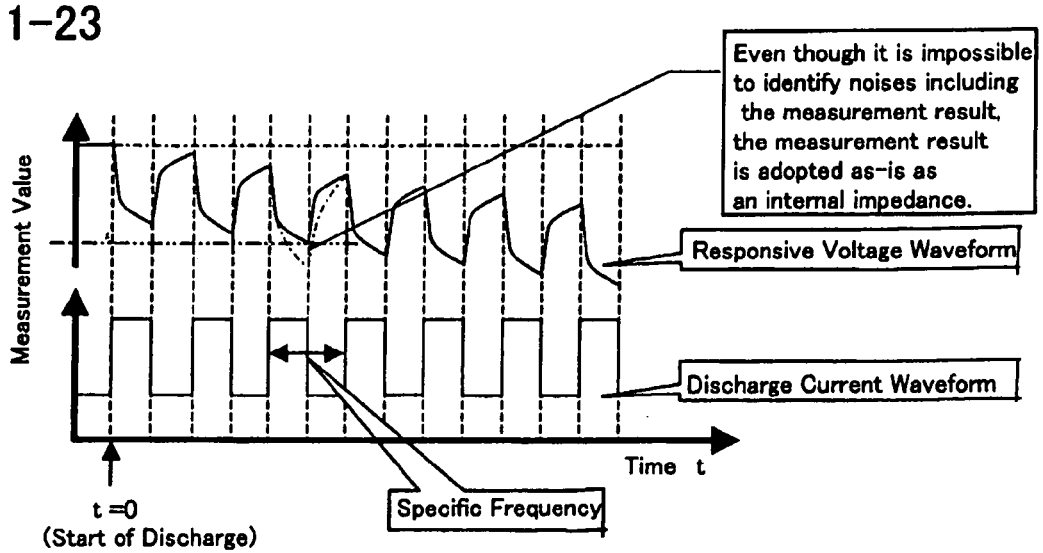
Figures 1, 2, 3, 4, 5, 6, 7, 8, 9, 10, 11, 12, 13, 14, 15, 16, 17, 18, 19, 20, 21, 22, 23, 24:
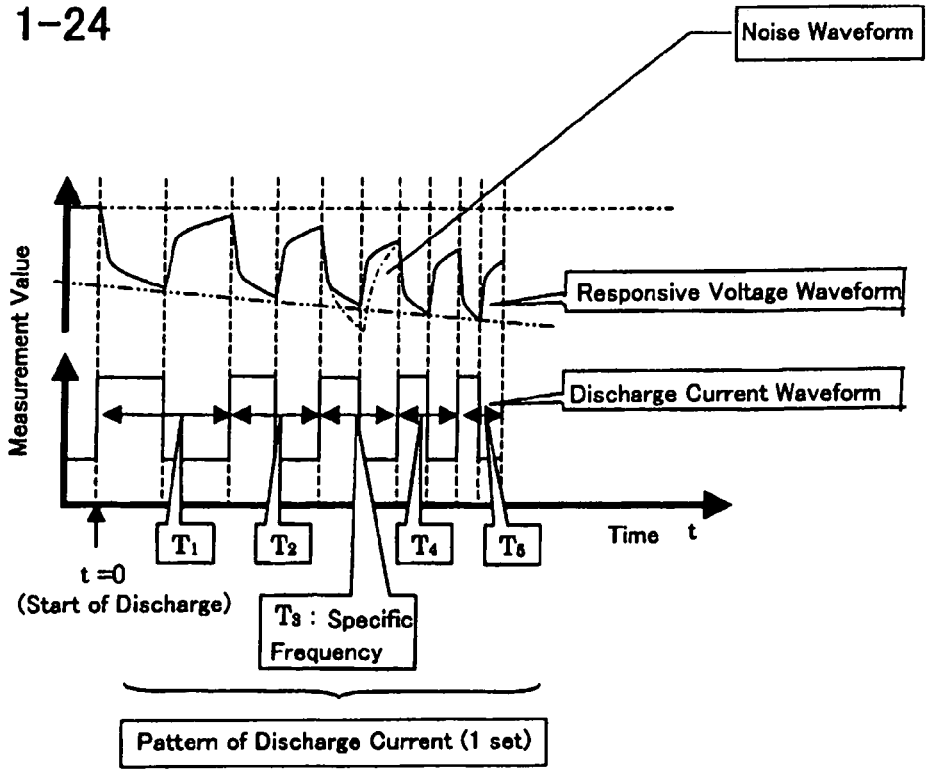
Figures 1, 2:
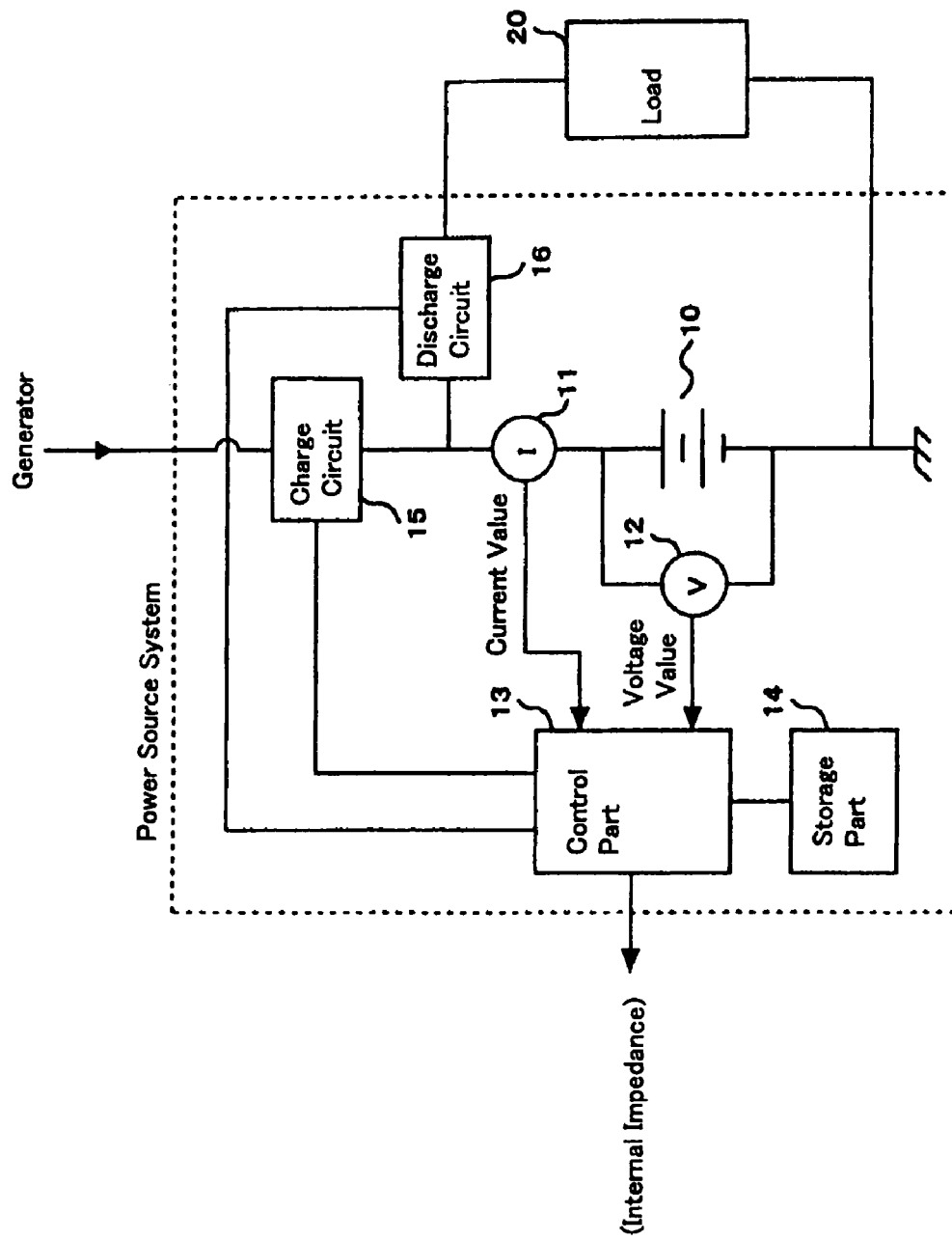
Figure 2:
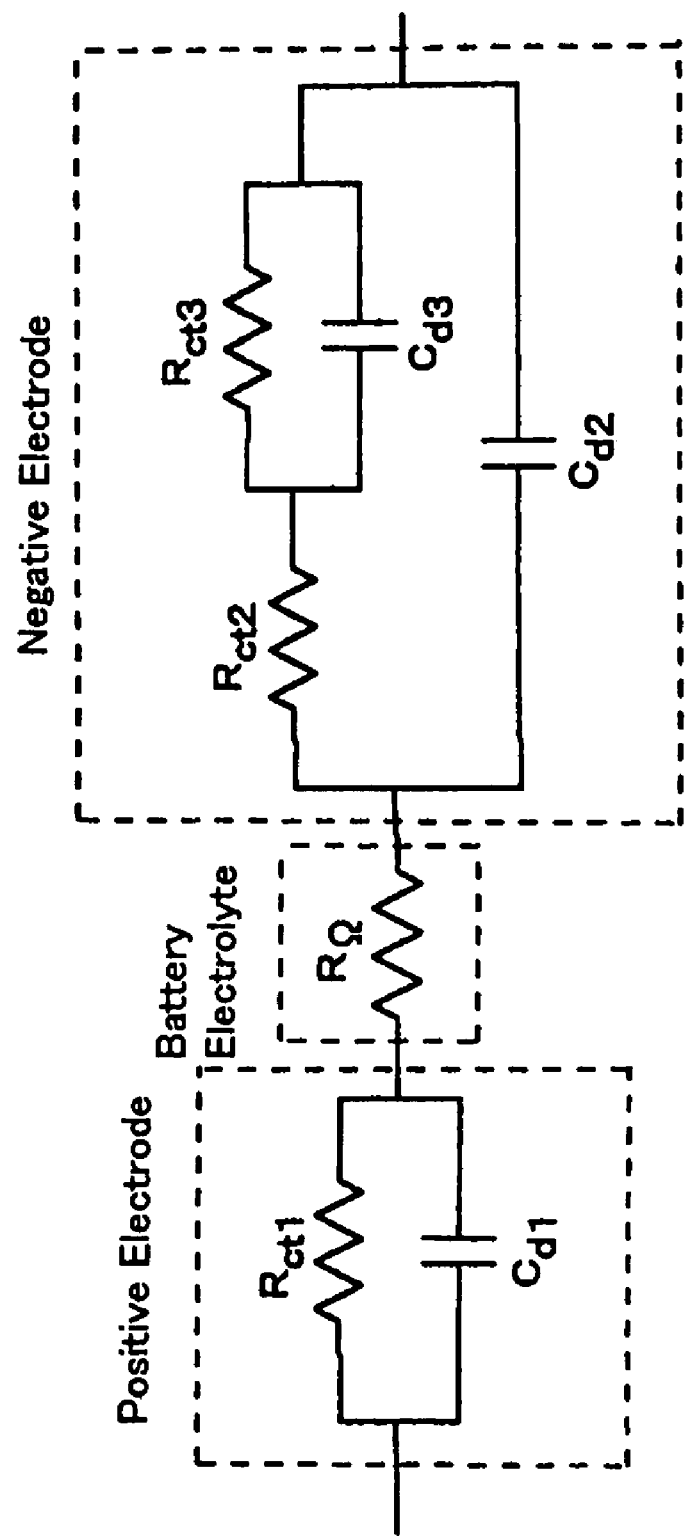
Figures 2, 3:
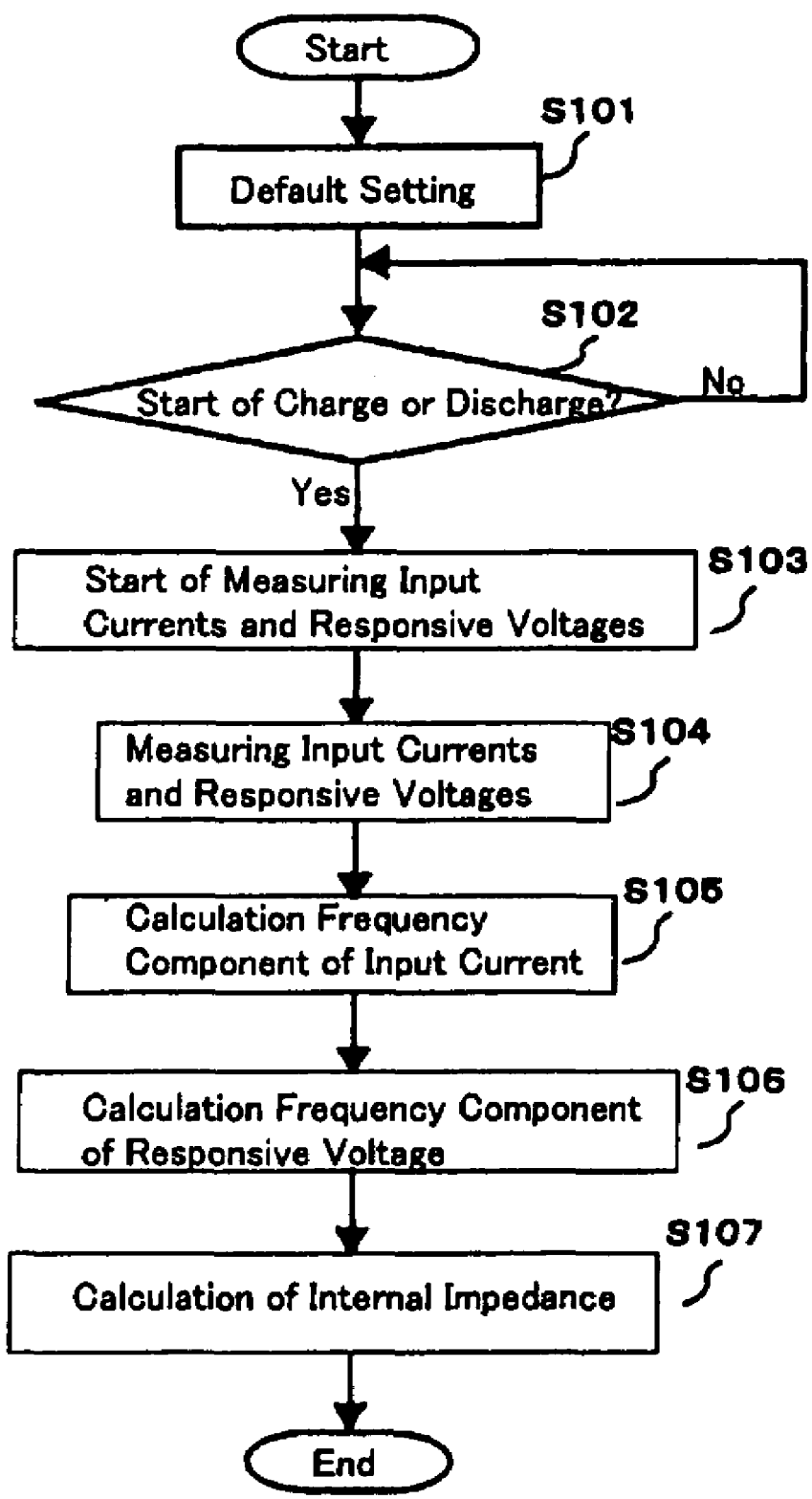
Figures 2, 3, 4:
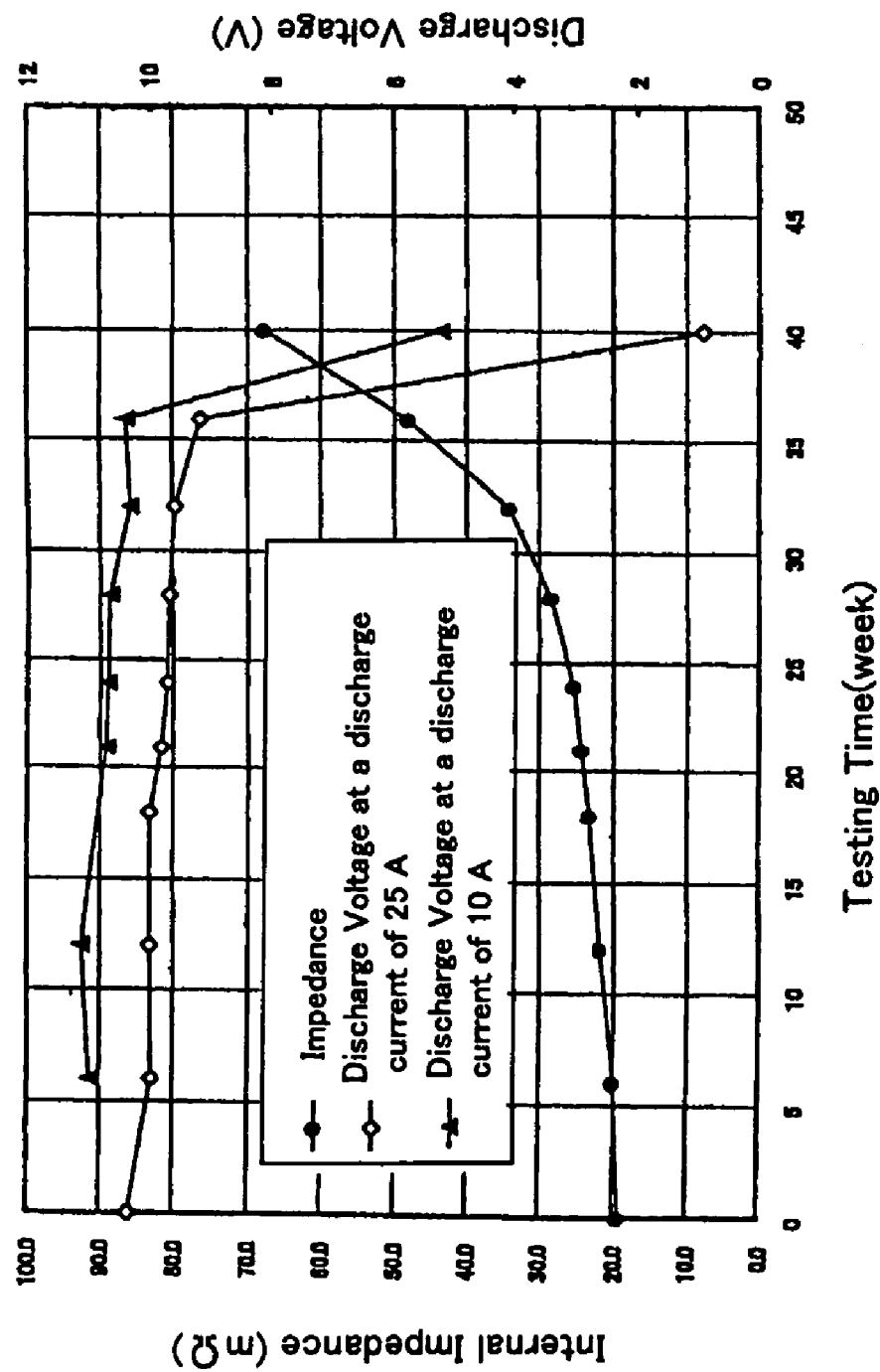
Figures 1, 3:
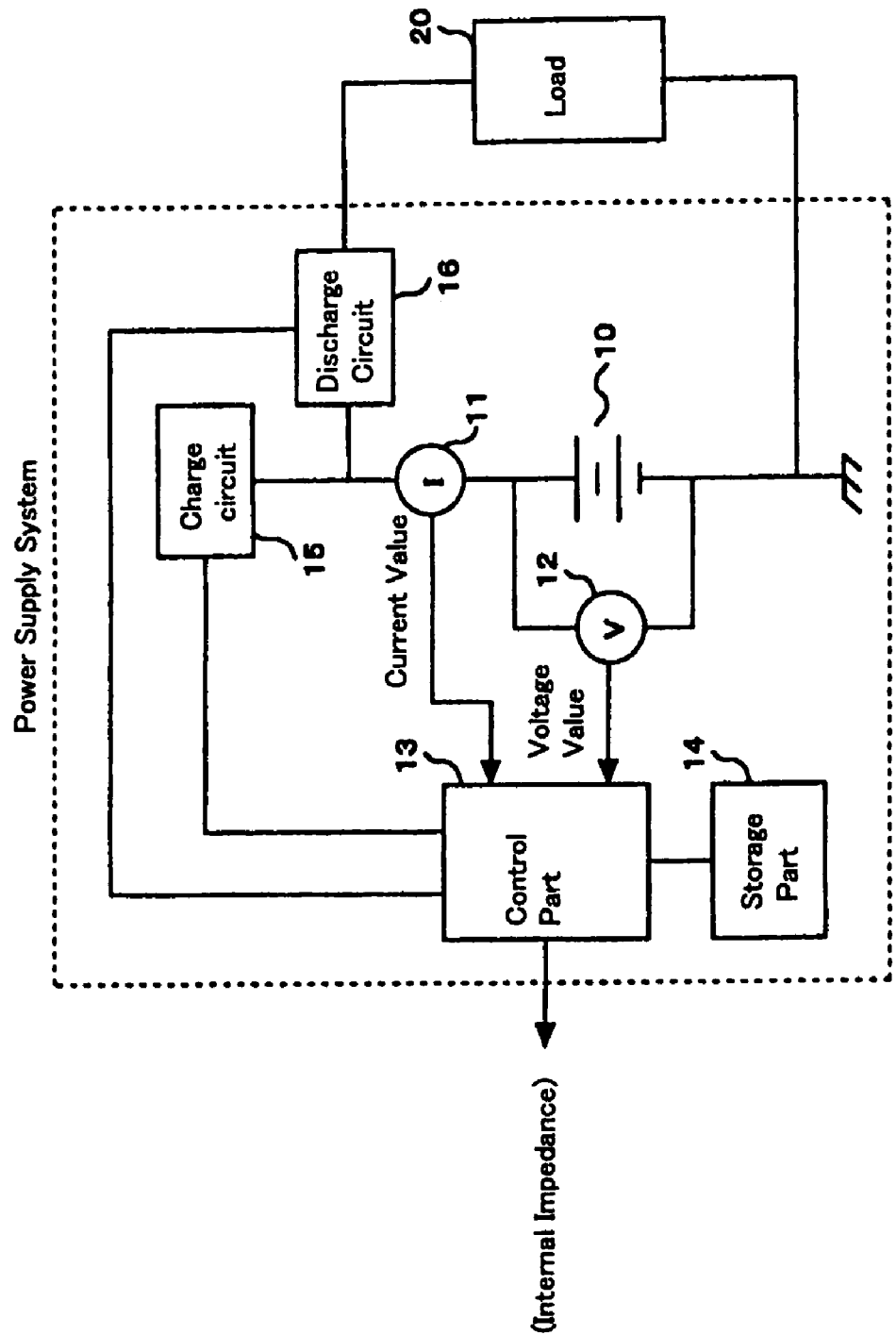
Figures 2, 3:
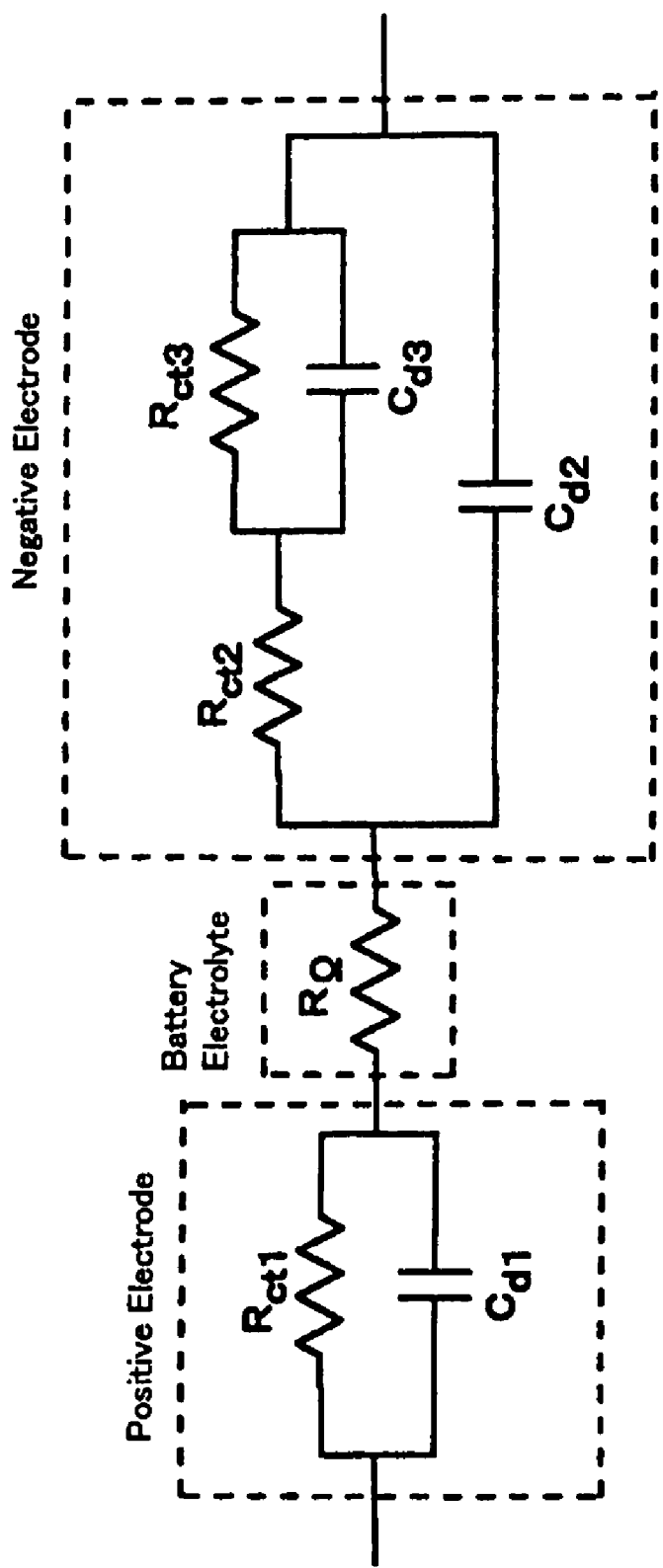
Figure 3:
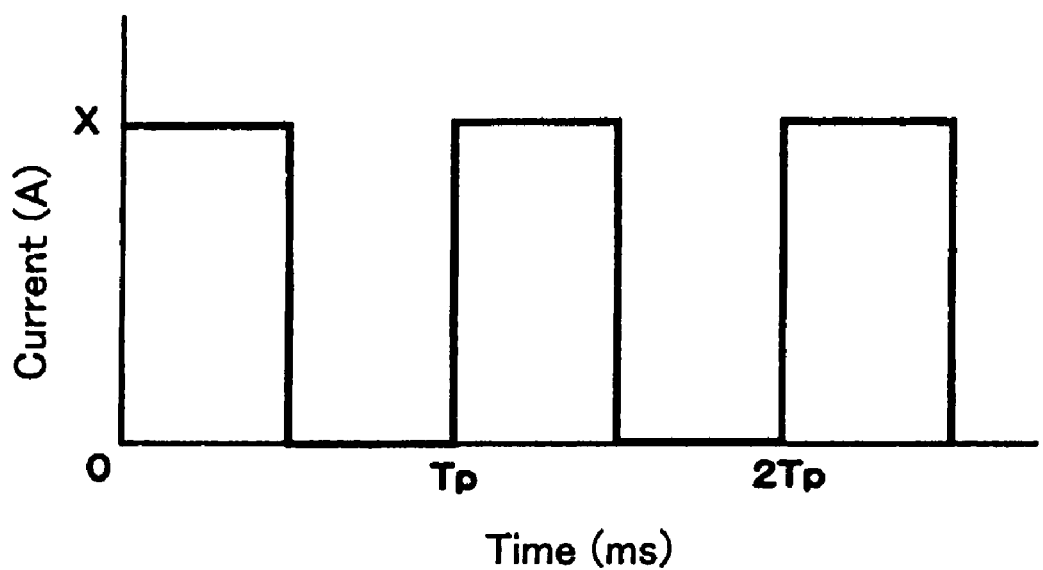
Figures 3, 4:
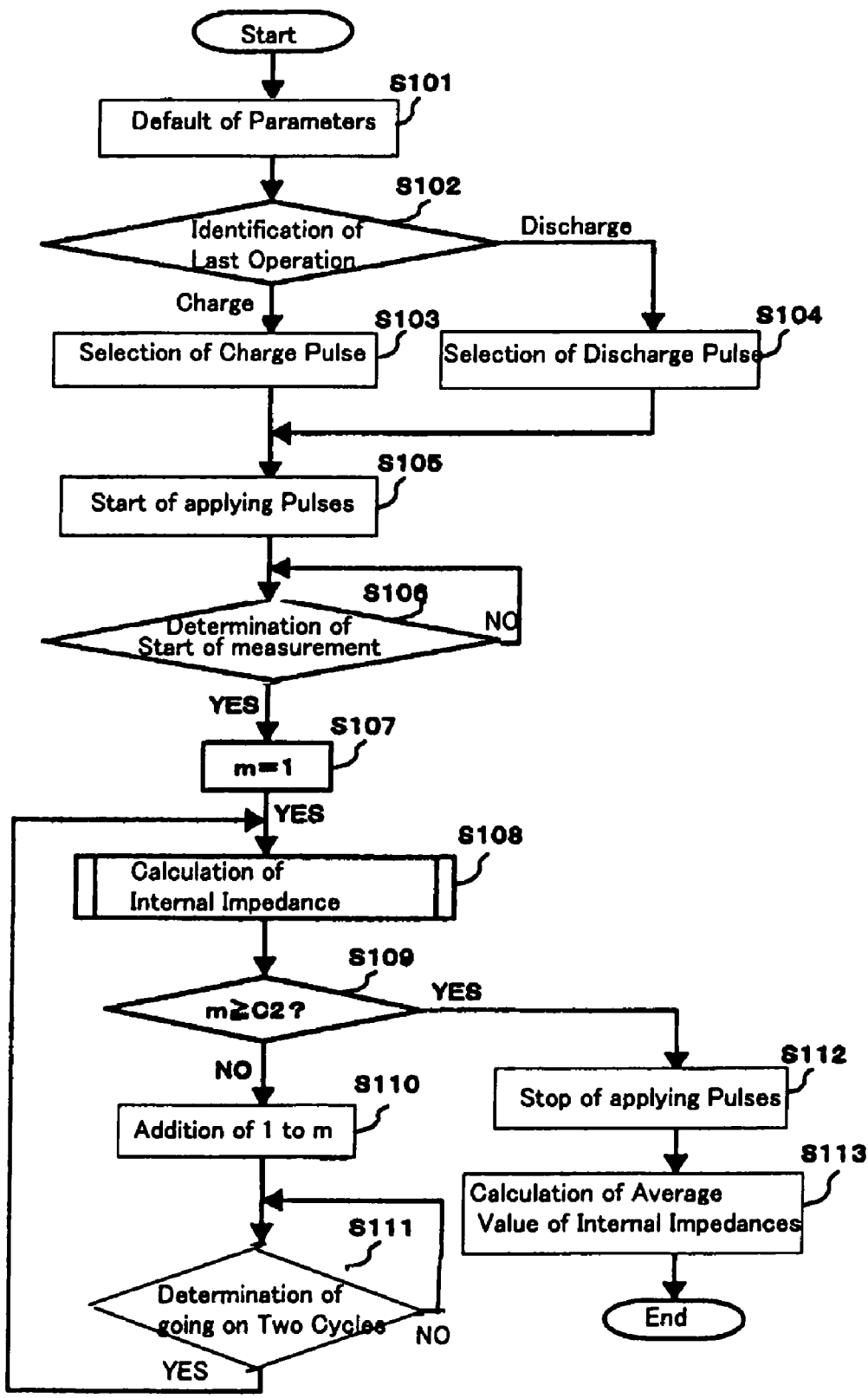
Figures 3, 4, 5:
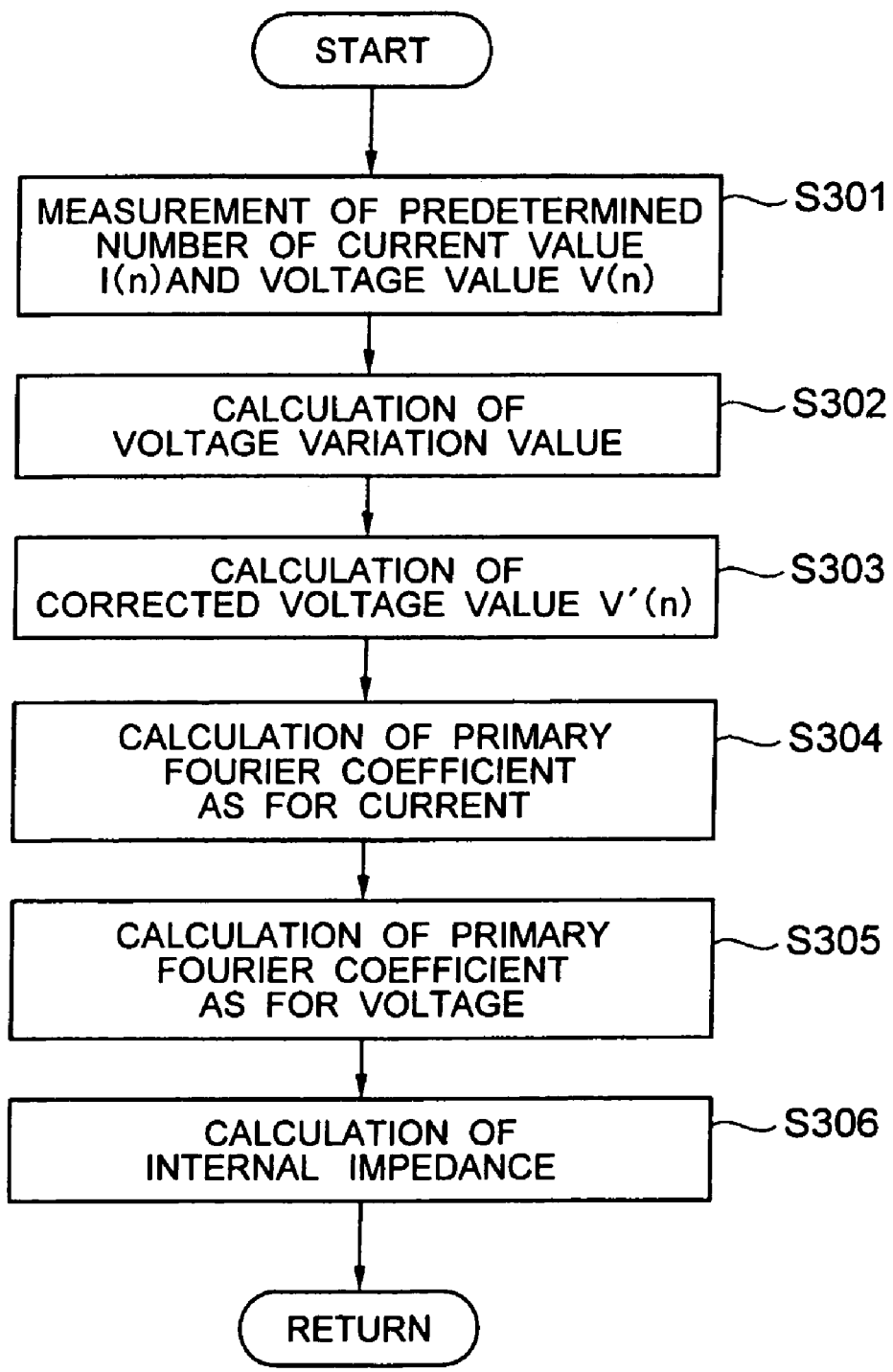
Figures 3, 4, 5, 6:
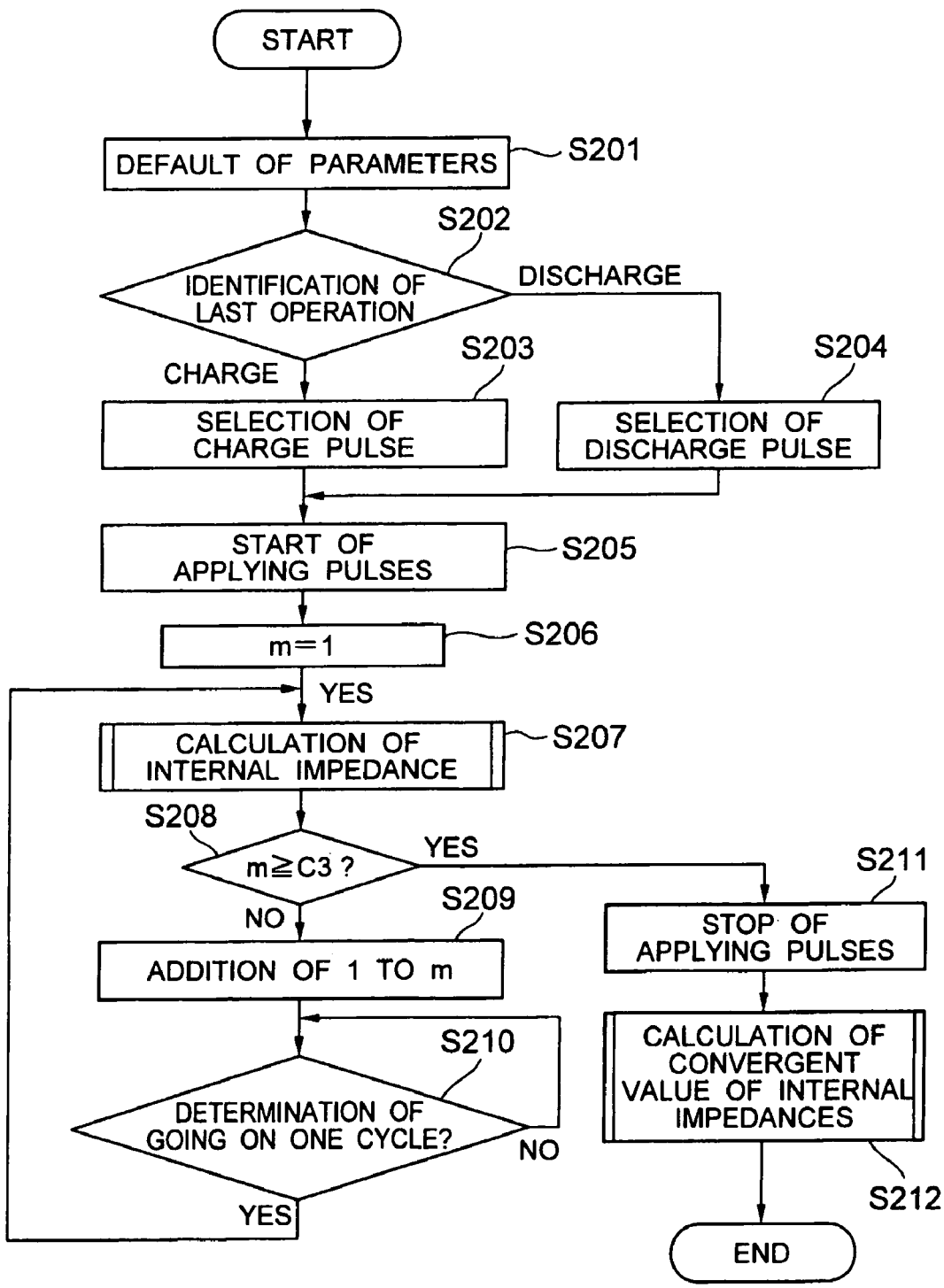
Figures 3, 4, 5, 6, 7:
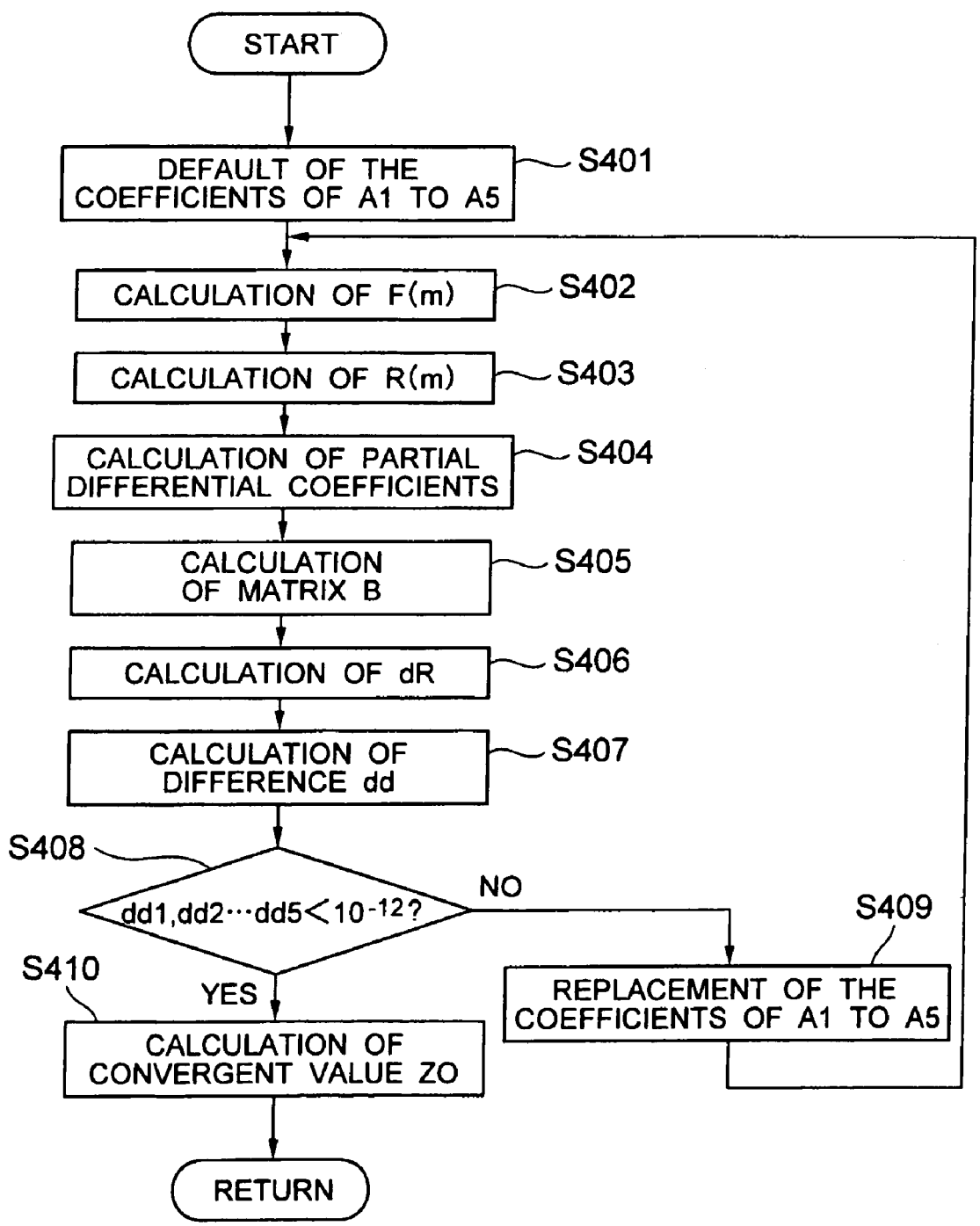
Figures 3, 4, 5, 6, 7, 8:
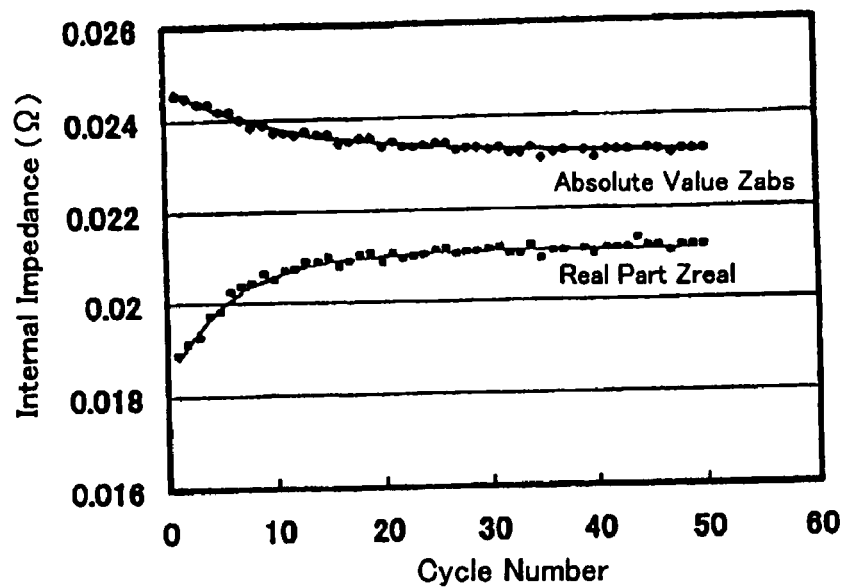
Figures 3, 4, 5, 6, 7, 8, 9:
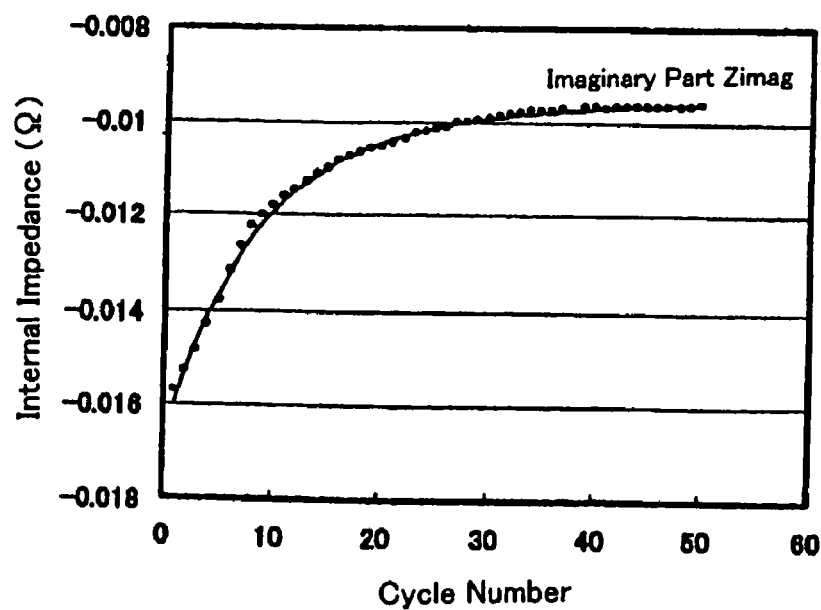
Figures 1, 4:
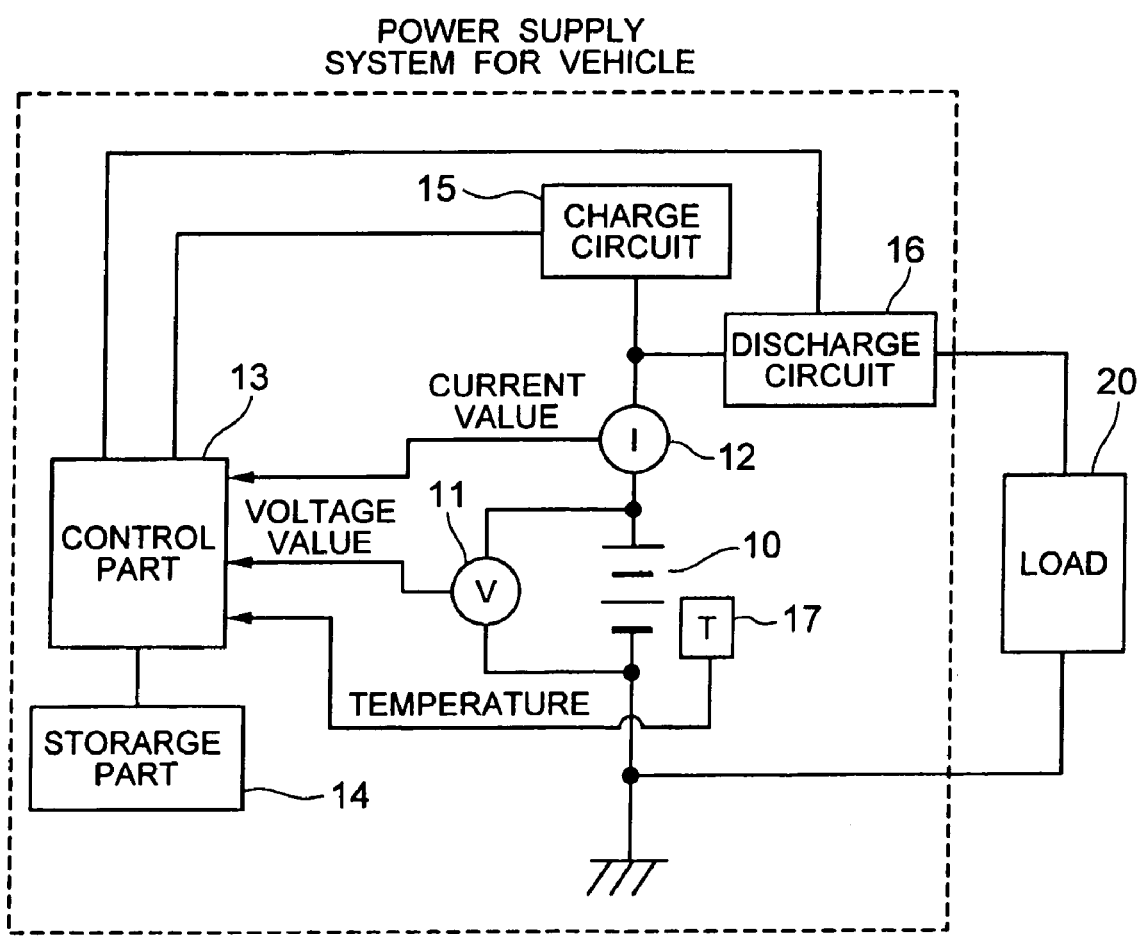
Figures 2, 4:
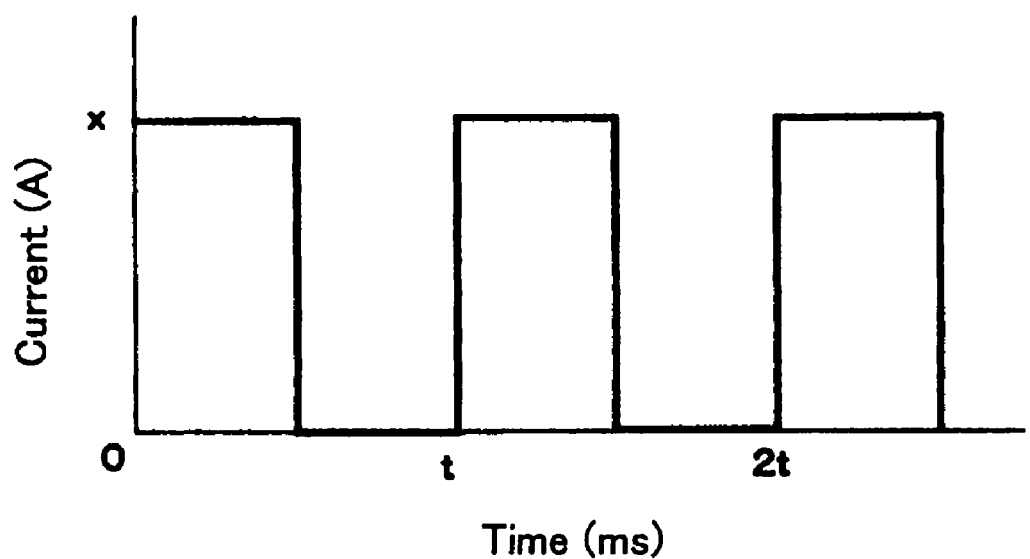
Figures 3, 4:
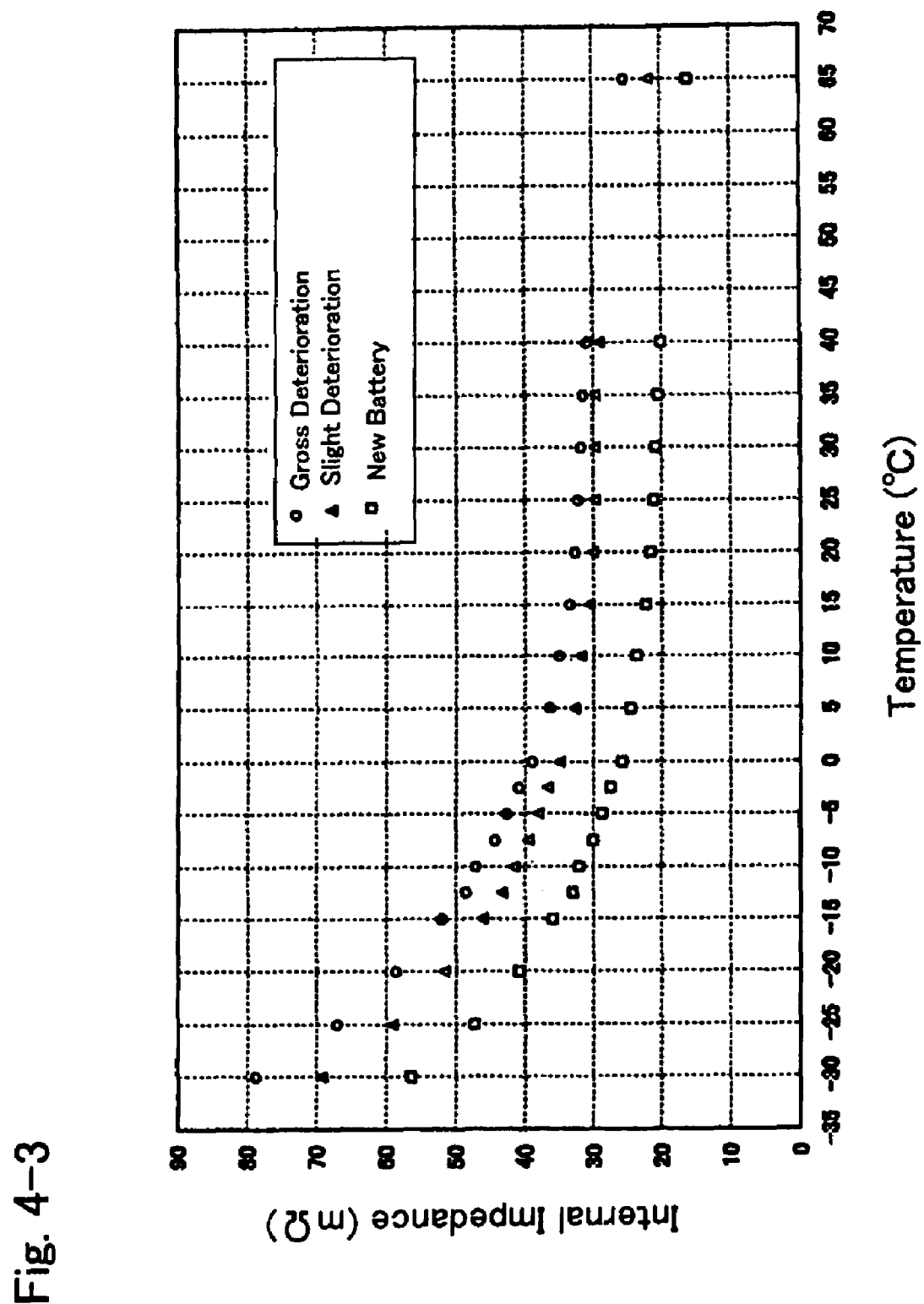
Figure 4:
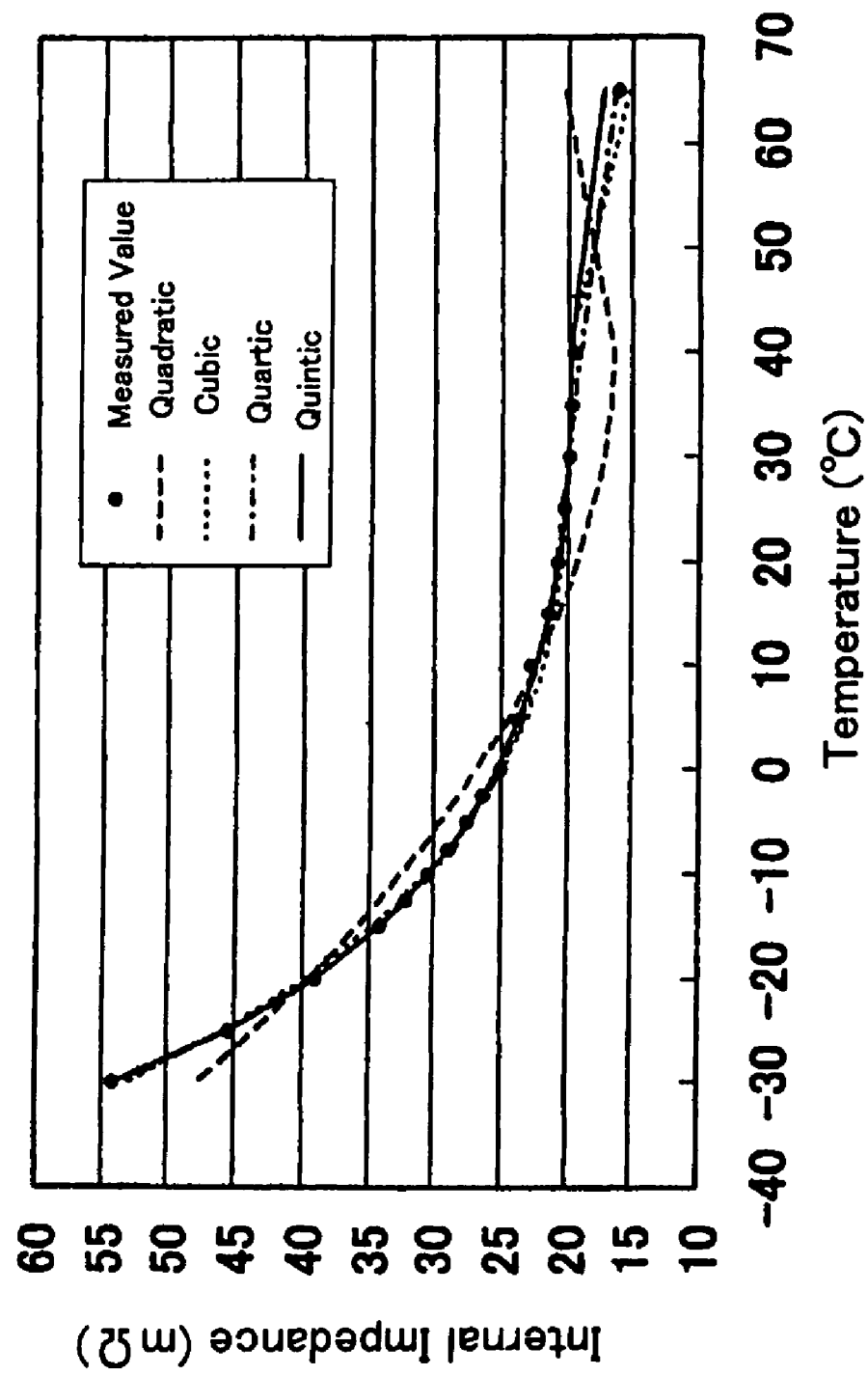
Figures 4, 5:
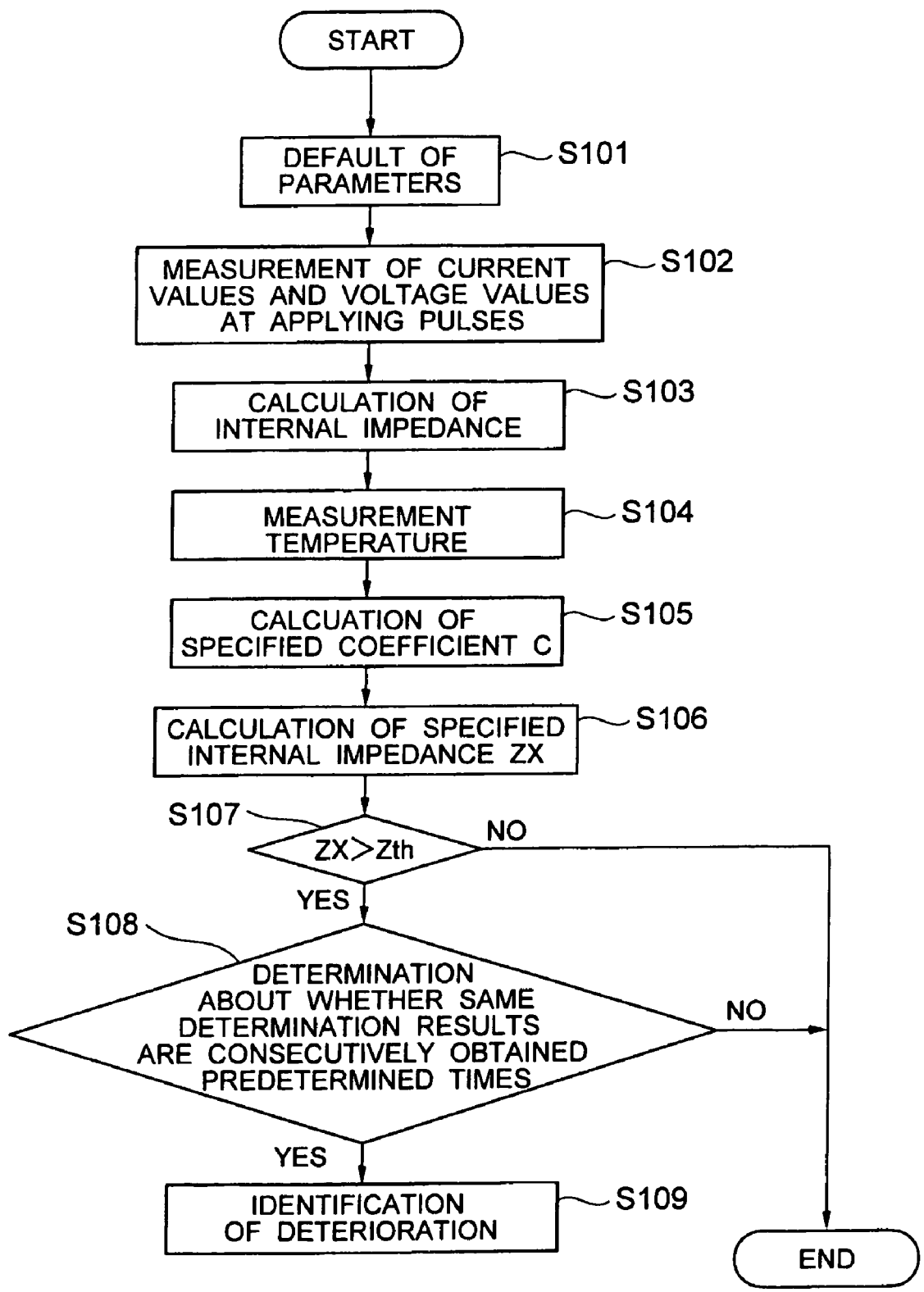

Next, the process for calculating the internal impedance is executed (Step S108). FIG. 3-5 is a flow chart showing the specific process of calculating the internal impedance. In FIG. 3-5, at first, the output of the current sensor 11 and the voltage sensor 12 fixed to the secondary battery 10 are measured sequentially at the sampling interval of ts, the predetermined number of the current values I(n) and the voltage values V(n) are obtained for the secondary battery 10 (Step S301). For example, when one cycle of the applied pulse is sampled N times, the current values I(n) and the voltage values V(n) with the range of n from 1 to N+$\alpha$ may be obtained at the sampling interval ts. In this case, as a result, the 2$\alpha$ current values and the 2$\alpha$ voltage values are obtained for two cycles of the applied pulse. Here, the number of the current values I(n) and the voltage values V(n) obtained in Step S301 may be set to any value depending on the advantage of calculating process.

Next, a voltage variation value is calculated with use of the plural voltage values V(n) obtained in Step S301 (Step S302). For example, a voltage variation value a as shown in the following Formula (7) may be calculated with use of the voltage values V(n) with n from 1 to N+$\alpha$. The voltage variation value informs of the variation of the voltage values for one cycle.

$$a=\{V(1)+V(2)+ \ldots V(\alpha)\}/\alpha - \{V(N+1)+V(N+2)+ \ldots V(N+\alpha)\}/\alpha \tag{7}$$

Next, the corrected voltage values V'(n), which are voltage values that the time fluctuation of the voltage values V(n) is corrected, are calculated with use of the voltage variation value a (Step S303). When the voltage variation value a obtained in the above Formula (7) is used, the corrected voltage values V'(n) may be calculated by means of the following Formula (8).

$$V'(n)=V(n)+a\cdot(n-1)/N \tag{8}$$

Next, primary Fourier coefficients AI and BI as for currents of the secondary battery 10 are calculated in accordance with the following Formula (9) and (10) (Step S304).

$$AI=(2/Tp)\cdot\cos(k\cdot\omega\cdot n\cdot ts)\cdot I(n)\cdot ts \tag{9}$$

$$BI=(2/Tp)\cdot\sin(k\cdot\omega\cdot n\cdot ts)\cdot I(n)\cdot ts \tag{10}$$

Similarly, primary Fourier coefficients AV and BV as for voltages of the secondary battery 10 are calculated in accordance with the following Formula (11) and (12) (Step S304).

$$AV=(2/Tp)\cdot\cos(k\cdot\omega\cdot n\cdot ts)\cdot V(n)\cdot ts \quad (11)$$

$$BV=(2/Tp)\cdot\sin(k\cdot\omega\cdot n\cdot ts)\cdot V(n)\cdot ts \quad (12)$$

And, the internal impedance is calculated from the calculating results in Formula (9) to (12) (Step S306). In Step S306, the real part Z(m)real, the imaginary part Z(m)imag and the absolute vale Z(m)abs in the m-th internal impedance Z(m) are calculated in accordance with the following Formula (13) to (15)

$$Z(m)\text{real}=(AV\cdot AI+BV\cdot BI)/(AI^2+BI^2) \quad (13)$$

$$Z(m)\text{imag}=(AV\cdot BI-AI\cdot BV)/(AI^2+BI^2) \quad (14)$$

$$Z(m)\text{abs}=(Z(m)\text{real}^2+Z(m)\text{imag}^2)^{1/2} \quad (15)$$

Next, when the process returns to the processes in FIG. 3-4, it is determined whether the counter m comes to C2 or not, in order to determine whether the calculation process for the internal impedance is continued of finished (Step S109). In the result, when m comes to C2 (Step S109: YES), Step S112 is executed, and when m does not come to C2 (Step S109: NO), Step S110 is executed. Here, when the internal impedance is obtained at m less than C2, the calculating processes thereafter don't get required. Therefore, that is determined in Step S109.

When Step S110 is executed after Step S109, the value 1 is added to the counter m in order to counts up the number of times of calculating internal impedance. Next the process waits until the time goes on for two cycles after the previous Step S108 is executed (Step S111: NO), and the above processes are repeatedly executed after the process id back to Step S108.

Meanwhile, when Step S112 is executed after Step S109, the pulse charge or the pulse discharge which is started at Step S105 is stopped. In this step, the C2 pcs internal impedances on time axis are obtained. And the average value of these C2 pcs internal impedances is calculated (Step S113). In Step S113, the real part Z(m)real, the imaginary part Z(m)imag and the absolute vale Z(m)abs of the internal impedance are calculated from the results of the Formula (13) to (15) in accordance with the following Formula (16) to (18).

$$Z(m)\text{real}=\{Z(1)\text{real}+Z(2)\text{real}+\ldots+Z(C2)\text{real}\}/C2 \quad (16)$$

$$Z(m)\text{imag}=\{Z(1)\text{imag}+Z(2)\text{imag}+\ldots-Z(C2)\text{imag}\}/C2 \quad (17)$$

$$Z(m)\text{abs}=\{Z(1)\text{abs}+Z(2)\text{abs}+\ldots+Z(C2)\text{abs}\}/C2 \quad (18)$$

As described above, according to the first embodiment, as the current pulses are applied to the secondary battery 10 so as to appropriate the polarized state, and along with it, as it is possible to measure with avoiding the period of time subject to polarization right after the current pulses start to be applied, it is possible to measure the internal impedances under the stable state, and in the result, the precise values of the internal impedances are obtained.

There are some differences between the first embodiment and the second embodiment as for the processes for calculating internal impedances. Here, as the power supply system according to the second embodiment has the same rough construction to the first embodiment as shown in FIG. 3-1, and as the current pulses applied to the secondary battery have the same waveform to the first embodiment as shown in FIG. 3-3, it is omitted to describe them.

There is described below the specific process at the internal impedances measurement for the secondary battery 10 in the power supply system according to the second embodiment. FIG. 3-6 is a flow chart showing the specific process executed pursuant to the control program stored in the storage part 14 mainly by the control part 13. The calculating process as shown in FIG. 3-6 starts to be executed from a predetermined time after charge or discharge is completed in the power supply system just like the first embodiment.

In FIG. 3-6, after the process starts in the power supply system, parameters necessary for calculation executed by the control part 13 are set to the default (Step S201). The parameters set to a defaults comprise the sampling interval ts, the fundamental frequency f1 in the pulses applied to secondary battery 10, the total measurement pulse cycle number C3, which is a cycle number of the pulses applied to the secondary battery during the internal impedance measurement, the current pulse amplitude value X and so on.

In Step S201, the similar defaults may be applied to the defaults for ts, f1 and X. Meanwhile, it is desirable to apply the range of 5 to 50 to the total measurement pulse cycle number C3. Furthermore just like the first embodiment, it may be possible to predetermine fixed defaults appropriate depending on the characteristics of the secondary battery 10, or to appropriately change the defaults depending on the state of operation.

Next, there is executed those series of the processes of Step S102 to S105 that it is determined whether the operation right before is charge or discharge, discharge pulses or charge pulses are set as a current pulse to be applied to the secondary battery 10 in the result, and the set current pulses are applied, just like the first embodiment (Step S102 to S105 in FIG. 3-4). Next, the counter m, which counts up the number of times of calculating internal impedance, is set to 1 (Step S206). As described later, the counter m is used in order to obtain C3 pcs measurement results by means of increasing the m by 1 each time the process for calculating the internal impedance is finished.

Next, the process for calculating the internal impedance of the secondary battery 10 is executed (Step S207). In Step S207, the calculating processes as shown in FIG. 3-5 are executed just like the first embodiment. However, in the second embodiment, as described later, as the calculating processes as shown in FIG. 3-5 are executed each cycle of the applied pulse, the predetermined number of the current values I(n) and the voltage values V(n) are obtained each cycle of the current pulse.

Next, in FIG. 3-6, it is determined whether the counter m comes to C2 or not, in order to determine whether the calculation process for the internal impedance is continued of finished (Step S208). In the result, when m comes to C3 (Step S208: YES), Step S211 is executed, and when m does not come to C3 (Step S208: NO), Step S209 is executed.

And when Step S208 is executed after S209, the counter m is increased by 1, then the process waits for the time of one cycle after the above Step S207 is executed (Step S210: NO), and after the time for one cycle passes over (Step S210: YES), the above processes starting from Step S207 are executed repeatedly.

Meantime, when Step S209 is executed after Step S211, the pulse charge or the pulse discharge which is started at Step S205 is stopped. In this step, the C3 pcs internal impedances on time axis are obtained. Next, a convergent value of the C3 pcs internal impedances is calculated by means of recursive calculation method (Step S212).

FIG. 3-7 is a flow chart showing the specific process of calculating convergent values of the internal impedances in the Step S212 of the FIG. 3-6. In FIG. 3-7, at first, the coefficients of an exponential damping function to approximate the internal impedance of the secondary battery 10 are set to the defaults (Step S401). Here, the function F(T) with time T as described in the following Formula (19) is used as a quadratic exponential damping function for the process in FIG. 3-7.

$$F(T)=A1\exp(A3\cdot T)+A2\exp(A4\cdot T)+A5 \quad (19)$$

In Step S401, the five coefficients of A1 to A5 included in Formula (19) are set to the defaults which are beforehand stored in the storage part 14 and are read out from it. The coefficients of A1 to A5 are used in order to calculate a optimum solution by means of least-square method, and are sequentially replaced in the process of the calculation as described later. Here, it may be possible to use some values on an experimental basis for the defaults of the coefficients of A1 to A5.

Next, the function F(m) as shown in the following Formula (20) is calculated by means of applying the exponential damping function as shown in Formula (19) to the real part Z(m)real of the m-th internal impedance (Step S402).

$$F(m)=A1\exp(A3\cdot m\sim Tp)+A2\exp(A4\cdot m\cdot Tp)+A5 \quad (20)$$

In Step S402, the function F(m) in Formula (20) is calculated respectively with m of 1 to C3, and in the result C3 pcs F(m)s are obtained. Here, the processes in FIG. 3-7 are described with use of the real part Z(m)real of the internal impedances, and however it may be possible to calculate with use of the imaginary part Z(m)imag or the absolute value Z(m)abs of the internal impedances.

The R(m)s, which are the differences between the F(m)s obtained in Step S402 and the real parts Z(m)real of the internal impedances obtained in Step S207, are calculated with m of 1 to C3 (Step S403). And now, the C3 pcs R(m)s as shown in the following Formula (21) are obtained.

$$R(m)=F(m)-V(m) \quad (21)$$

Next, the partial differential coefficients of the respective coefficients of A1 to A5 are calculated to apply least-square method (Step S404). In Step S404 the partial differential coefficients of the respective coefficients of A1 to A5 as shown in the Formula (22) are calculated with m of 1 to C3.

And then the matrix B, which is corresponding to the simultaneous equations in least-square method, is calculated with use of the respective partial differential coefficients obtained in Step S404 (Step S405). Specifically the matrix B as shown in the following Formula (23) is calculated.

$$B(1,1) = \sum_{m=1}^{C3} \{dDFA1(m)\}^2 \quad (23)$$

$$B(1,2) = \sum_{m=1}^{C3} \{dDFA1(m) \times dDFA2(m)\}$$

$$B(1,3) = \sum_{m=1}^{C3} \{dDFA1(m) \times dDFA3(m)\}$$

$$\vdots$$

-continued $$B(5,5) = \sum_{m=1}^{C3} \{dDFA5(m)\}^2$$

And now the matrix B as shown in Formula (23) is a square matrix with five rows and five ranks, and a symmetric matrix of B(x,y)=B(y,x).

Next, the dRs as shown in the following Formula (24) are calculated from the R(m)s obtained in Step S403 and the partial differential coefficients obtained in Step S404.

$$dR1 = -\sum_{m=1}^{C3} \{dDFA1(m) \times R(m)\} \quad (24)$$

$$dR2 = -\sum_{m=1}^{C3} \{dDFA2(m) \times R(m)\}$$

$$dR3 = -\sum_{m=1}^{C3} \{dDFA3(m) \times R(m)\}$$

$$dR4 = -\sum_{m=1}^{C3} \{dDFA4(m) \times R(m)\}$$

$$dR5 = -\sum_{m=1}^{C3} \{dDFA5(m) \times R(m)\}$$

Subsequently, the differences dds as shown in the following Formula (25) are calculated from the matrix obtained in Step S405 and the dRs obtained in Step S407.

$$\begin{pmatrix} dd1 \\ dd2 \\ dd3 \\ dd4 \\ dd5 \end{pmatrix} = -\begin{pmatrix} B(1,1) & B(1,2) & & B(1,5) \\ B(2,1) & & & \\ \vdots & & & \\ \vdots & & & \\ B(5,1) & & & B(5,5) \end{pmatrix}^{-1} \begin{pmatrix} dR1 \\ dR2 \\ dR3 \\ dR4 \\ dR5 \end{pmatrix} \quad (25)$$

And it is determined whether the five differences of dd1 to dd5 obtained in Step S407 meet the following Formula (26), or not (Step S408).

$$dd1, dd2, \ldots dd5 < k \quad (26)$$

Here, it is necessary to employ a predetermine value to enable to determine for the five differences of dd1 to dd5 to be sufficiently close to zero as a value of k in the right-hand side of Formula (26). And when it is determined that the five differences of dd1 to dd5 meet Formula (26) (Step S408: YES), it is determined that the five differences of dd1 to dd5 are sufficiently close to zero, and that therefore at the time the optimum solution is obtained. And then Step S409 is executed. On the contrary, when it is determined that the five differences of dd1 to dd5 don't meet Formula (26) (Step S408: NO), it is determined that the five differences of dd1 to dd5 are yet large, and that therefore the optimum solution is not obtained. And then the respective coefficients of A1 to A5 are replaced pursuant to the following Formula (27).

$$\begin{pmatrix} A1 \\ A2 \\ A3 \\ A4 \\ A5 \end{pmatrix} = \begin{pmatrix} A1+dd1 \\ A2+dd2 \\ A3+dd3 \\ A4+dd4 \\ A5+dd5 \end{pmatrix} \quad (27)$$

When in Step S409 the respective coefficients of A1 to A5 are replaced as described above, Step S402 is executed again, and then a series of Step S402 to 408 where least-square method is used, is executed with use of the replaced coefficients of A1 to A5.

And then when Step S410 is executed right after Step S408, a convergent value Z0, which is the real part Z(m)real of the internal impedance to be sufficiently stable for long term, is calculated pursuant to the following Formula (28) (Step S410).

$$Z0 = A1 \exp(A3 \cdot Tx) + A2 \exp(A4 \cdot Tx) + A5 \quad (28)$$

However the parameter Tx is the time needed to obtain a stable internal impedance of the secondary battery 10, and therefore needs to be previously set to a fairly long predetermined time. The convergent value Z0 according to Formula (28) in Step S410, and the coefficients of A1 to A5 at this point are respectively stored in the storage part 14, and may be read from there and used as may be necessary.

Next, in the second embodiment, there is described the specific example of the internal impedance of the secondary battery obtained by means of the above processes. Here, it is assumed that the current pulse applied to the secondary battery 10 has a wave form of rectangular wave with a frequency of 20 Hz, and that the internal impedance is approximated with use of a quadratic exponential damping function. FIG. 3-8 shows the example of real part Z(m)real and imaginary part Z(m)imag of the internal impedance calculated under the condition like this, and FIG. 3-9 shows the example of absolute value Z(m)imag of the internal impedance calculated under the same condition.

FIG. 3-8 and FIG. 3-9 show the plural internal impedances calculated sequentially on time axis in the processes as shown in FIG. 3-6, and therewith the time characteristics of the internal impedance approximated by means of the quadratic exponential damping function with the coefficients obtained based upon the data within a predetermined time period by means of recursive calculation. Here, in FIG. 3-8 and FIG. 3-9, the horizontal axes indicate number of cycles, and therefore the time characteristics of the internal impedance are obtained from the characteristics as shown in FIG. 3-8 and FIG. 3-9 by means of multiplying the number of cycles by the cycle time Tp. In the either case of FIG. 3-8 and FIG. 3-9, time change of the internal impedances shows large in the early stage with small cycle number. However as the time change may be precisely approximated by means of the quadratic exponential damping function, an error included in the convergent value of the internal impedance gets sufficiently small.

According to the present invention, current pulses with polar character depending on the polarized state of a secondary battery are applied to the secondary battery, and after a predetermined time, which is useful for obtaining stable internal impedances, passes over, the internal impedance is calculated. Thereby, it is possible to precisely measure the internal impedance without effect of polarization in the secondary battery.

In addition, according to the present invention, current pulses with polar character depending on the polarized state of a secondary battery are applied to the secondary battery, and coefficients of a quadratic or more exponential damping function are determined by means of recursive calculation with use of plural internal impedances within a predetermined time period after the start to apply the current pulses so that the convergent value of the internal impedance is calculated with use of the function. In the result, it is possible to precisely calculate the internal impedance without effect of polarization in the secondary battery, and therefore it is possible to precisely measure the internal impedance.

Next, there are described the method and the equipment for determining deterioration of secondary battery. In the present embodiment, there is described the case that the present invention is applied to accumulator batteries which are used in a outdoor station in which observational equipment or communications equipment is set up, or power supply systems which are equipped with a function to determine deterioration of secondary batteries mounted in such vehicles as a car.

FIG. 4-1 is a block diagram showing the rough construction of a power supply system according to the embodiment. In FIG. 4-1, the power supply system comprises a secondary battery 10, a current sensor 11, a voltage sensor 12, a control part 13, a storage part 14, a charge circuit 15, a discharge circuit 16 and a temperature sensor 17 so that such load 20 as various devices and a motor in a car is supplied with electric power from the secondary battery 10.

In the construction as shown in FIG. 4-1, lead storage battery, for example, is used as the secondary battery 10 for supplying electric power with such load 20 as observational equipment, communications equipment or a device mounted in vehicle. The secondary battery 10 is composed of a positive electrode, a battery electrolyte and a negative electrode, and may be expressed with use of an equivalent circuit comprised of resistances and condensers. In this case, the internal impedance of the secondary battery is expressed with a complex impedance adapted into the equivalent circuit.

In the present embodiment, current pulses are applied to the secondary battery 10 at a predetermined timing, and thereby the internal impedance is measured. FIG. 4-2 shows a specific example of current pulse waveform applied to the secondary battery. The current pulse as shown in FIG. 4-2 is a rectangular pulse with a constant cycle time t and a constant current amplitude x, repeatedly indicates alternately 0 and x in each cycle. And the current pulses are applied to the secondary battery 10, the responsive voltages are measured, and Fourier transformation is applied to the waveforms of the current pulses and the responsive voltages so that it is possible to obtain the internal impedance.

Next, in FIG. 4-1, the current sensor 11 detects currents flowing through the secondary battery 10, and transmits the current values to the control part 13. And the voltage sensor 12 detects voltages between both of the terminals of the secondary battery 10, and transmits the voltage values to the control part 13. As described above, when the internal impedance of the secondary battery 10 is measured, it is necessary to obtain the current values with use of the voltage sensor 11 and the current values with use of the current sensor 12.

The control part 13 is comprised of CPU and so on, executes calculating processes for calculation of internal impedances at a predetermined timing as described later along with controlling operation of the whole power supply system, and transmits the obtained internal impedances to control equipments and so on in vehicle. Here, the storage part 14 hooked up with the control part 13 comprises ROMs storing such program as a control program, RAMs temporarily storing data necessary for the processes executed by the control part 13, and so on. Here, the ROMs of the storage part 14 is also a nonvolatile storage means which stores configuration information as for the coefficients of the respective terms in the polynomial function as described later, and so on.

The charge circuit 15 is a circuit to supply with charge currents at charge of the secondary battery 10. And the discharge circuit 16 is a circuit to supply with discharge currents flowing from secondary battery 10 to the load 20 at discharge of the secondary battery 10. Both of the charge circuit 15 and the discharge circuit 16 are controlled by the control part 15, the only charge circuit is in an on-state during operation of charge, and the discharge circuit is in an on-state during operation of discharge. In the present embodiment, for measurement of internal impedances of the secondary battery, the charge circuit 15 is constructed so that the circuit 15 supplies charge current pulses, and the discharge circuit 16 is constructed so that the circuit 16 supplies discharge current pulses.

The temperature sensor 17 is managed near the secondary battery, detects temperature of the secondary battery, and transmits the detected temperature to the control part 13. As described later, this temperature detected by the temperature sensor 17 is necessary for temperature correction of the internal impedance when deterioration of the secondary battery 10 is determined.

Next, in the power supply system according to the present embodiment, there is described temperature dependency on the internal impedance of the secondary battery. The internal impedance fo the secondary battery 10 is utilized to determine deterioration of the secondary battery 10, and however the internal impedance is greatly subject to ambient temperature of the secondary battery 10. Therefore it is important to correct temperature dependency of the internal impedance to precisely determine deterioration of the secondary battery 10.

FIG. 4-3 shows a specific example of the temperature characteristics of the internal impedances of the secondary battery. The graph of the temperature characteristic as shown in FIG. 4-3 is a graph on which the measurement results of temperature characteristic of the internal impedance are plotted depending on deterioration level as for a specific type of secondary battery. FIG. 4-3 shows the real part of the internal impedance of the secondary battery 10 measured with use of rectangular current pulses with a frequency of 20 Hz. In general the secondary battery 10 for observational equipment, communications equipment or a car is used in the wide temperature range, and needs to have an appropriate internal impedance within the temperature range. As shown in FIG. 4-3, at the lower temperature the internal impedance of the secondary battery tends to be larger, and at the higher temperature the internal impedance of the secondary battery tends to be gradually smaller.

In addition, FIG. 4-3 shows three types of the plots corresponding to the three cases that the secondary battery is a new one, a slightly deteriorated one used for a relative short period, or a rather deteriorated one used for a relative long period. FIG. 4-3 indicates that the more deteriorated the secondary battery 10 is, the larger the internal impedance is. Like this, internal impedances change depending on both of temperature and deterioration level, and therefore temperature correction is necessary to eliminate the effect of temperature dependency. And so, in the present embodiment, temperature characteristic is approximated in advance with use of a function as described later, thereby an internal impedance at a predetermined temperature is calculated, and deterioration of the secondary battery 10 is determined based upon the calculation results.

In the present embodiment, a polynomial function is employed to approximate temperature characteristic of the internal impedance of the secondary battery 10. Here, as shown in the following Formula (29), the internal impedance A of the secondary battery 10 is expressed with use of n-th order polynomial function of temperature Tp.

$$Z = A0 + A1 \cdot Tp + A2 \cdot Tp + \ldots + An \cdot Tp \tag{29}$$

In Formula (29), the optimum values of the order n and the respective coefficients of A1 to A5 make it possible to precisely approximate temperature characteristic of the internal impedance Z. In addition, the internal impedance Z in Formula (29) is a real part of the internal impedance, and however may be a imaginary part or an absolute value.

In the present embodiment, the present invention can be applied to approximation of temperature characteristic of internal impedance with use of a complex function comprising at least a polynomial function as shown in Formula (29) along with the polynomial function as shown in Formula (29). However, in the below description, there is described the approximation of temperature characteristic of internal impedance with use of only the polynomial function as shown in Formula (29).

In the present embodiment, the respective coefficients of A0 to An are expressed with use of functions of a specified coefficient C, which includes in the respective coefficient of A0 to An. That is, the polynomial function as shown in Formula (29) is expressed as shown in the following Formula (30).

$$Z = C + f1(C) \cdot T + f2(C) \cdot T^2 + \ldots + fn(C) \cdot T^n \tag{30}$$

Here, the appropriate functions of f1(C) to fn(C) comprise respectively a specified coefficient C. In Formula (30), the specified coefficient is corresponding to the coefficient A0 of Formula (29), and the functions of C, f1(C) to fn(C), are corresponding to the coefficients of A1 to An of Formula (29), These each function fx(C), x=1 to n, needs to be predetermined in accord with temperature characteristic of internal impedance, and for example may employ a linear or quadratic expression of C or exponential function. Like this, after the specified coefficient C is calculated from the measurement values of temperature and internal impedance, Formula (30) makes it possible to execute temperature correction of the internal impedance.

FIG. 4-4 shows the relation between the power number of the polynomial function as shown in Formula (29) or (30) and the approximate precision in the case that the temperature characteristics of the internal impedances are approximated with use of the polynomial function. In FIG. 4-4, the internal impedances of the secondary battery are plotted along with temperature characteristic of the internal impedance Z calculated in the order n of 2 to 5 with use of the appropriate polynomial function whose coefficients are defined optimally to the respective order n. FIG. 4-4 shows that as the order n is larger, the error included in the internal impedances Z is smaller.

In Table 2, there are cited the correlation factors of the calculated values in the respective order to the measurement results.

TABLE 2

| Order number | Correlation factor |
|---|---|
| 2 | 0.93135 |
| 3 | 0.99746 |
| 4 | 0.99945 |
| 5 | 0.99989 |

As shown in Table 1, when the order number is two, the error is rather large. Therefore it is desirable that the order number is three or more. In the order number like this, the calculation error included in the internal impedance is reduced to a sufficiently small extent for practical usage so that it is possible to execute a precise approximation. furthermore, the order number n of five makes the error ignorable and provides the precise approximation. When Formula (29) or (30) is applied to temperature correction in practice, it is desirable to determine the order number n in consideration of balance between the required precision and the necessary calculating processes.

There is described below the case that temperature correction based upon Formula (30) with the order number n of five is executed in consideration of the result as shown in FIG. 4-4. Here, when the order number is set to five, the quintic polynomial function as shown in the following Formula (31) is employed as the result that the specified coefficient C as described above, which is included in the every coefficient of the polynomial function, is determined $$Z = C + f(C) \cdot T + g(C) \cdot T^2 + h(C) \cdot T^3 + i(C) \cdot T^4 + j(C) \cdot T^5 \quad (31)$$

Formula (31) is expressed with use of the function f(C), g(C), h(C), i(C), j(C) of the specified coefficient C corresponding to the respective coefficients of Formula (30). Furthermore, in the present embodiment, the respective function in Formula (31) is expressed with use of a linear expression from the aspect of simplification of the calculating processes. Therefore, Formula (31) is expressed as shown in the following Formula (32)

$$Z = C + (a1 + b1 \cdot C) \cdot T + (a2 + b2 \cdot C) \cdot T^2 + (a3 + b3 \cdot C) \cdot T^3 + (a4 + b4 \cdot C) \cdot T^4 + (a5 + b5 \cdot C) \cdot T^5 \quad (32)$$

In Formula (32), the coefficients of a1 to a5 and b1 to b5 may be predetermined as appropriate to the temperature characteristic of the internal impedance Z. Like this, temperature correction is executed by means of some relatively simple calculating processes due to the respective coefficients of the polynomial function expressed with use of a linear expression.

Next, in the power supply system according to the present embodiment, there is described the specific process of determining deterioration with use of the internal impedance of the secondary battery 10. FIG. 4-5 is a flow chart showing the calculating process executed based upon the control program stored in the storage part 14 by the control part 13. The calculating process as shown in FIG. 4-5 starts to be executed at a predetermined timing in the power supply system.

In FIG. 4-5, after the process starts to be executed by the control part 13, parameters necessary for calculation are set to the default (Step S101). The parameters set to a defaults comprise the specified temperature TpX, which is a common temperature for comparison of the internal impedance to a threshold value and so on to determine deterioration, the threshold value Zth as a deterioration judgment standard to determine deterioration of the secondary battery 10, and so on. In Step S101, the specified temperature TpX is may be set to −30 degree C. as a default, and the threshold value Zth may be also set to 100 milliohm as a default. In general, it is desirable to set the specified temperature TpX to the lower limit temperature in the range of operating temperature. In addition, it may be possible to predetermine fixed defaults appropriate depending on the characteristics of the secondary battery 10, or to appropriately change the defaults depending on the state of operation.

Here, it is desirable to set the specified temperature TpX to the lower limit temperature in the range of operating temperature in consideration of the temperature characteristic of the secondary battery 10 as shown in FIG. 4-2. However, if the threshold value Zth is appropriate, the specified temperature TpX may be set to another temperature.

Next, while the charge circuit 15 or the discharge circuit 16 is applying such predetermined currents as a pulse current, the voltage values output by the voltage sensor 11 and the current values output by the current sensor 12 are obtained at a predetermined timing (Step S102). And the internal impedance of the secondary battery 10 is calculated by means of such calculating method as Fourier expansion with use of the voltage values and the current values obtained in Step S102 (Step S103). Here, in Step S103 the internal impedance Z is a real part (internal resistance), and however may be an imaginary part or an absolute value.

Next, the temperature is measured by the temperature sensor 17, and therefore the ambient temperature of the secondary battery 10 Tp is obtained (Step S104). And the above specified coefficient C is calculated with use of the internal impedance calculated in Step S103 and the temperature Tp obtained in Step S104 (Step S105). In Step S105, it is possible to calculate the specified coefficient C with use of the following Formula (33) derived from Formula (32).

$$C = \frac{Z + a1 \cdot Tp + a2 \cdot Tp^2 + a3 \cdot Tp^3 + a4 \cdot Tp^4 + a5 \cdot Tp^5}{1 + b1 \cdot Tp + b2 \cdot Tp^2 + b3 \cdot Tp^3 + b4 \cdot Tp^4 + b5 \cdot Tp^5} \quad (33)$$

Here, the coefficients of a1 to a5 and b1 to b5 is obtained in advance as appropriate to temperature characteristic of the secondary battery 10, and may be stored as configuration information in the ROMs of the storage part 14. In addition, the coefficients of a1 to a5 and b1 to b5 can be set to given values, and the combination of the coefficients can be se to a given combination.

Next, the following Formula (34) corresponding to Formula (32) is calculating with use of the specified temperature TpX set in Step S101 and the specified coefficient C calculated in Step S105, and the specified internal impedance ZX is calculated (Step S106).

$$ZX = C + (a1 + b1 \cdot C) \cdot TpX + (a2 + b2 \cdot C) \cdot TpX^2 + (a3 + b3 \cdot C) \cdot TpX^3 (a4 + b4 \cdot C) \cdot TpX^4 + (a5 + b5 \cdot C) \cdot TpX^5 \quad (34)$$

That is, the specified internal impedance calculated in Formula (34) is the internal impedance at the specified temperature TpX obtained by means of approximate calculation with use of a predetermined polynomial function based upon the measurement results of temperature Tp and the internal impedance Z. For example, when the specified temperature is set to −30 degree C., the internal impedance at the temperature of −30 degree C. is calculated with use of Formula (34).

Next, the specified internal impedance ZX calculated in Step S106 is compared with the threshold value Zth set in Step S101 (Step S108), and the next step is decided depending on the comparison result. And when the specified internal impedance ZX is larger than the threshold value Zth, that is, when it is determined to meet ZX>Zth (Step S108; YES), it is determined whether the same determination results are consecutively obtained predetermined times, or not (Step S108). Like this Step S108 is executed to reduce the effect of fluctuation of the internal impedance and to wait a stable determination result.

In the present embodiment, there is described the case that the specified internal impedance ZX is calculated by means of temperature correction applied to the measured internal impedance Z, and is compared with a fixed threshold value Zth. However, in the case that the threshold value Zth at a given temperature is calculated by means of expressing the threshold value Zth with use of a function comprising a cubic or more polynomial function of temperature, the same results are obtained.

When the determination deems "NO" in Step S108, the calculating process as shown in FIG. 4-5 is finished. After that, when it comes to the timing at which the calculating process as shown in FIG. 4-5 starts to be executed, the calculating process as shown in FIG. 4-5 starts to be executed again. Meanwhile, when the determination deems "YES" in Step S108, it is determined that the secondary battery 10 is deteriorated (Step S109). When it is determined that the secondary battery 10 is deteriorated in Step S109, for example, it may be indicated so that it is possible to prompt the users to replace the secondary battery 10.

In the present embodiment, there is described the case that the calculating process is executed with use of a type of polynomial function appropriate to a type of secondary battery 10 with predetermined characteristics. However, not restrict the present embodiment, the calculating process may be executed with use of the plural polynomial function respectively corresponding to plural types of secondary battery 10 with characteristics different from each other. That is, plural sets of coefficients respectively corresponding to the plural polynomial function are prepared as configuration information in the ROMs of the storage part 14. And the control part 13 may be configured so that the control part 13 can read out selectively the desired configuration information, for example, by means of switching such as DIP switches.

In addition, plural threshold values Zths are stored in the ROMs of the storage part 14 along with configuration information as for the coefficients of the polynomial functions, and the control part 13 may be configured so that the control part 13 can read out selectively the desired configuration information depending on the types of secondary battery 10. Thereby, in the power supply system, it is possible to execute the precise temperature correction of the internal impedance even if the secondary battery 10 is replaced by a secondary battery different from the secondary battery 10 about characteristics.

In the present embodiment, there is described above a battery system equipped with the construction for determining deterioration of accumulator battery arranged in the station where some observational equipments or some communications equipments are arranged, or secondary battery for vehicle mounted in vehicle. However, the present invention is not restricted to the above embodiments, and is generally applicable to various power supply system equipped with secondary batteries.

According to the present invention, an internal impedance of a secondary battery is obtained, a specified internal impedance at a specified temperature is calculated with use of a function for approximating temperature characteristic of the secondary battery, which comprising cubic or more polynomial function, and deterioration of the secondary battery is determined. And therefore it is possible to precisely correct the measured temperature characteristic of the secondary battery, and so to unfailingly and precisely determine deterioration of the secondary battery.

The invention claimed is:

1. A method for determining deterioration of secondary battery based upon internal resistances of the secondary battery, which comprises the steps of:
    calculating the internal impedances from currents and voltages of the secondary battery measured in the condition that predetermined currents are applied to the secondary battery;
    determining coefficients of respective terms of an approximate function which comprises a cubic or more polynomial expression and approximates the temperature characteristics of the secondary battery, based upon the calculated internal impedances and the measured temperature of the secondary battery;
    calculating a specified internal impedance, which is a presumed internal impedance value at a predetermined specified temperature, with use of the cubic or more polynomial expression based upon the determined coefficients;
    determining deterioration of the secondary battery based upon the specified internal impedance; and
    displaying the determined deterioration of the secondary battery.

2. The method for determining deterioration of secondary battery according to claim 1,
    wherein the coefficients of respective terms of the cubic or more polynomial expression are set in reference to a common specified factor, the common specified factor is calculated from the calculated internal impedance and the measured temperature, and the coefficients of respective terms is determined base upon the specified factor.

3. The method for determining deterioration of secondary battery according to claim 2,
    wherein the approximate function including the cubic or more polynomial expression is $Z = C + f1(C) \cdot Tp + f2(C) \cdot Tp^2 + \ldots + fn(C) \cdot Tp^n$, where Tp, Z and C respectively indicate temperature, the internal impedance and the specified factor, n indicates a integer of more than or equal to 3, and f1 to fn indicate predetermined function.

4. The method for determining deterioration of secondary battery according to claim 3,
    wherein the function f1(C) to fn(C) included in the respective terms of the cubic or more polynomial expression are expressed in a linear expression of the specified factor C.

5. The method for determining deterioration of secondary battery according to claim 1,
    wherein a judging threshold is predetermined depending on the specified temperature, and deterioration of the secondary battery is determined depending on the magnitude relation between the calculated specified internal impedance and the judging threshold.

6. An equipment for determining deterioration of secondary battery based upon the internal resistances of the secondary battery supplying electric power with loads includes:
    circuits which can apply current pulses to the secondary battery;

detection means which measures currents and voltages of the secondary battery;

temperature sensors which measure the temperature of the secondary battery; and control means which calculates the internal impedances from the measurement results of the detection means in condition that the circuits apply current pulses to the secondary battery, determines coefficients of the respective terms of an approximate function which comprises a cubic or more polynomial expression and approximates the temperature characteristics of the secondary battery, calculates a specified internal impedance, which is a presumed internal impedance value at a predetermined specified temperature, with use of the cubic or more polynomial expression based upon the determined coefficients, and determines deterioration of the secondary battery based upon the calculated specified internal impedance.

7. The equipment for determining deterioration of secondary battery according to claim 6, which further includes nonvolatile storage means which stores in advance the configuration information about coefficients of the respective terms of the cubic or more polynomial expression, and wherein the control means calculates the coefficients of the terms from the configuration information to be read out from the nonvolatile storage means.

8. The equipment for determining deterioration of secondary battery according to claim 7, wherein the nonvolatile storage means stores the plural configuration information about plural combinations of the coefficients of the respective terms of the cubic or more polynomial expression, and the control means can selectively read out from the plural configuration information.

9. The equipment for determining deterioration of secondary battery according to claim 7, wherein the nonvolatile storage means stores judging threshold values predetermined depending on the specified temperature, and the control means determines deterioration of the secondary battery depending on the magnitude relation between the calculated specified internal impedance and the judging threshold to be read out from the nonvolatile storage means.

10. The equipment for determining deterioration of secondary battery according to claim 9, wherein the nonvolatile storage means stores the plural judging threshold values, and the control means can selectively read out from the plural judging threshold values.

11. A power supply system including the power supply system with the equipment for determining deterioration of secondary battery according to claim 6.

* * * * *